United States Patent
Segroves et al.

(10) Patent No.: US 9,648,778 B2
(45) Date of Patent: *May 9, 2017

(54) ELECTRONICS CABINET

(71) Applicant: Panduit Corp., Tinley Park, IL (US)

(72) Inventors: Roger D. Segroves, Lockport, IL (US); Rey Bravo, Manhattan, IL (US); Alex C. Brouwer, New Lenox, IL (US)

(73) Assignee: Panduit Corp., Tinley Park, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/296,438

(22) Filed: Oct. 18, 2016

(65) Prior Publication Data
US 2017/0042057 A1    Feb. 9, 2017

Related U.S. Application Data

(63) Continuation of application No. 14/826,325, filed on Aug. 14, 2015, now Pat. No. 9,510,471, which is a
(Continued)

(51) Int. Cl.
*H05K 5/00* (2006.01)
*H05K 7/18* (2006.01)
(Continued)

(52) U.S. Cl.
CPC ........... *H05K 7/183* (2013.01); *H05K 5/0213* (2013.01); *H05K 5/0221* (2013.01);
(Continued)

(58) Field of Classification Search
CPC combination set(s) only.
See application file for complete search history.

(56) References Cited

U.S. PATENT DOCUMENTS 3,881,829 A     5/1975    James
4,712,232 A    12/1987    Rodgers
(Continued)

FOREIGN PATENT DOCUMENTS

JP    2002368459 A    12/2002
JP    2003046276 A     2/2003

OTHER PUBLICATIONS

Chatsworth Products, Inc.'s TeraFrame™ Family of Cabinets brochure; Oct. 2009; 12 pages.
(Continued)

*Primary Examiner* — Dhirubhai R Patel
(74) *Attorney, Agent, or Firm* — Christopher S. Clancy; James H. Williams; Aimee E. McVady

(57) ABSTRACT

An electronics cabinet having a cabinet frame, a front equipment rail, and a structural air dam. The cabinet frame includes a first pair of front-to-back beams connected to a pair of top side-to-side beams to form a top frame, a second pair of front-to-back beams connected to a pair of bottom side-to-side beams to form a bottom frame, and a plurality of vertical post connected to the top frame and the bottom frame. The front equipment rail is removably connected to one of the first pair of front-to-back beams and to one of the second pair of front-to-back beams. The structural air dam is connected to the front equipment rail and to one of the plurality of vertical posts.

47 Claims, 82 Drawing Sheets

Related U.S. Application Data continuation of application No. 14/483,495, filed on Sep. 11, 2014, now Pat. No. 9,144,175, which is a continuation-in-part of application No. 13/922,777, filed on Jun. 20, 2013, now Pat. No. 8,901,418.

(60) Provisional application No. 61/663,898, filed on Jun. 25, 2012.

(51) Int. Cl.
*H05K 5/02* (2006.01)
*H05K 5/03* (2006.01)
*H05K 7/14* (2006.01)
*H05K 7/20* (2006.01)

(52) U.S. Cl.
CPC ......... *H05K 5/0226* (2013.01); *H05K 5/0234* (2013.01); *H05K 5/0247* (2013.01); *H05K 5/03* (2013.01); *H05K 7/1491* (2013.01); *H05K 7/20836* (2013.01)

(56) References Cited

U.S. PATENT DOCUMENTS

| | | | |
|---|---|---|---|
| 4,952,869 A | 8/1990 | Tuttle | |
| 5,025,937 A | 6/1991 | King | |
| 5,094,622 A | 3/1992 | Auclair | |
| 5,115,377 A | 5/1992 | Dransman | |
| 5,306,080 A | 4/1994 | Lautenschläger et al. | |
| 5,326,162 A | 7/1994 | Bovermann | |
| 5,372,262 A | 12/1994 | Benson et al. | |
| 5,396,405 A | 3/1995 | Reed et al. | |
| 5,401,193 A | 3/1995 | Lo Cicero et al. | |
| 5,458,019 A | 10/1995 | Trevino | |
| 5,548,489 A | 8/1996 | Reed et al. | |
| 5,624,045 A | 4/1997 | Highsmith et al. | |
| 5,639,150 A | 6/1997 | Anderson et al. | |
| 5,640,482 A | 6/1997 | Barry et al. | |
| 5,647,763 A | 7/1997 | Arnold et al. | |
| 5,788,087 A | 8/1998 | Orlando | |
| 5,807,008 A | 9/1998 | Schwenk et al. | |
| 5,889,648 A | 3/1999 | Heavirland et al. | |
| 5,975,962 A | 11/1999 | Laukonis | |
| 5,997,117 A | 12/1999 | Krietzman | |
| 6,021,909 A | 2/2000 | Tang et al. | |
| 6,036,290 A | 3/2000 | Jancsek et al. | |
| 6,044,194 A | 3/2000 | Meyerhoefer | |
| 6,123,203 A | 9/2000 | Gibbons | |
| 6,185,098 B1 | 2/2001 | Benavides | |
| 6,223,908 B1 | 5/2001 | Kurtsman | |
| 6,386,495 B1 | 5/2002 | DeRaffele | |
| 6,388,193 B2 | 5/2002 | Maynard et al. | |
| 6,394,398 B1 | 5/2002 | Reed et al. | |
| 6,478,166 B2 | 11/2002 | Hung | |
| 6,501,899 B1 | 12/2002 | Marrs et al. | |
| D468,622 S | 1/2003 | Sarkinen et al. | |
| 6,516,955 B1 | 2/2003 | Dudhwala et al. | |
| 6,546,179 B2 | 4/2003 | Petri | |
| 6,586,680 B1 | 7/2003 | Nelson | |
| 6,614,665 B2 | 9/2003 | Witty et al. | |
| 6,648,280 B1 | 11/2003 | Chong | |
| 6,655,533 B2 | 12/2003 | Guebre-Tsadik | |
| 6,769,551 B2 | 8/2004 | Rafferty et al. | |
| 6,771,871 B2 | 8/2004 | Krampotich et al. | |
| 6,785,459 B2 | 8/2004 | Schmidt et al. | |
| 6,866,154 B2 | 3/2005 | Hartman et al. | |
| 6,947,654 B2 | 9/2005 | Krampotich et al. | |
| 6,980,726 B2 | 12/2005 | Daoud et al. | |
| 7,087,840 B2 | 8/2006 | Herring et al. | |
| 7,119,280 B1 | 10/2006 | Ray et al. | |
| 7,187,543 B2 | 3/2007 | Zimlin | |
| 7,205,481 B2 | 4/2007 | Higbie | |
| 7,277,273 B2 | 10/2007 | Smith et al. | |
| 7,293,666 B2 | 11/2007 | Mattlin et al. | |
| 7,301,756 B2 | 11/2007 | Wayman | |
| 7,319,804 B2 | 1/2008 | Hruby et al. | |
| D569,712 S | 5/2008 | Young, IV | |
| 7,437,048 B2 | 10/2008 | Farrell et al. | |
| 7,462,779 B2 | 12/2008 | Caveney et al. | |
| 7,466,890 B2 | 12/2008 | Kachmar | |
| D584,251 S | 1/2009 | Lewis, II et al. | |
| D584,252 S | 1/2009 | Lewis, II et al. | |
| 7,472,970 B2 | 1/2009 | Bergesch et al. | |
| 7,488,202 B2 | 2/2009 | Spitaels et al. | |
| D588,081 S | 3/2009 | Lewis, II et al. | |
| 7,498,512 B2 | 3/2009 | Adducci et al. | |
| 7,526,171 B2 | 4/2009 | Caveney et al. | |
| D592,618 S | 5/2009 | Lewis, II et al. | |
| 7,542,287 B2 | 6/2009 | Lewis, II et al. | |
| 7,659,476 B2 | 2/2010 | Hruby et al. | |
| 7,682,187 B2 | 3/2010 | Spitaels et al. | |
| 7,697,285 B2 | 4/2010 | Donowho et al. | |
| 7,734,139 B2 | 6/2010 | Rector, III | |
| 7,740,329 B2 | 6/2010 | Hsiung et al. | |
| 7,746,637 B2 | 6/2010 | Donowho et al. | |
| 7,804,685 B2 | 9/2010 | Krietzman | |
| 7,839,635 B2 | 11/2010 | Donowho et al. | |
| 7,894,190 B2 | 2/2011 | Davis et al. | |
| 7,957,139 B2 | 6/2011 | Davis et al. | |
| 7,974,105 B2 | 7/2011 | Dean, Jr. et al. | |
| 7,979,985 B2 | 7/2011 | Spitaels et al. | |
| 8,003,890 B2 | 8/2011 | Donowho et al. | |
| 8,033,406 B2 | 10/2011 | Mattlin et al. | |
| 8,038,015 B2 | 10/2011 | Laursen et al. | |
| 8,040,673 B2 | 10/2011 | Krietzman | |
| RE42,970 E | 11/2011 | Fournier et al. | |
| 8,061,534 B2 | 11/2011 | Laursen et al. | |
| 8,107,238 B2 | 1/2012 | Krietzman et al. | |
| 8,153,893 B2 | 4/2012 | McSorley et al. | |
| 8,186,174 B2 | 5/2012 | Gilliland et al. | |
| 8,210,490 B2 | 7/2012 | Mattlin et al. | |
| 8,339,261 B1 | 12/2012 | Wolski | |
| 8,353,492 B2 | 1/2013 | Mattlin et al. | |
| 8,395,046 B2 | 3/2013 | Nicewicz et al. | |
| 8,405,984 B2 | 3/2013 | Donowho et al. | |
| 8,406,082 B2 | 3/2013 | Michaels et al. | |
| 8,411,465 B2 | 4/2013 | Dean, Jr. et al. | |
| 8,437,147 B2 | 5/2013 | Dean, Jr. et al. | |
| 8,490,799 B2 | 7/2013 | Knight et al. | |
| 8,528,872 B2 | 9/2013 | Mattlin et al. | |
| 8,608,258 B2 | 12/2013 | Korikawa | |
| 9,185,824 B2 | 11/2015 | Nordin et al. | |
| 9,301,605 B2 * | 4/2016 | Corbo | A47B 47/027 |
| 2002/0046979 A1 | 4/2002 | Larsen et al. | |
| 2004/0183409 A1 | 9/2004 | Rinderer | |
| 2007/0064389 A1 | 3/2007 | Lewis, II et al. | |
| 2007/0064391 A1 | 3/2007 | Lewis, II et al. | |
| 2007/0099493 A1 | 5/2007 | Niazi | |
| 2007/0099494 A1 | 5/2007 | Niazi et al. | |
| 2008/0035810 A1 | 2/2008 | Lewis, II | |
| 2008/0037228 A1 | 2/2008 | Lewis, II | |
| 2008/0062654 A1 | 3/2008 | Mattlin et al. | |
| 2008/0062655 A1 | 3/2008 | Laursen et al. | |
| 2008/0316702 A1 | 12/2008 | Donowho et al. | |
| 2008/0316703 A1 | 12/2008 | Donowho et al. | |
| 2009/0129013 A1 | 5/2009 | Donowho et al. | |
| 2009/0147944 A1 | 6/2009 | McSorley et al. | |
| 2009/0179116 A1 | 7/2009 | St-Louis et al. | |
| 2009/0190307 A1 | 7/2009 | Krietzman | |
| 2009/0224110 A1 | 9/2009 | Donowho et al. | |
| 2009/0239461 A1 | 9/2009 | Lewis, II et al. | |
| 2009/0261211 A1 | 10/2009 | Anguiano-Wehde et al. | |
| 2009/0305554 A1 | 12/2009 | Siano | |
| 2010/0061059 A1 | 3/2010 | Krietzman et al. | |
| 2010/0068923 A1 | 3/2010 | Tabet | |
| 2010/0110621 A1 | 5/2010 | Dunn et al. | |
| 2010/0172092 A1 | 7/2010 | Davis et al. | |
| 2010/0172093 A1 | 7/2010 | Davis et al. | |
| 2010/0193754 A1 | 8/2010 | Garza et al. | |
| 2011/0211328 A1 | 9/2011 | Dean, Jr. et al. | |
| 2011/0211329 A1 | 9/2011 | Dean, Jr. et al. | |
| 2012/0063099 A1 | 3/2012 | Alaniz et al. | |
| 2012/0133510 A1 | 5/2012 | Pierce et al. | |
| 2012/0229007 A1 | 9/2012 | Fan et al. | |

(56) References Cited

U.S. PATENT DOCUMENTS

| 2012/0229633 A1 | 9/2012 | Boucino et al. |
| 2012/0273436 A1 | 11/2012 | Qin |
| 2013/0070416 A1 | 3/2013 | Adducci et al. |
| 2013/0342091 A1 | 12/2013 | Walker et al. |
| 2014/0094057 A1 | 4/2014 | Ramey et al. |

OTHER PUBLICATIONS

APC's NetShelter® SX 750-mm Mounting Rail Brush Strips Installation-AR7706; Jul. 2005; 1 page.
APC's NetShelter® SX Air Recirculation Prevention Kit-AR7708; Nov. 2005; 7 pages.

* cited by examiner

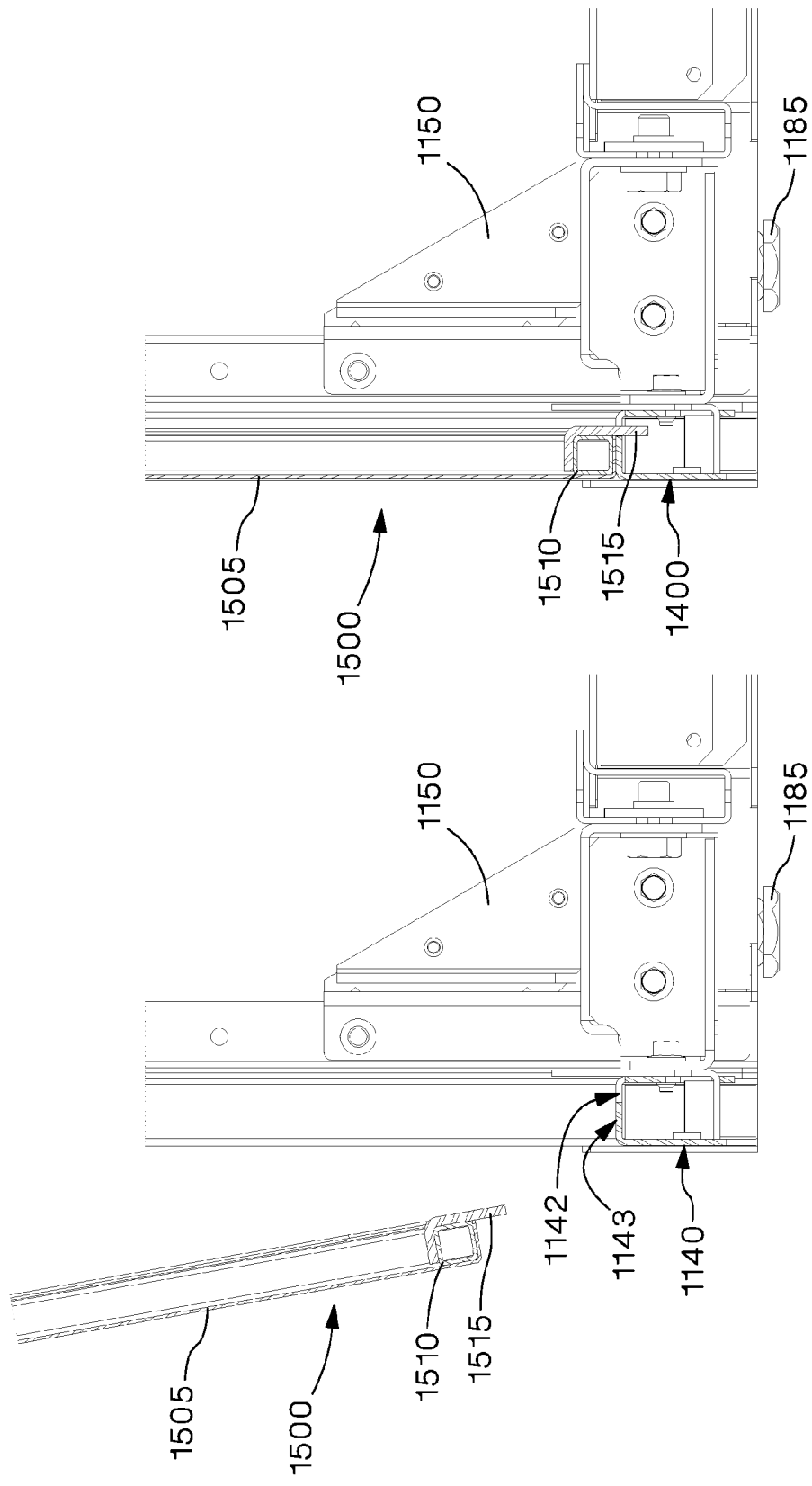

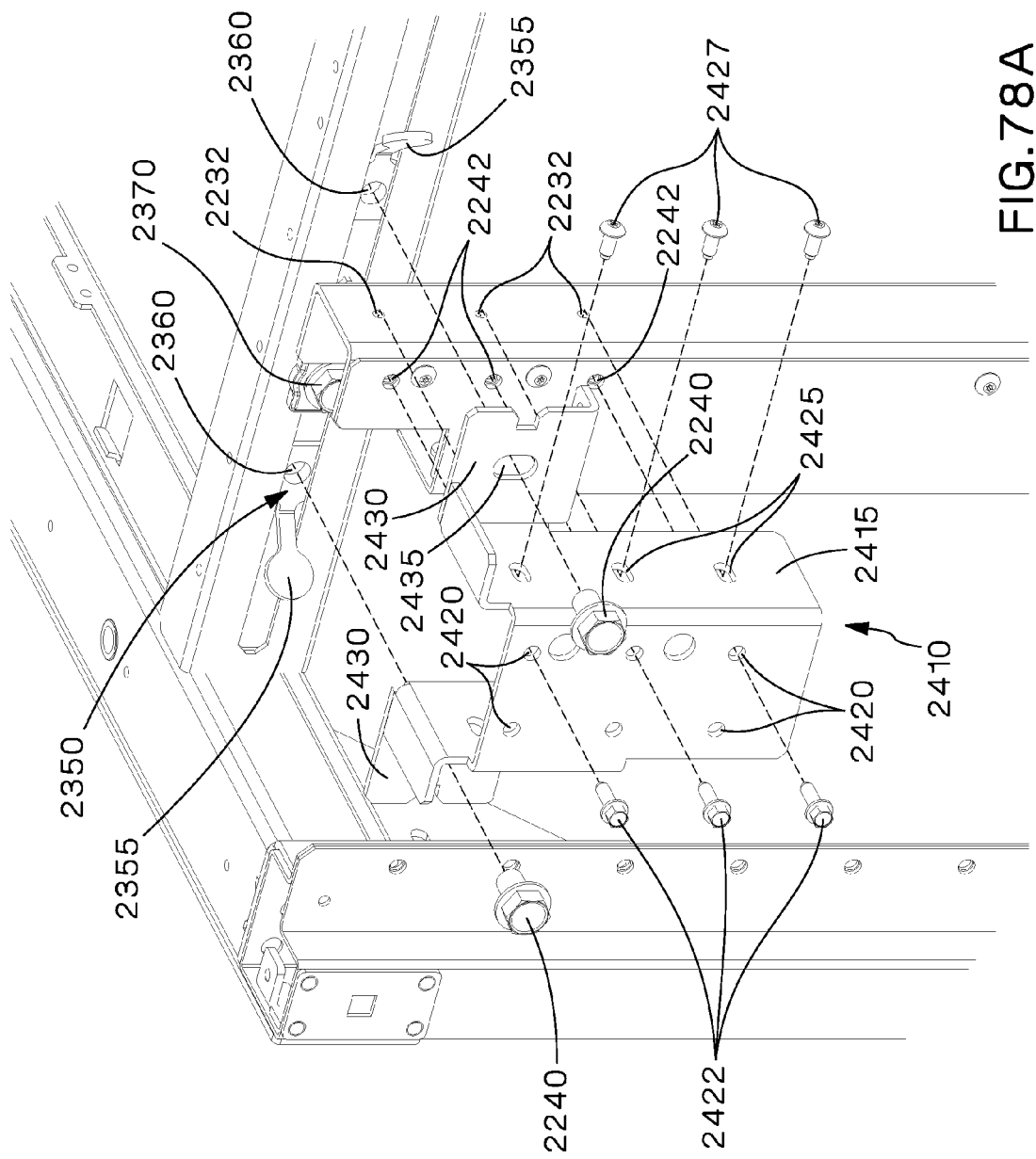

ELECTRONICS CABINET

CROSS-REFERENCE TO RELATED APPLICATIONS

This application is a continuation of U.S. patent application Ser. No. 14/826,325, filed Aug. 14, 2015, which issued as U.S. Pat. No. 9,510,471 on Nov. 29, 2016; which is a continuation of U.S. patent application Ser. No. 14/483,495, filed Sep. 11, 2014, which issued as U.S. Pat. No. 9,144,175 on Sep. 22, 2015; which is a continuation-in-part of U.S. patent application Ser. No. 13/922,777, filed on Jun. 20, 2013, which issued as U.S. Pat. No. 8,901,418 on Dec. 2, 2014 which claims the benefit of U.S. Provisional Patent Application No. 61/663,898, filed on Jun. 25, 2012, the entirety of which are incorporated herein by reference.

FIELD OF THE INVENTION

The present invention generally relates to electronics cabinets, such as network and server cabinets, and, more specifically, to reinforced electronics cabinets.

BACKGROUND

Electronics cabinets are well known in the art. For example, U.S. Pat. No. 7,293,666, which is assigned to American Power Conversion Corporation (West Kingston, R.I.), discloses an electronics cabinet. However, the electronics cabinet does not have inset front-to-back beams and removable vertical posts. In addition, typical electronics cabinets are not strong or sturdy enough to be shipped or moved with electronic equipment installed in the electronics cabinet.

Therefore, there is a need for an electronics cabinet having inset front-to-back beams. There is also a need for an electronics cabinet that is strong and sturdy enough to be shipped and moved while fully loaded with electronic equipment.

SUMMARY

In one example, an electronics cabinet comprises a cabinet frame, a front equipment rail, and a structural air dam. The cabinet frame includes a first pair of front-to-back beams connected to a pair of top side-to-side beams to form a top frame, a second pair of front-to-back beams connected to a pair of bottom side-to-side beams to form a bottom frame, and a plurality of vertical post connected to the top frame and the bottom frame. The front equipment rail is removably connected to one of the first pair of front-to-back beams and to one of the second pair of front-to-back beams. The structural air dam is connected to the front equipment rail and to one of the plurality of vertical posts.

In another example, an electronics cabinet comprises a cabinet frame, a front equipment rail, a channel member, and a vertical cable management rail. The cabinet frame includes a first pair of front-to-back beams connected to a pair of top side-to-side beams to form a top frame, a second pair of front-to-back beams connected to a pair of bottom side-to-side beams to form a bottom frame, and a plurality of vertical post connected to the top frame and the bottom frame. The front equipment rail is removably connected to one of the first pair of front-to-back beams and to one of the second pair of front-to-back beams. The channel member is connected to the front equipment rail. The vertical cable management rail is connected to the channel member.

BRIEF DESCRIPTION OF THE DRAWINGS

Certain examples of the present invention are illustrated by the accompanying figures. It should be understood that the figures are not necessarily to scale and that details that are not necessary for an understanding of the invention or that render other details difficult to perceive may be omitted. It should be understood, of course, that the invention is not necessarily limited to the particular examples illustrated herein.

FIG. 70 is a front plan view of the bottom left corner of the cabinet frame of FIG. 63 with a side panel uninstalled;

FIG. 71 is a front plan view of the bottom left corner of the cabinet frame of FIG. 63 with a side panel installed;

FIG. 78A is an enlarged top rear perspective view of detail 78A of FIG. 78;

DETAILED DESCRIPTION

Figure 1:
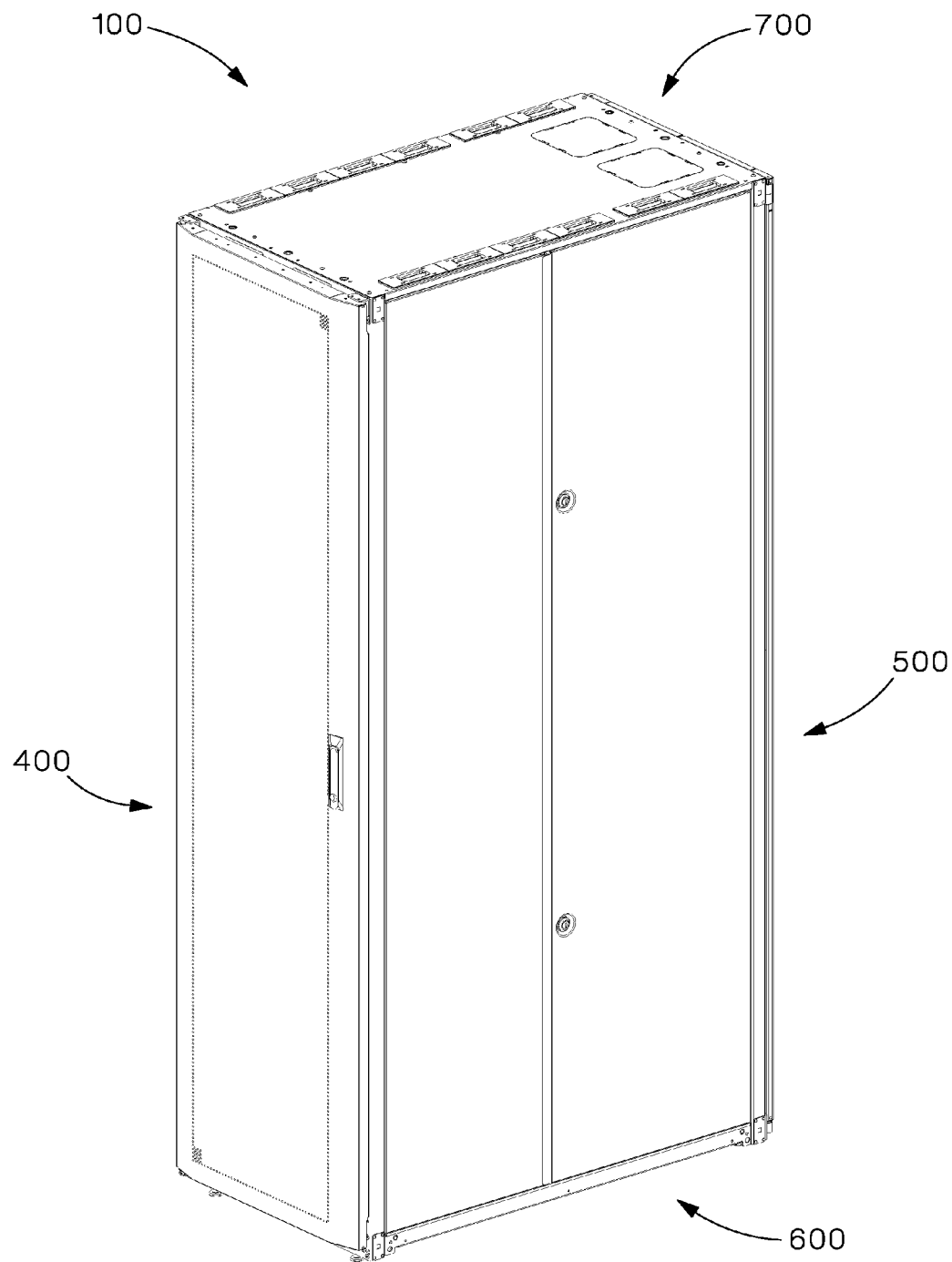
FIG. 1 is a top front perspective view of an electronics cabinet according to an embodiment of the present invention.
Figure 2:
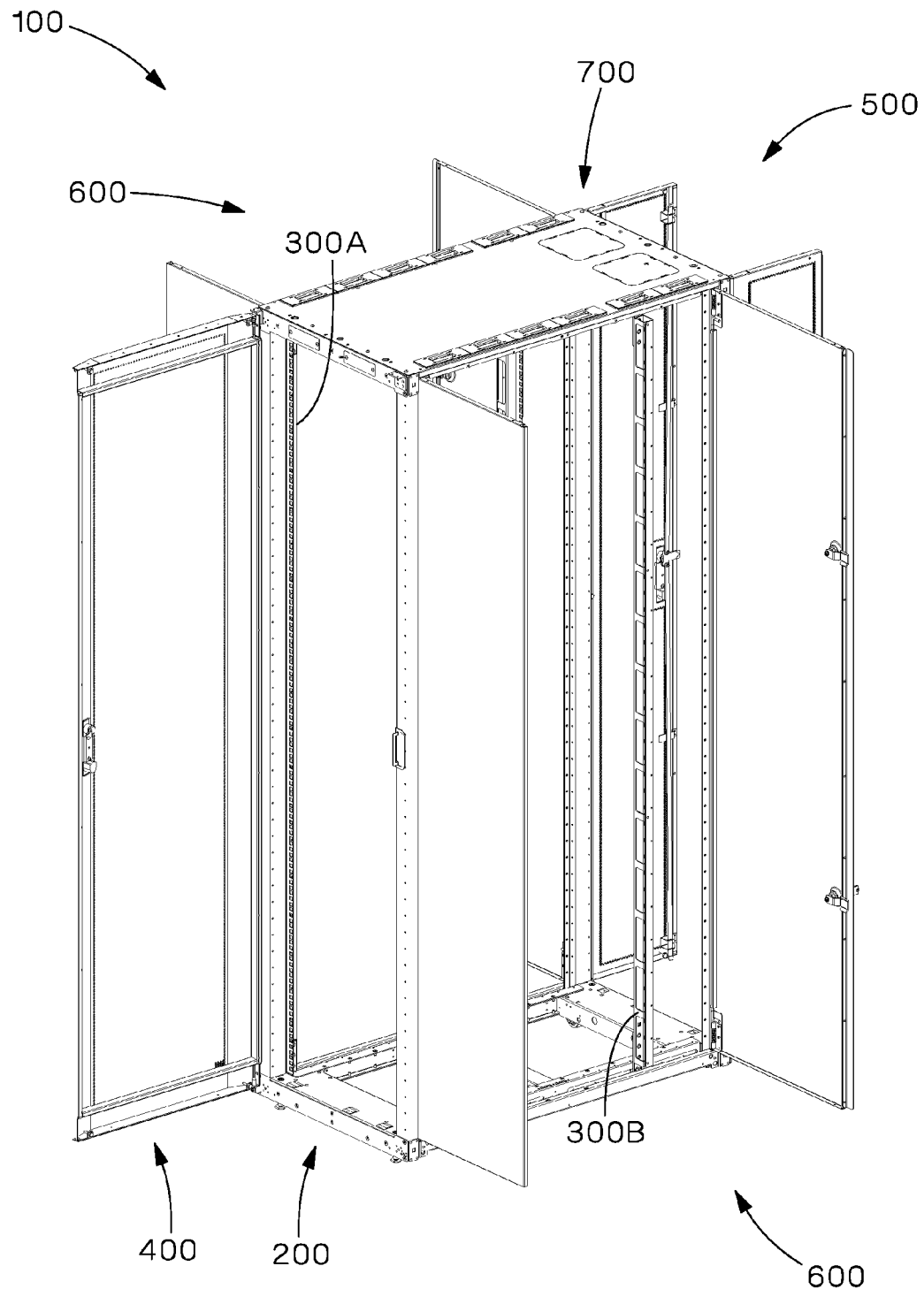
FIG. 2 is a top front perspective view of the electronics cabinet of FIG. 1, showing the front door, back door, and side panels in an open position.
Figure 3:
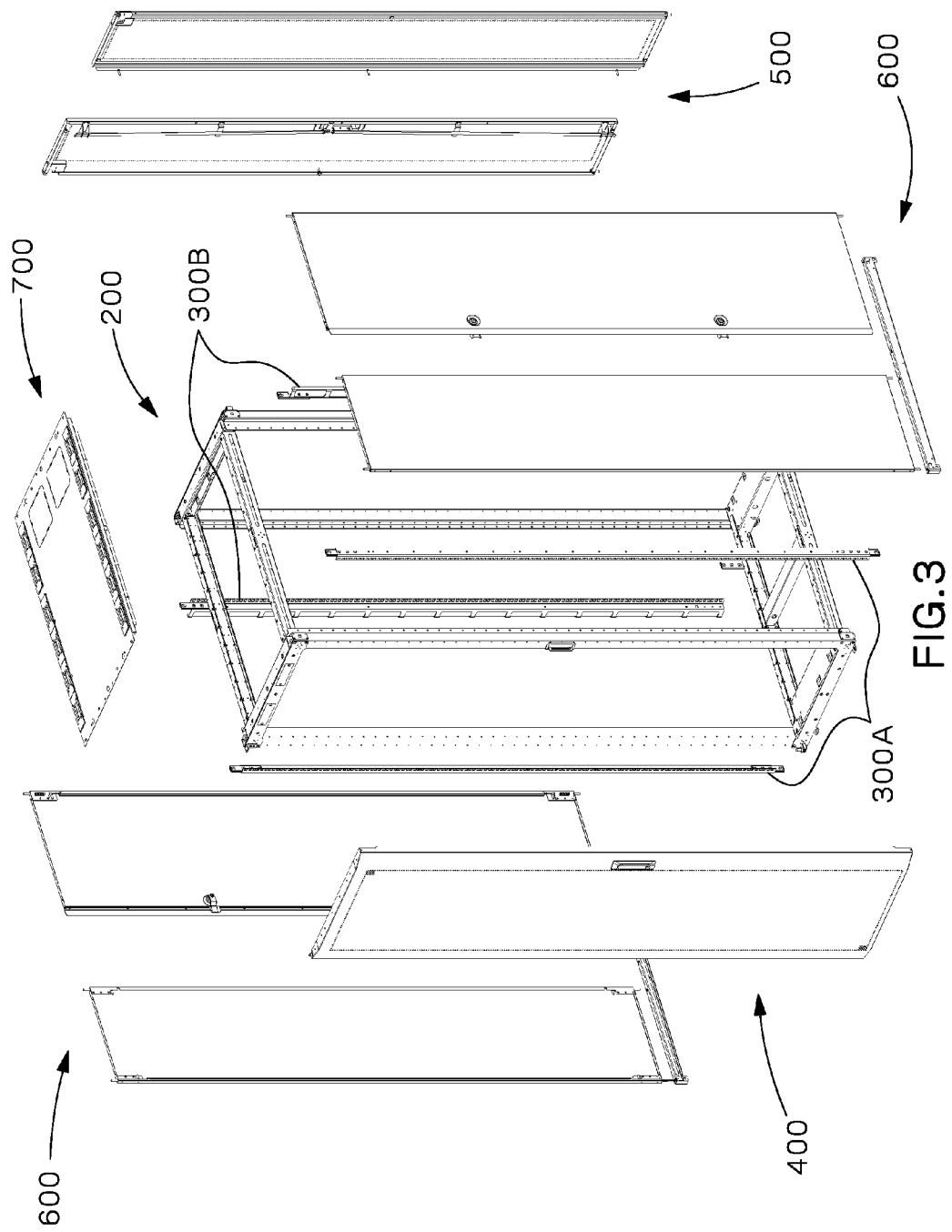
FIG. 3 is an exploded top front perspective view of the electronics cabinet of FIG. 1.

As shown in FIGS. 1-3, one example of an electronics cabinet 100 includes cabinet frame 200 (FIGS. 4-16), equipment rails 300A, 300B (FIGS. 17-31), front door 400 (FIGS.

32-37), back door 500 (FIGS. 38-43), side door 600 (FIGS. 44-52), and top cap 700 (FIGS. 53-61).

Figure 4:
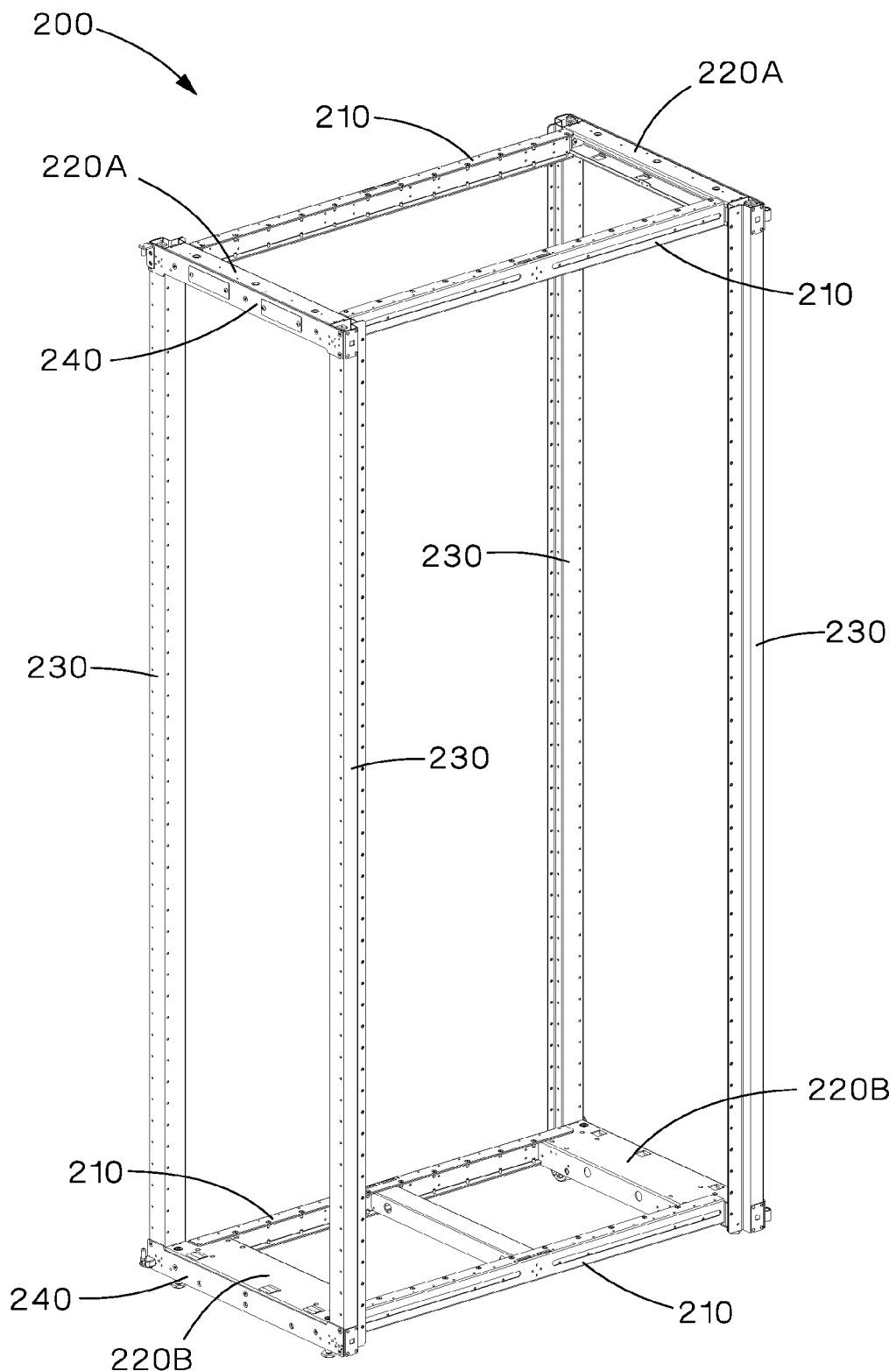
FIG. 4 is a top front perspective view of the cabinet frame of FIG. 3.

As shown in FIG. 4, cabinet frame 200 includes front-to-back beams 210, top and bottom side-to-side beams 220A, 220B, vertical posts 230, and face plates 240.

Figure 5:
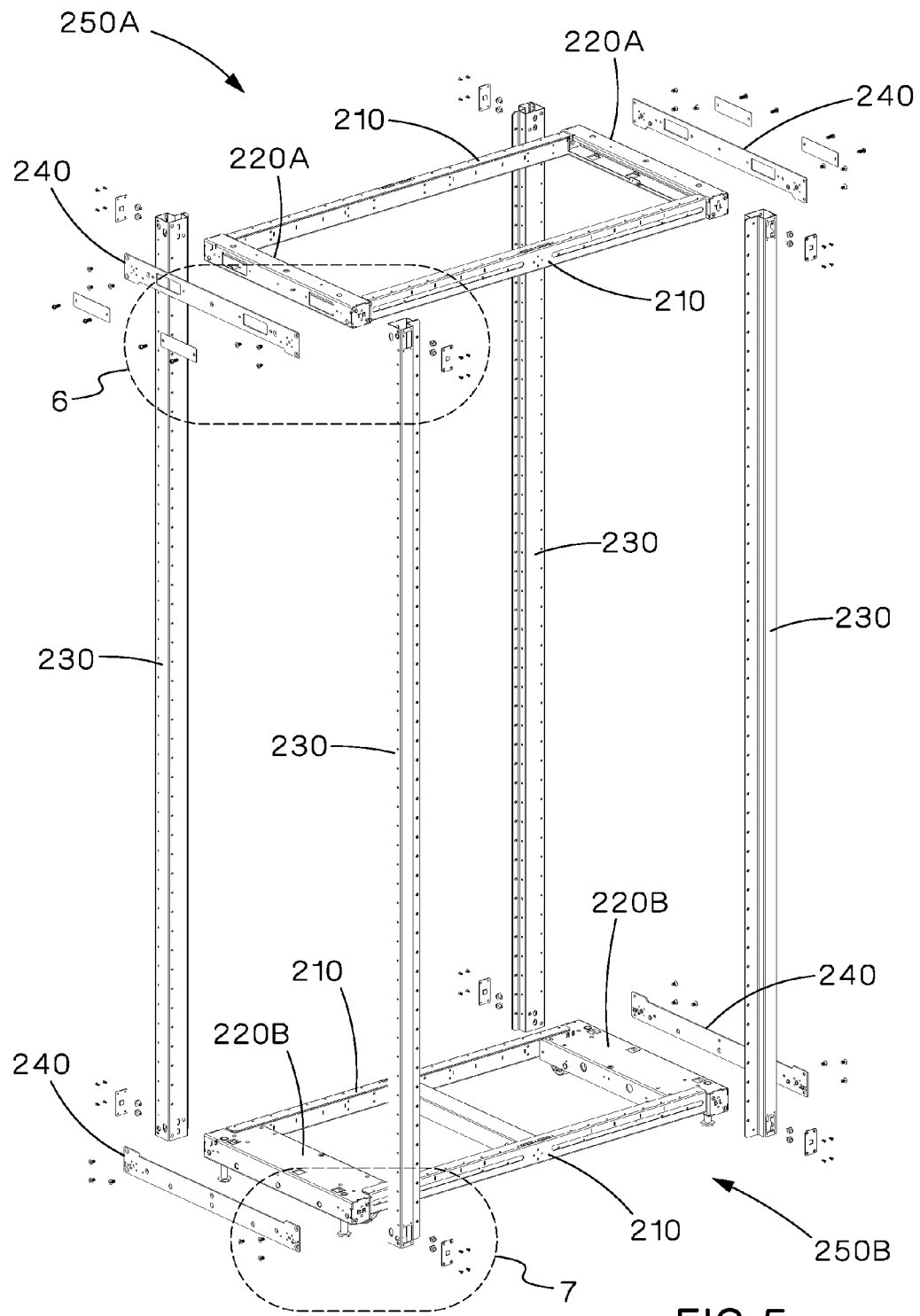
FIG. 5 is an exploded top front perspective view of the cabinet frame of FIG. 4.

As shown in FIG. 5, front-to-back beams 210 and top side-to-side beams 220A are connected to form top frame 250A. Similarly, front-to-back beams 210 and bottom side-to-side beams 220B are connected to form bottom frame 250B. Preferably, front-to-back beams 210 are permanently connected to side-to-side beams 220A, 220B, for example, using permanent connectors, such as rivets and welds, but it is likewise contemplated that front-to-back beams 210 are removably connected to side-to-side beams 220A, 220B, for example, using removable connectors, such as nuts and bolts and screws.

Figure 6:
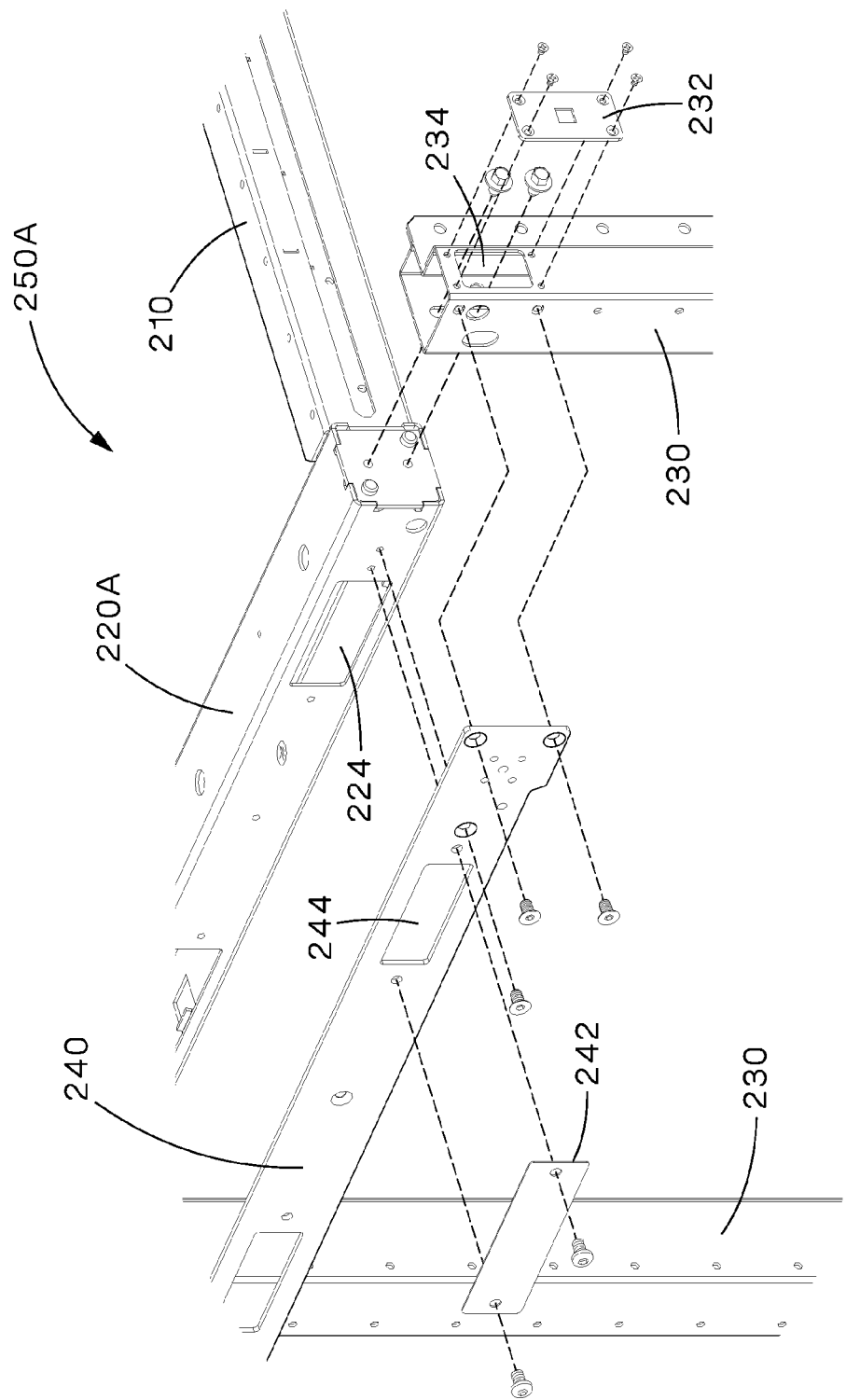
FIG. 6 is an enlarged top front perspective view of detail 6 of FIG. 5.
Figure 7:
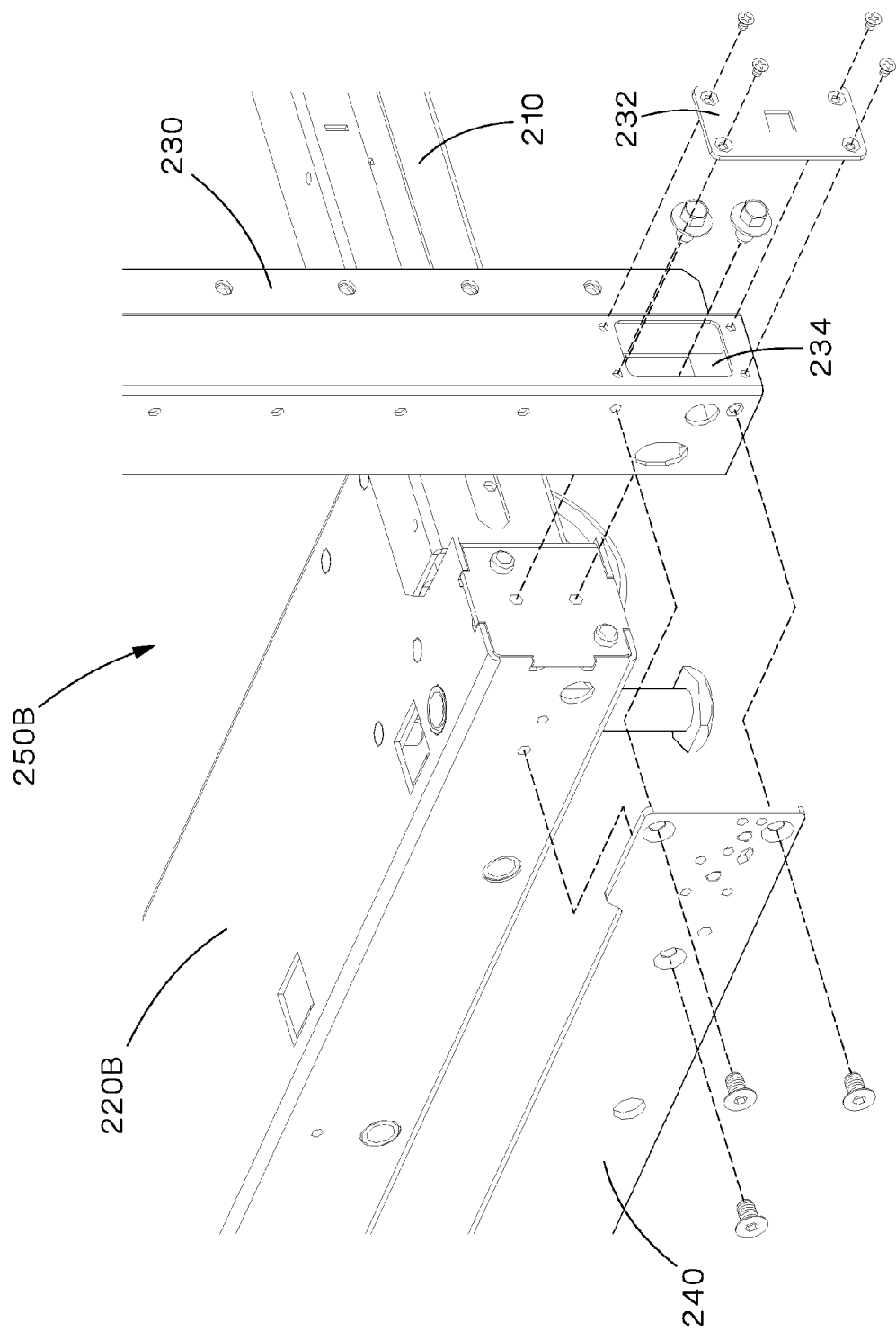
FIG. 7 is an enlarged top front perspective view of detail 7 of FIG. 5.

As shown in FIGS. 6 and 7, vertical posts 230 are connected to top and bottom frames 250A, 250B, and more particularly, side-to-side beams 220A, 220B, to form cabinet frame 200. Preferably, vertical posts 230 are removably connected to side-to-side beams 220A, 220B, for example, using removable connectors, such as nuts and bolts and screws, but it is likewise contemplated that vertical posts 230 are permanently connected to side-to-side beams 220A, 220B, for example, using permanent connectors, such as rivets and welds. Cover plates 232 are removably connected to vertical posts 230, for example, using removable connectors, such as nuts and bolts and screws, and when removed, provide access to cabinet frame assembly openings 234. Additionally, when installed, cover plates 232 act as stand-offs for ganging multiple cabinets.

Additionally, face plates 240 are removably connected to side-to-side beams 220A, 220B and vertical posts 230, for example, using removable connectors, such as nuts and bolts and screws, but it is likewise contemplated that face plates 240 are permanently connected to side-to-side beams 220A, 220B, for example, using permanent connectors, such as rivets and welds. Preferably, face plates 240 provide additional stiffness to cabinet frame 200, and more particularly, side-to-side beams 220A, 220B and vertical posts 230. Cover plates 242 are removably connected to face plates 240, and ultimately, side-to-side beams 220A, for example, using removable connectors, such as nuts and bolts and screws, and when removed, provide access to cable routing openings 224, 244.

Preferably, top and bottom frames 250A, 250B are assembled before shipping electronics cabinet 100, for example, at a factory. However, vertical posts 230 and face plates 240, as well as equipment rails 300, front door 400, back door 500, side door 600, and top cap 700, might be assembled after shipping electronics cabinet 100, for example, at a data center or a remote assembly facility located near the data center, which reduces the shipping volume, and therefore, the shipping cost of electronics cabinet 100, without significantly impacting the assembly time.

Figure 8:
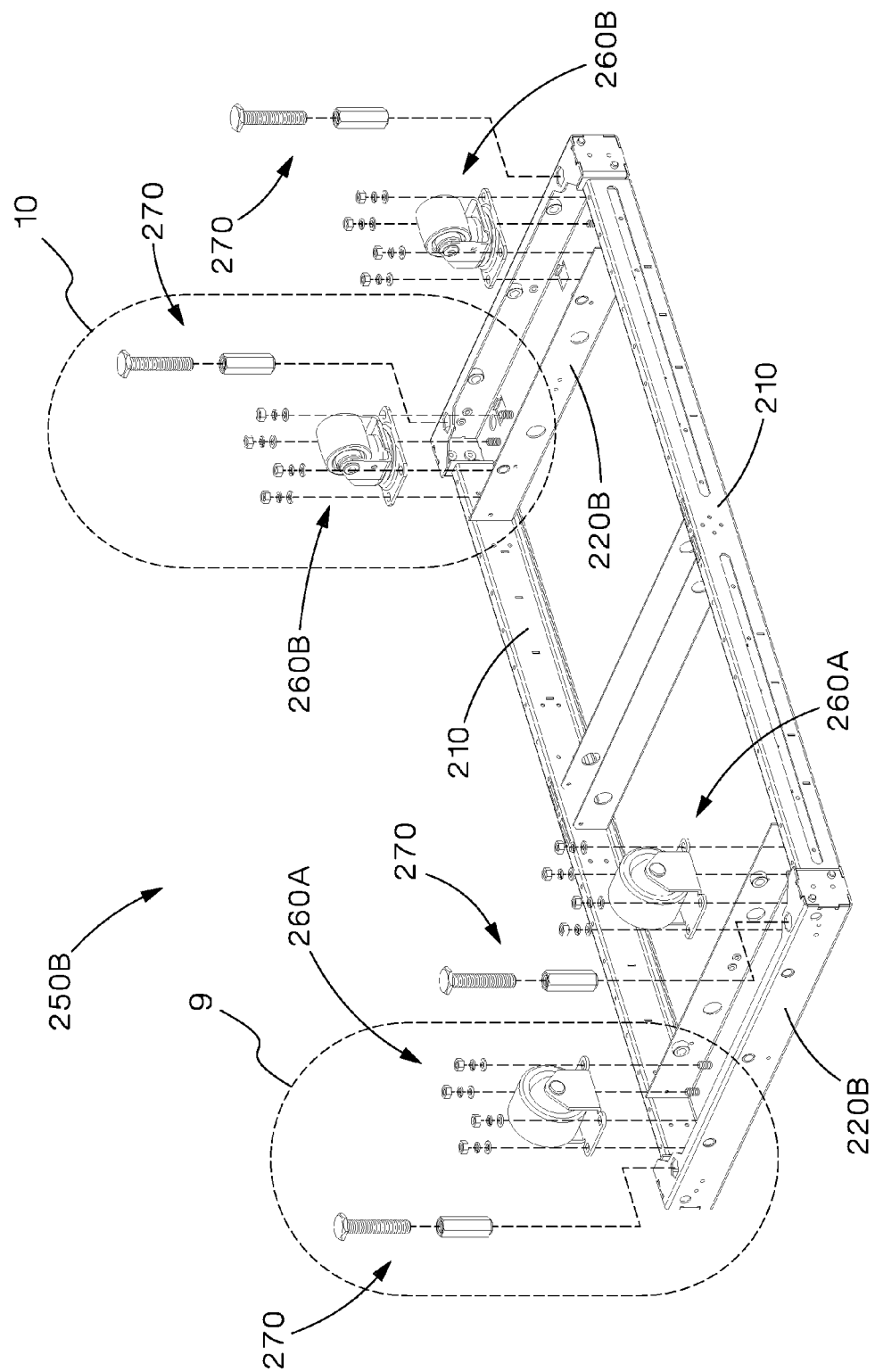
FIG. 8 is an exploded bottom front perspective view of the bottom frame of FIG. 5.
Figure 9:
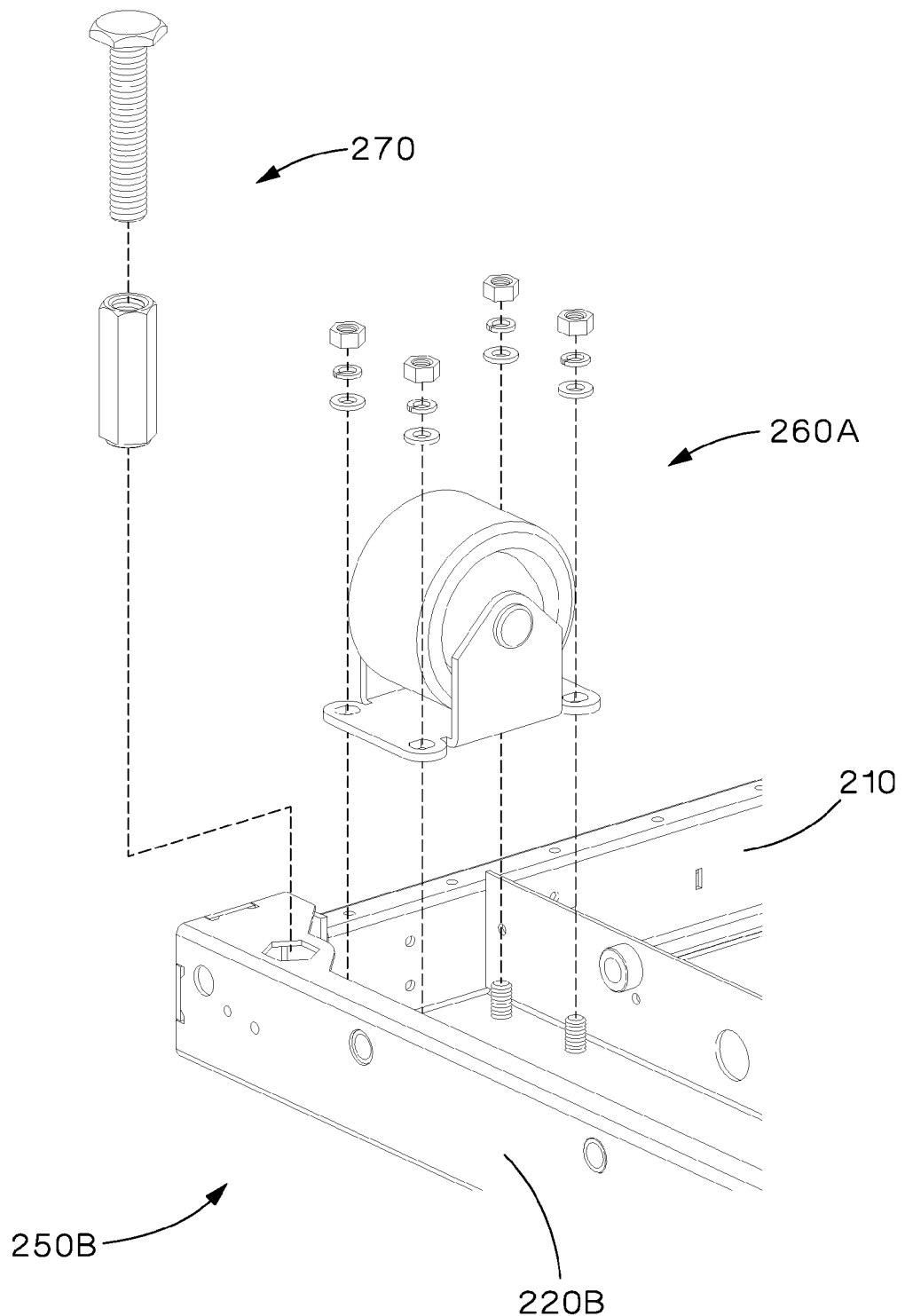
FIG. 9 is an enlarged bottom front perspective view of detail 9 of FIG. 8.
Figure 10:
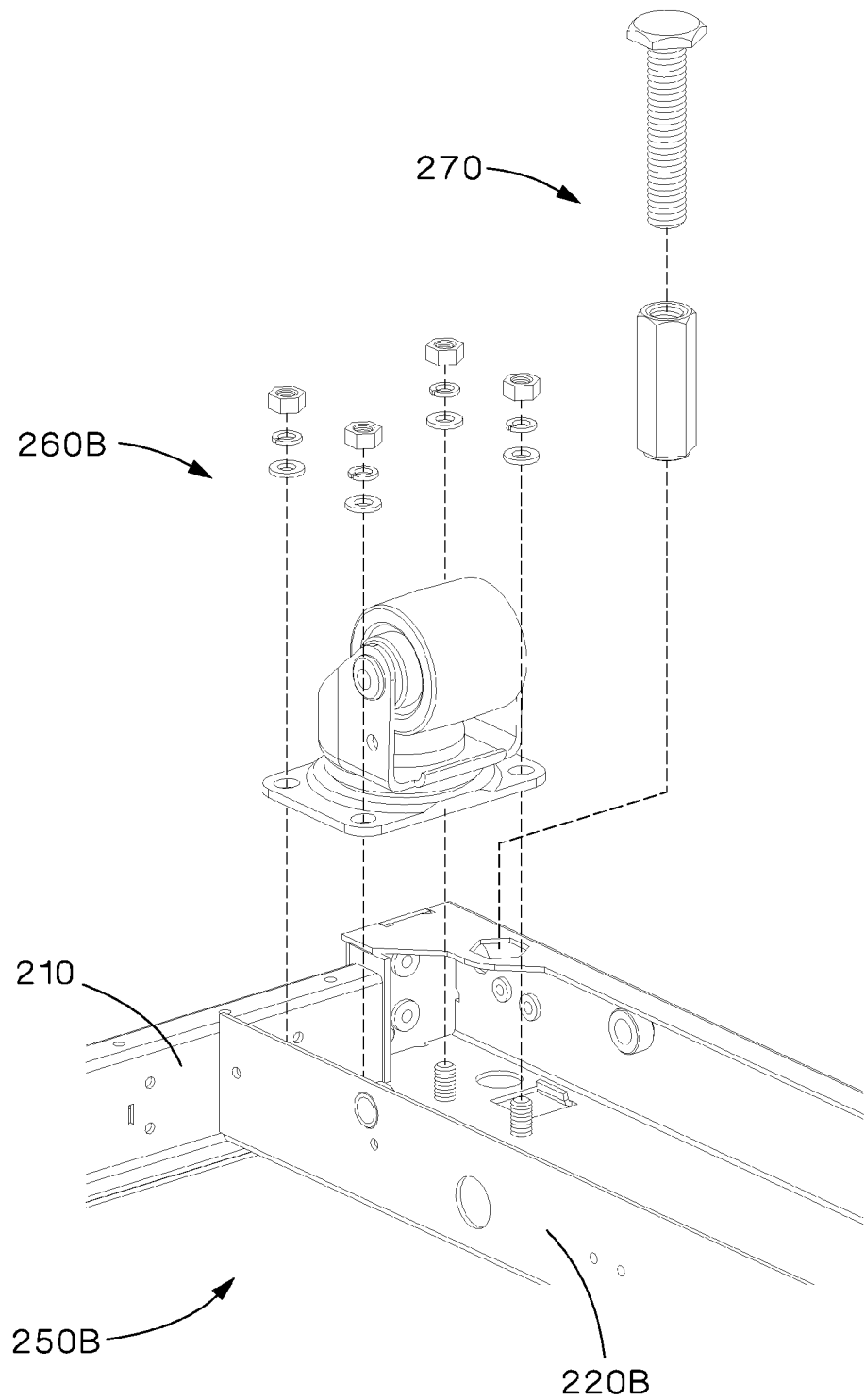
FIG. 10 is an enlarged bottom front perspective view of detail 10 of FIG. 8.

As shown in FIGS. 8-10, front and back casters 260A, 260B and leveling legs 270 are connected to bottom frame 250B, and more particularly, bottom side-to-side beams 220B. Preferably, back casters 260B and leveling legs 270 are rotatably connected to bottom frame 250B, and more particularly, bottom side-to-side beams 220B, to aid in positioning and leveling of electronics cabinet 100, but it is likewise contemplated that front casters 260A, taken alone or in combination with back casters 260B, are rotatably connected to bottom frame 250B, and more particularly, bottom side-to-side beams 220B, to further aid in positioning of electronics cabinet 100.

Figure 11:
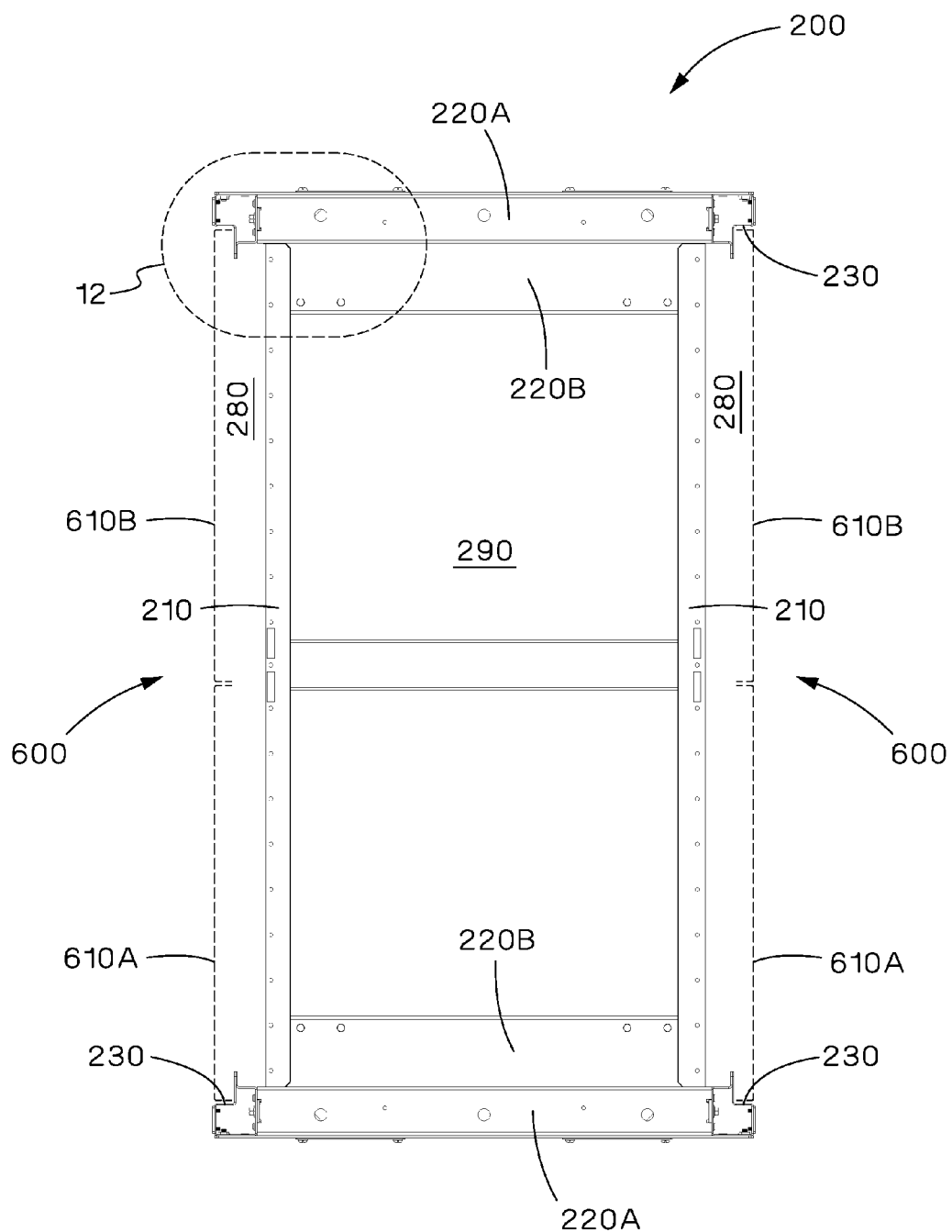
FIG. 11 is a top view of the cabinet frame of FIG. 4.
Figure 12:
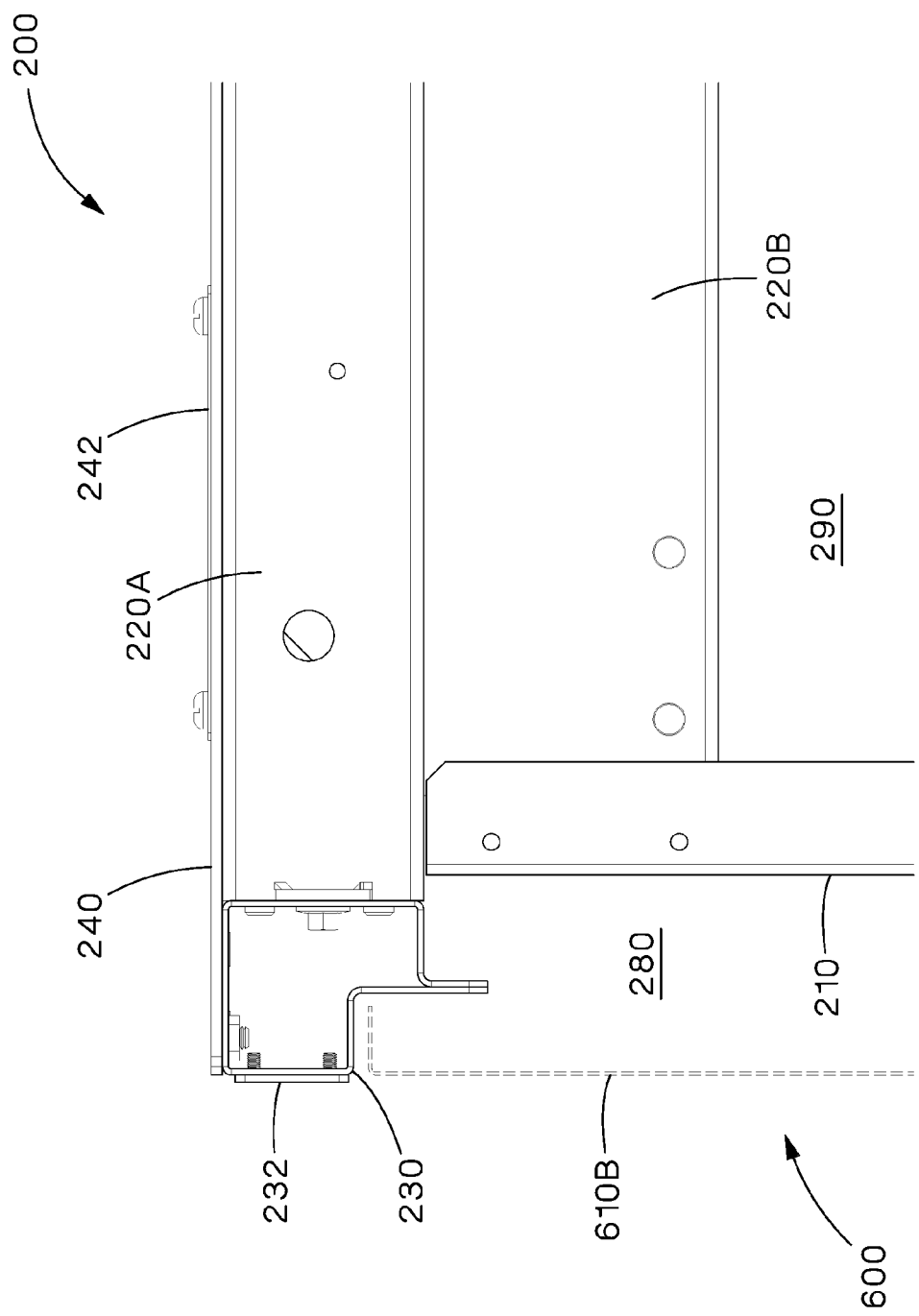
FIG. 12 is an enlarged top view of detail 12 of FIG. 11.
Figure 13:
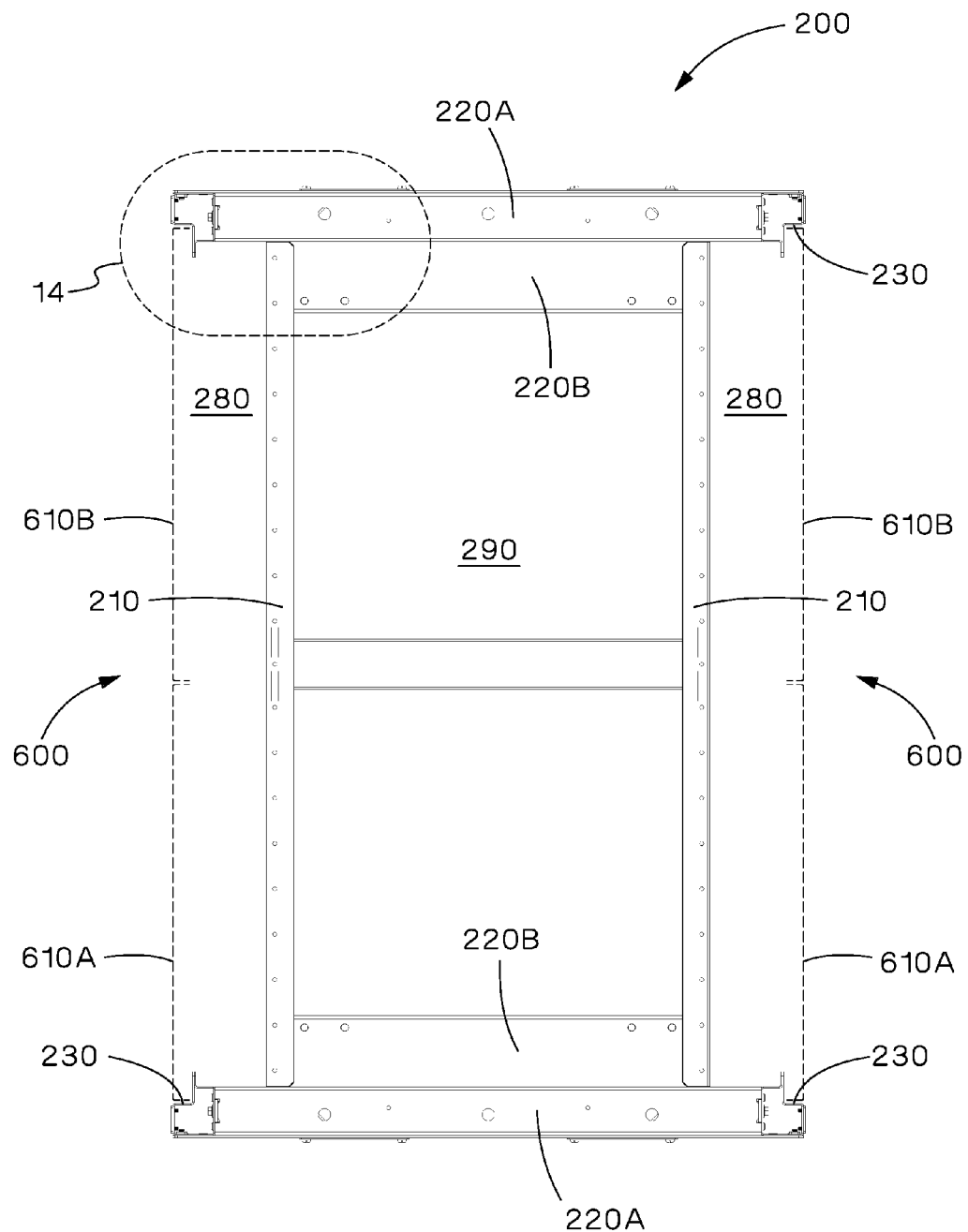
FIG. 13 is a top view of a cabinet frame having a width (e.g., 700 mm) greater than the width (e.g., 600 mm) of the cabinet frame of FIG. 11.
Figure 14:
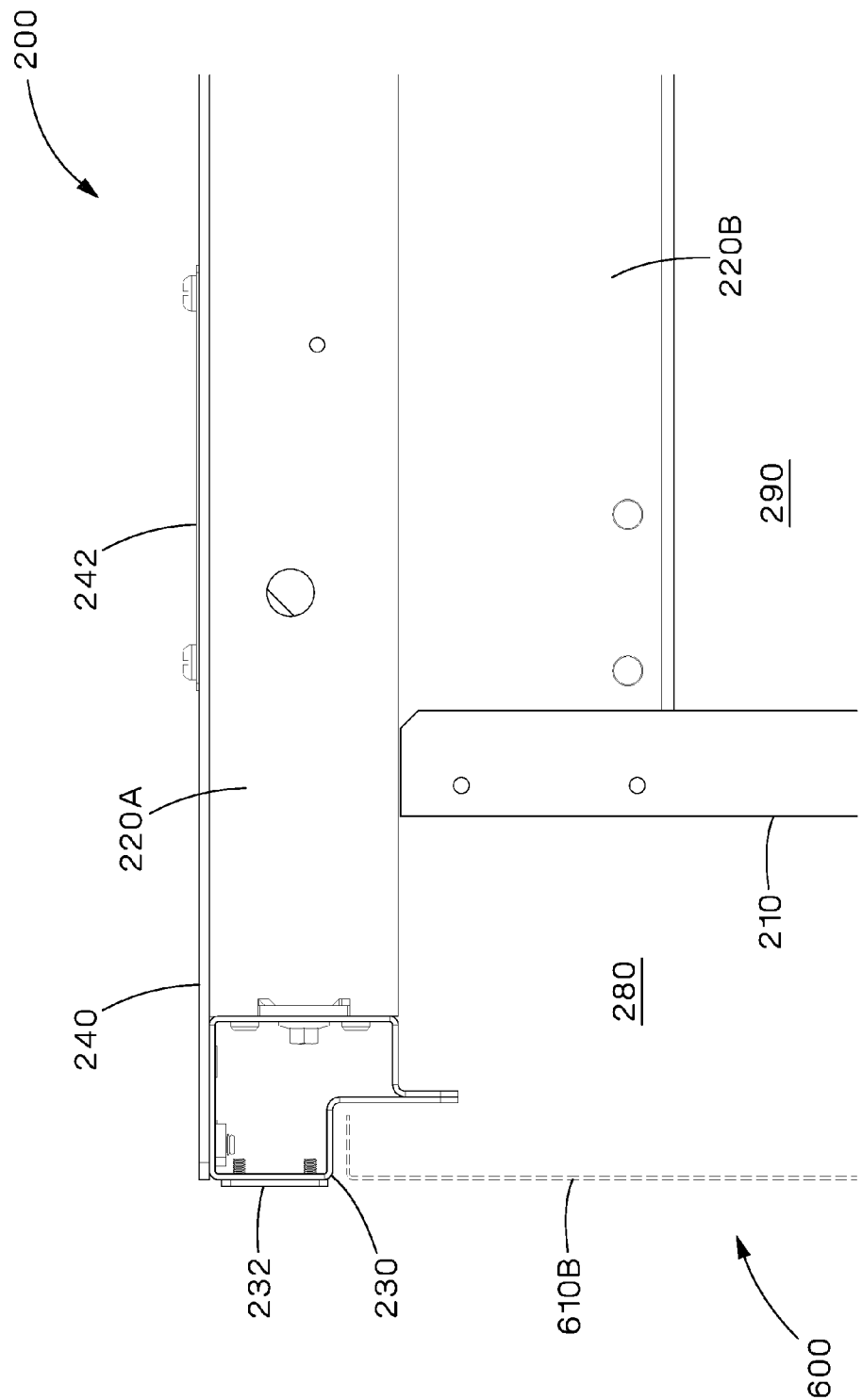
FIG. 14 is an enlarged top view of detail 14 of FIG. 13.
Figure 15:
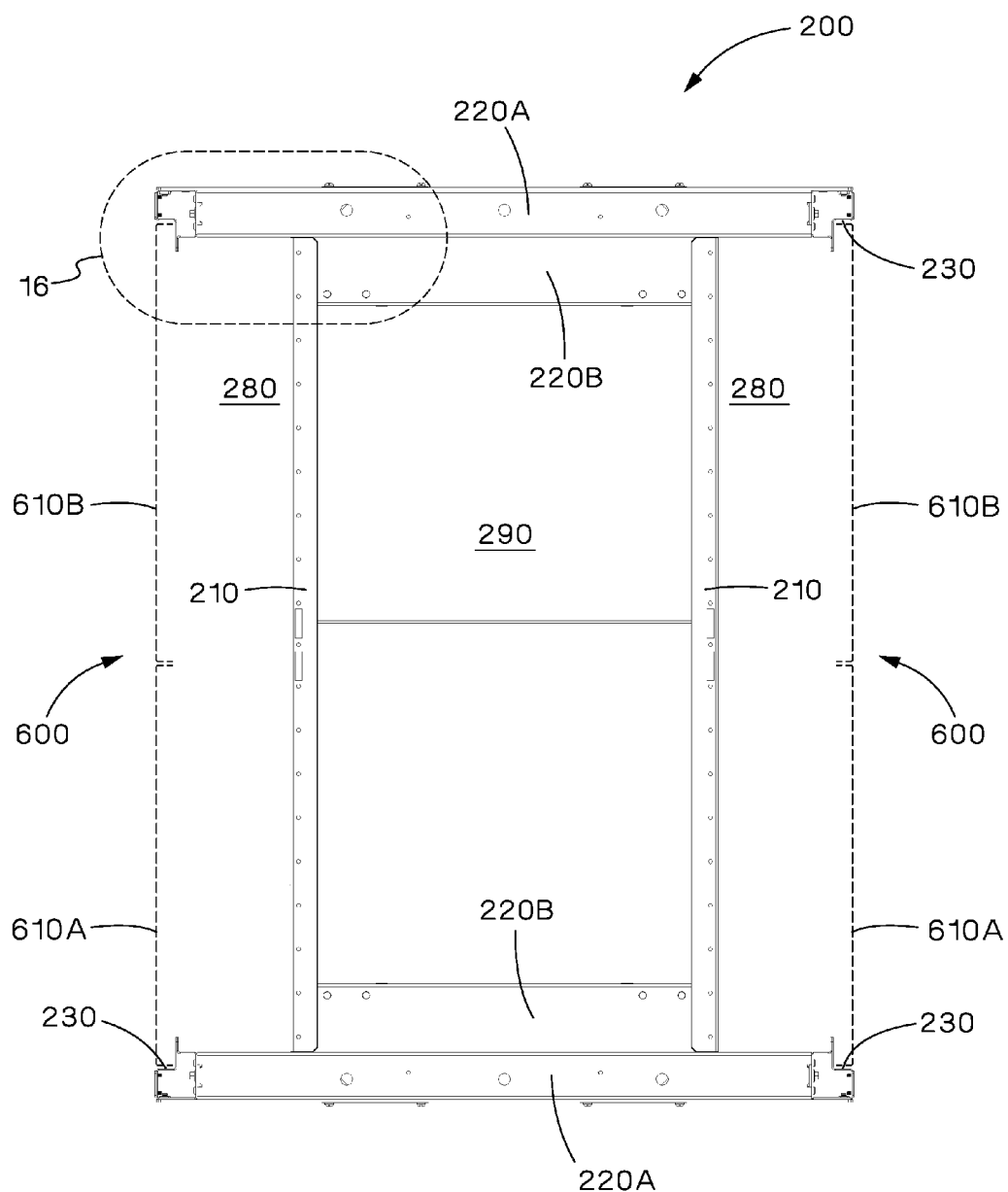
FIG. 15 is a top view of a cabinet frame having a width (e.g., 800 mm) greater than the width (e.g., 700 mm) of the cabinet frame of FIG. 13.
Figure 16:
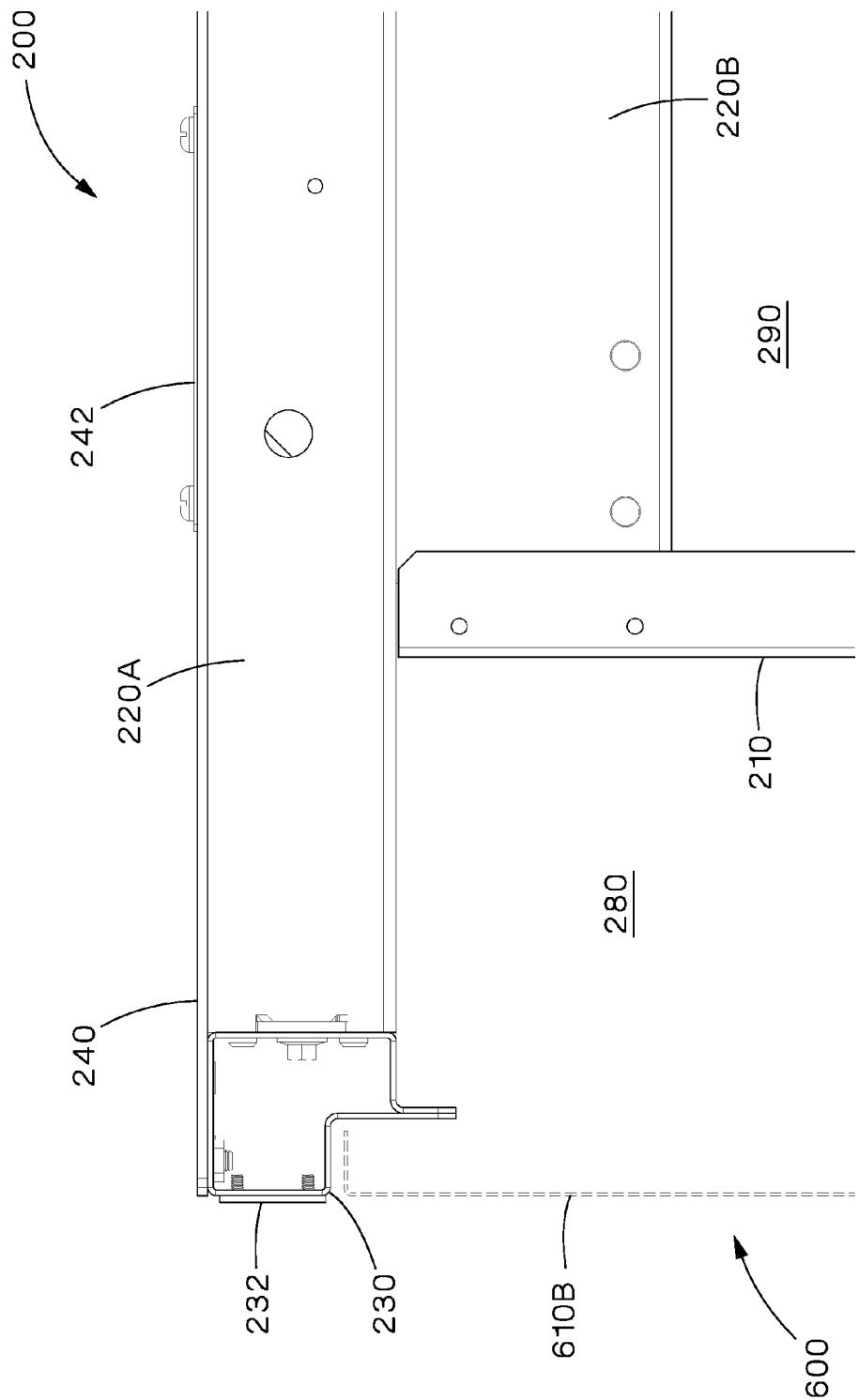
FIG. 16 is an enlarged top view of detail 16 of FIG. 15.
Figure 17:
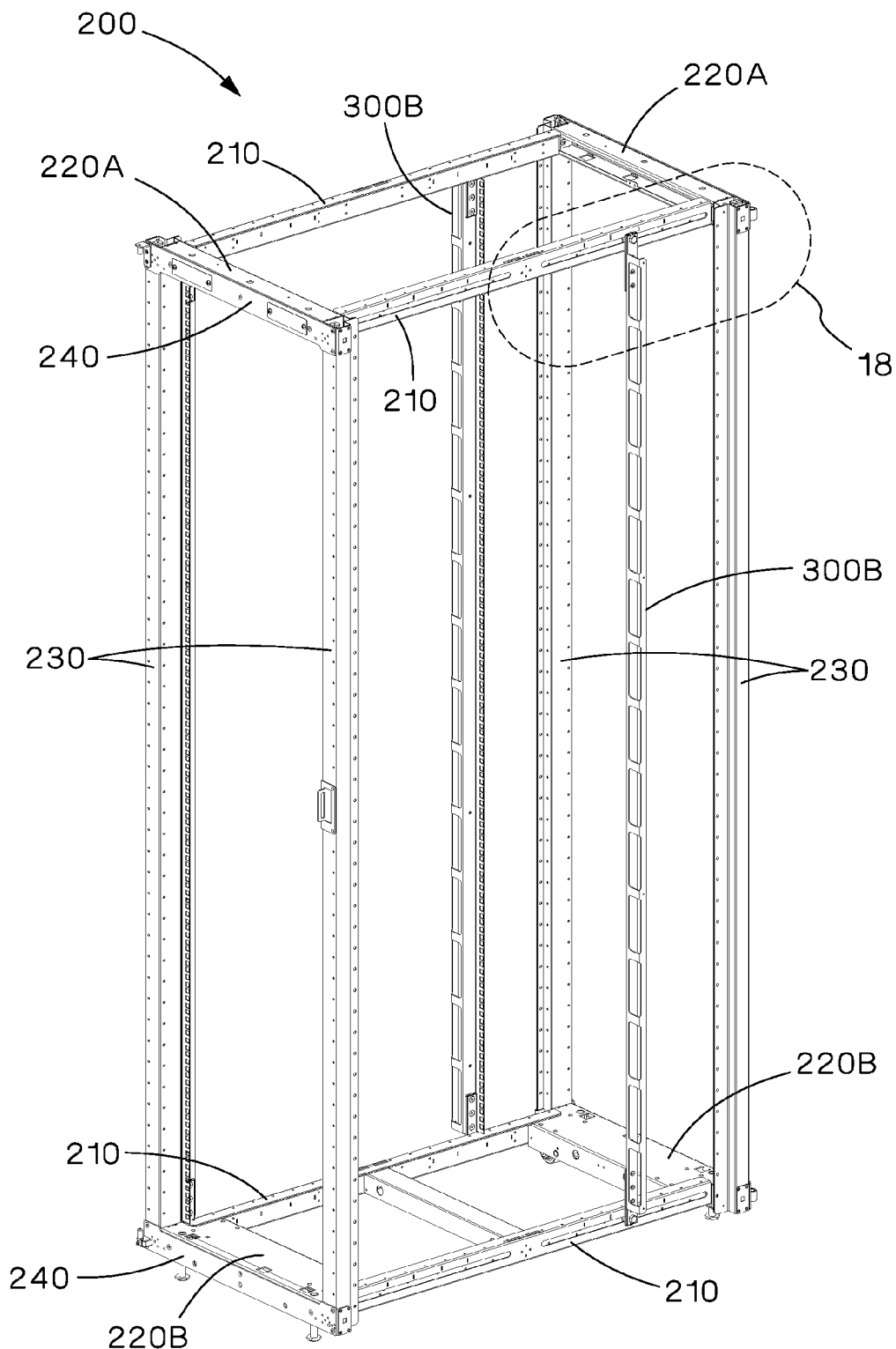
FIG. 17 is a top front perspective view of the cabinet frame of FIG. 4, showing the equipment rails installed.
Figure 18:
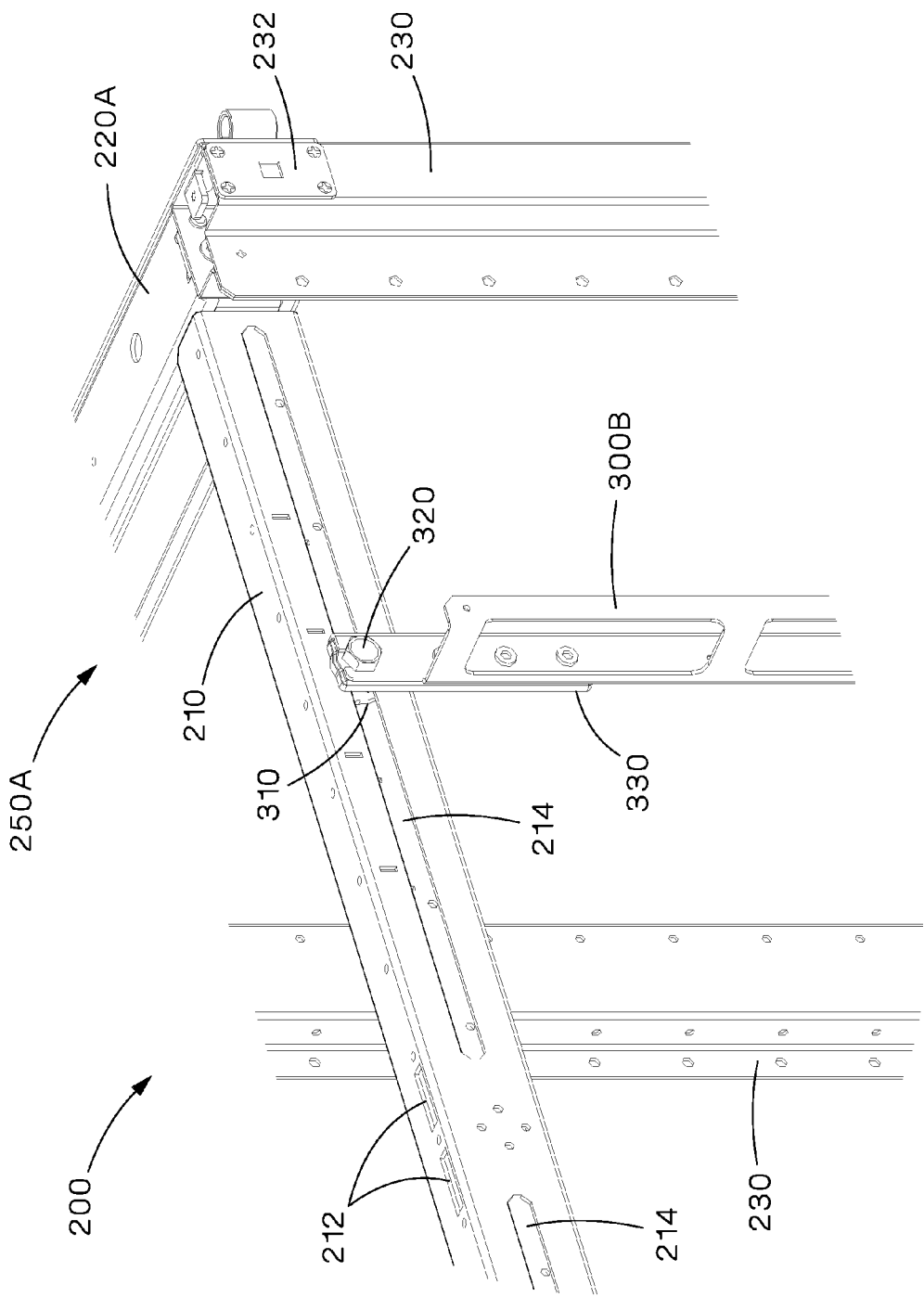
FIG. 18 is an enlarged top front perspective view of detail 18 of FIG. 17.

As shown in FIGS. 11 and 12, front-to-back beams 210 are inset relative to vertical posts 230, and more particularly, intersection of side-to-side beams 220A, 220B and vertical posts 230, forming cable-routing area 280 along the side of cabinet frame 200, for example, between equipment-mounting area 290, as defined by equipment rails 300A, 300B, and side door panels 610A, 610B of side door 600.

As the width of electronics cabinet 100 is increased, for example, from 600 mm (FIGS. 11 and 12) to 700 mm (FIGS. 13 and 14) and 800 mm (FIGS. 15 and 16), the width of cable-routing area 280 is increased, while the width of equipment-mounting area 290 remains the same.

As shown in FIGS. 17-19 and 28-31, equipment rails 300A, 300B are connected to cabinet frame 200, and more particularly, front-to-back beams 210 of top and bottom frames 250A, 250B. Preferably, equipment rails 300A, 300B are adjustable. That is, equipment rails 300A, 300B are removably connected to cabinet frame 200, and more particularly, front-to-back beams 210 of top and bottom frames 250A, 250B, for example, using removable connectors, such as nuts and bolts and screws.

Figure 19:
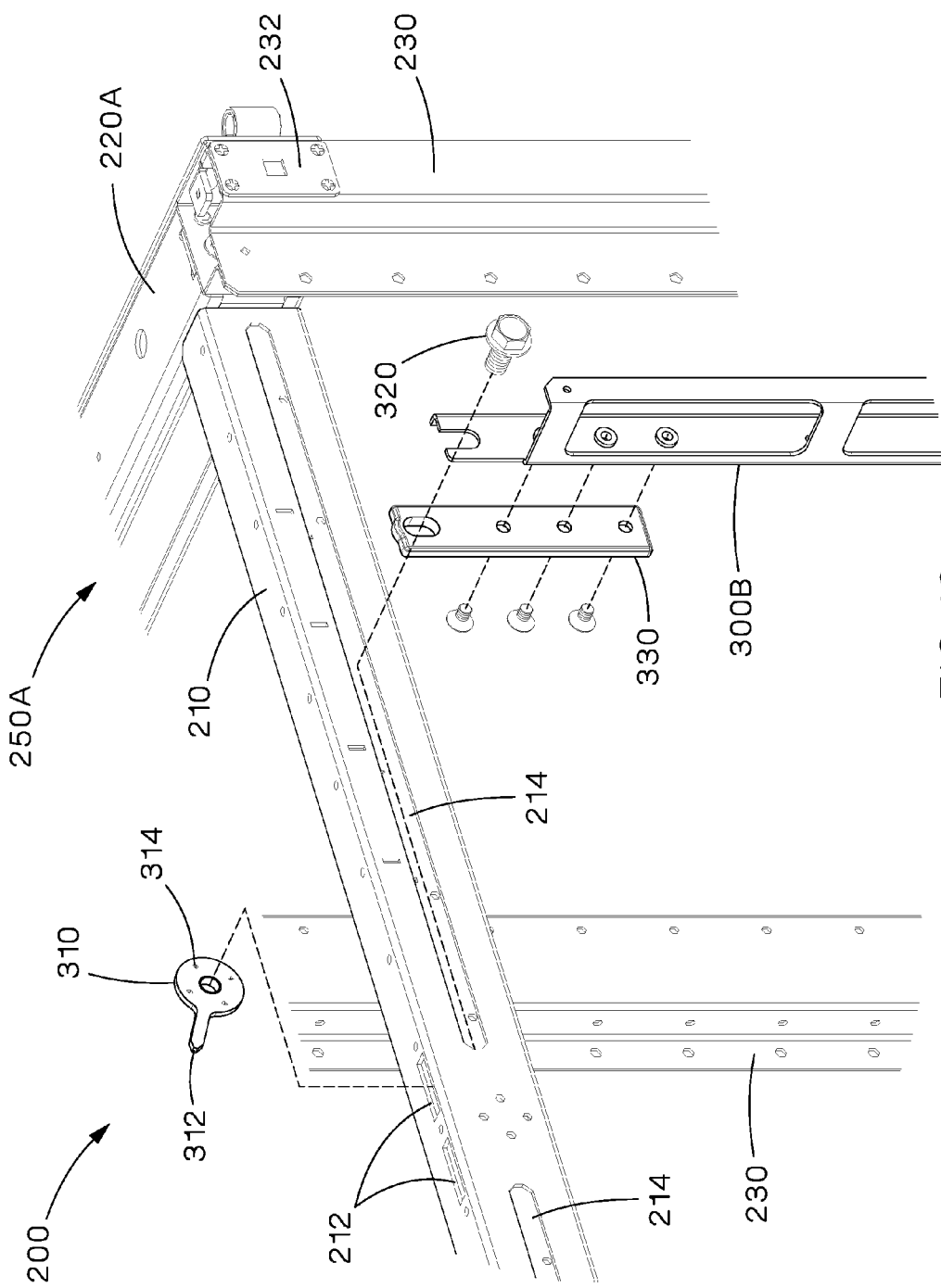
FIG. 19 is an exploded top front perspective view of FIG. 19.
Figure 31:
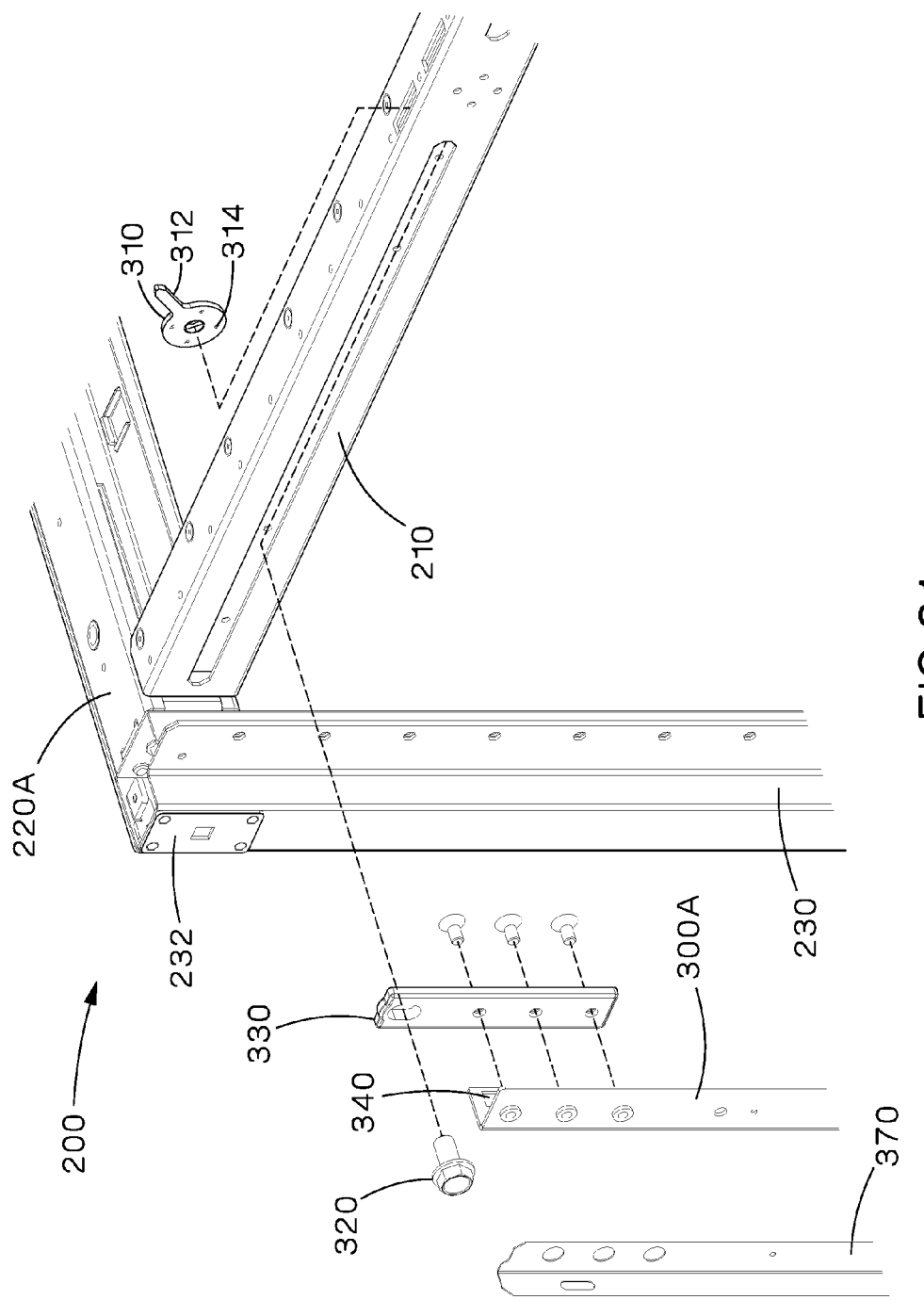
FIG. 31 is a partially exploded top back perspective view of FIG. 30.

For example, as shown in FIGS. 19 and 31, equipment rails 300A, 300B include channel nuts 310 and mounting bolts 320. Channel nuts 310 includes tabs 312 for positioning channel nuts 310 through top openings 212 in front-to-back beams 210 and aligning channel nuts 310 with side openings 214 in front-to-back beam 210. Additionally, channel nuts 310 include barbs 314 for securing channel nuts 310 to front-to-back beams 210 and grounding equipment rails 300 to cabinet frame 200.

Figure 20:
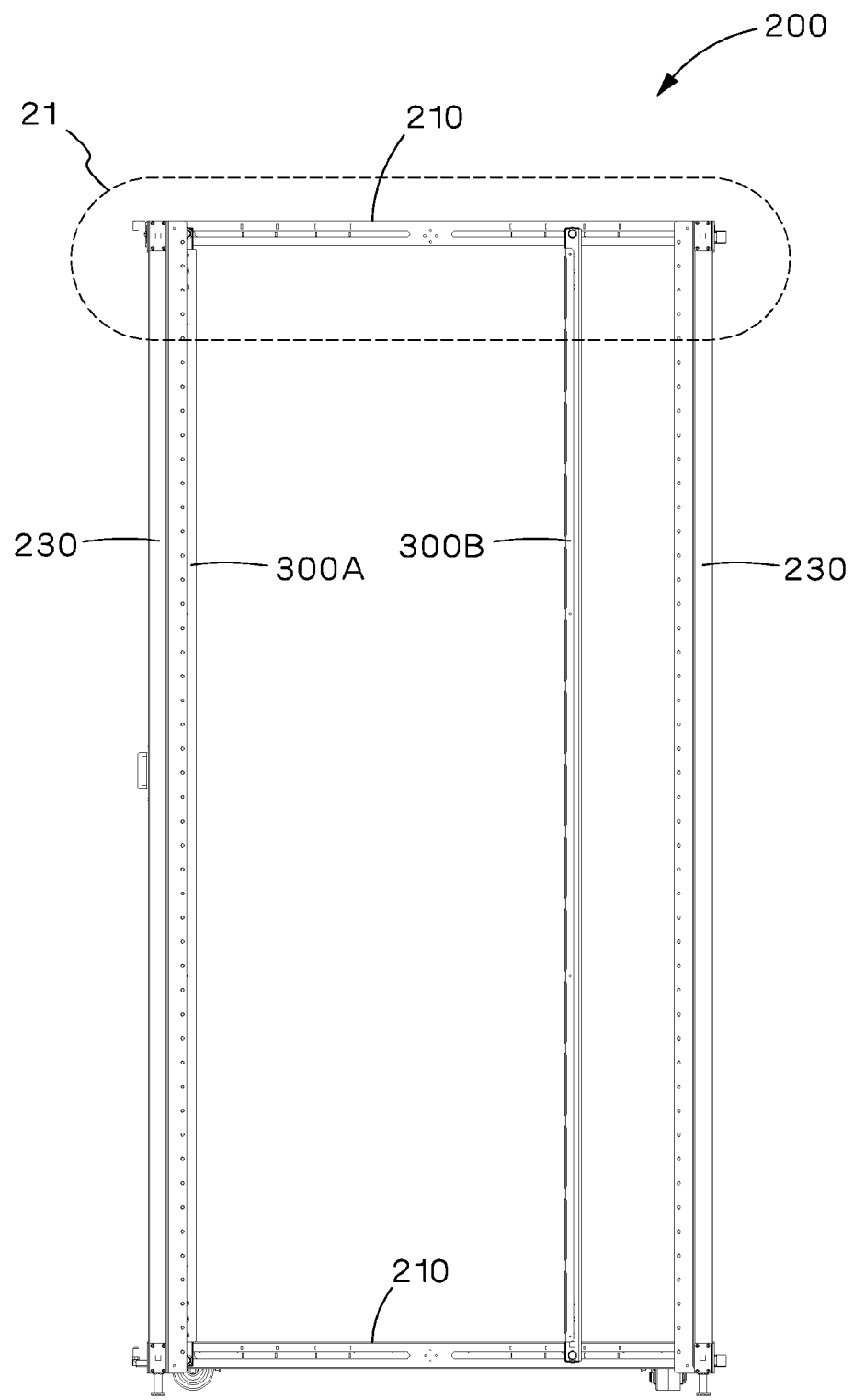
FIG. 20 is a side view of the cabinet frame of FIG. 17.
Figure 21:
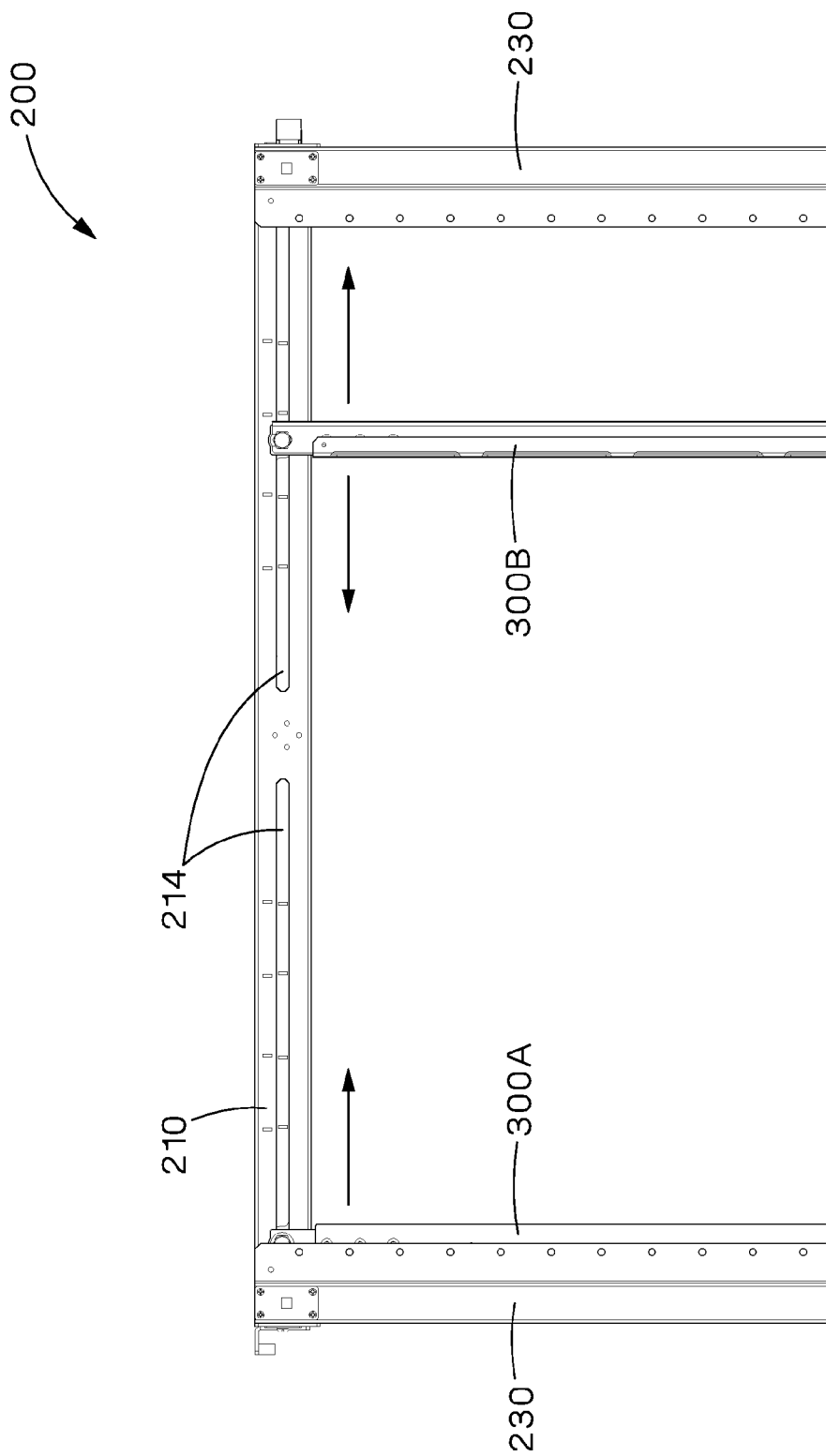
FIG. 21 is a side view of detail 21 of FIG. 20.

As shown in FIGS. 20 and 21, when channel nuts 310 and mounting bolts 320 are engaged and tight, equipment rails 300A, 300B are secured to front-to-back beams 210. However, when channel nuts 310 and mounting bolts 320 are engaged, but loose, equipment rails 300A, 300B slide along elongated openings 214 in front-to-back beams 210, allowing equipment rails 300A, 300B to be positioned at any number of locations along elongated openings 214 in front-to-back beams 210.

Depending on the location of equipment rails 300A, 300B, additional cable routing areas 280 might be provided, for example, in the front of electronics cabinet 100 and in the back of electronics cabinet 100.

Additionally, as shown in FIGS. 19 and 31, equipment rails 300A, 300B include stiffeners 330, which are removably connected to equipment rails 300A, 300B, for example, using removable connectors, such as nuts and bolts and screws, but it is likewise contemplated that stiffeners 330 are permanently connected to equipment rails 300A, 300B, for example, using permanent connectors, such as rivets and welds. Alternatively, equipment rails 300A, 300B and stiffeners 330 are integrally formed.

As shown in FIGS. 22-27, equipment rails 300B include mounting openings 340 for mounting electronic equipment, such as servers, patch panels, and switches, in electronics cabinet 100, and are configured to receive accessory mounting brackets, such as patch panel cassette mounting brackets 350 and cable management finger mounting brackets 360, for mounting accessories, such as patch panel cassettes 352 and cable management fingers 362 in electronics cabinet 100, and more particularly, cable routing area 280 of electronics cabinet 100.

Figure 22:
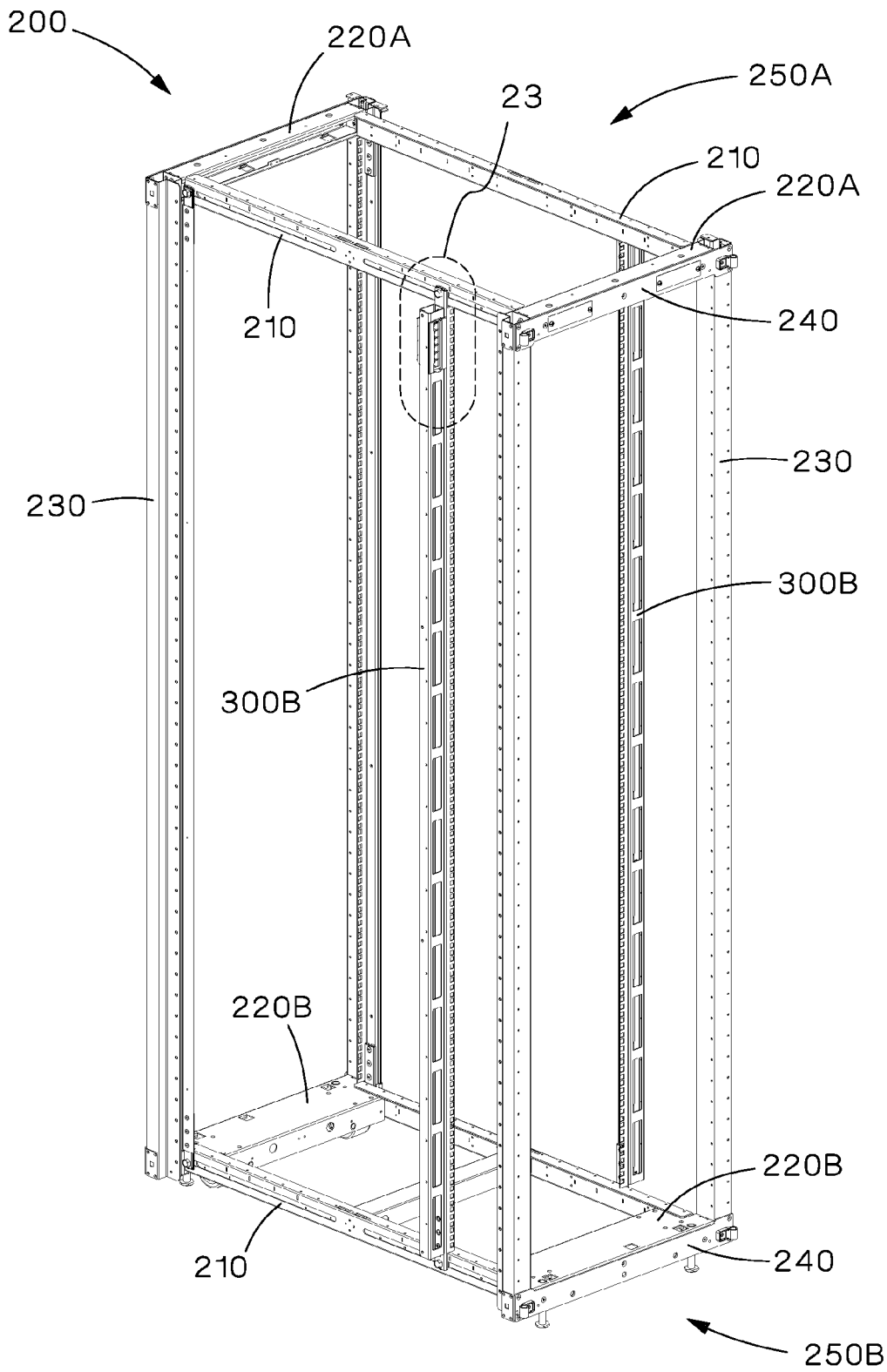
FIG. 22 is top back perspective view of the cabinet frame of FIG. 17, showing patch panel cassettes installed on the equipment rails.
Figure 23:
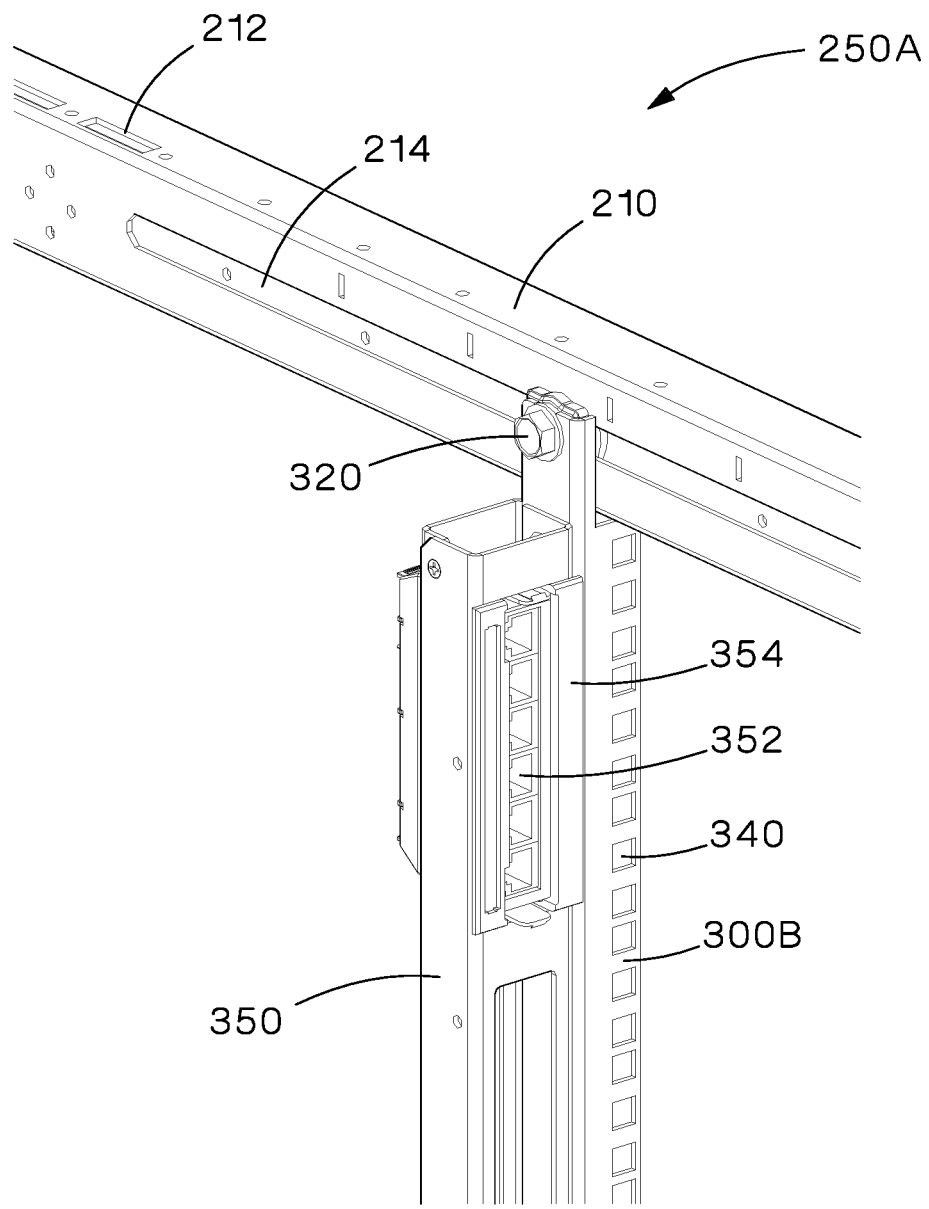
FIG. 23 is an enlarged top back perspective view of detail 23 of FIG. 22.
Figure 24:
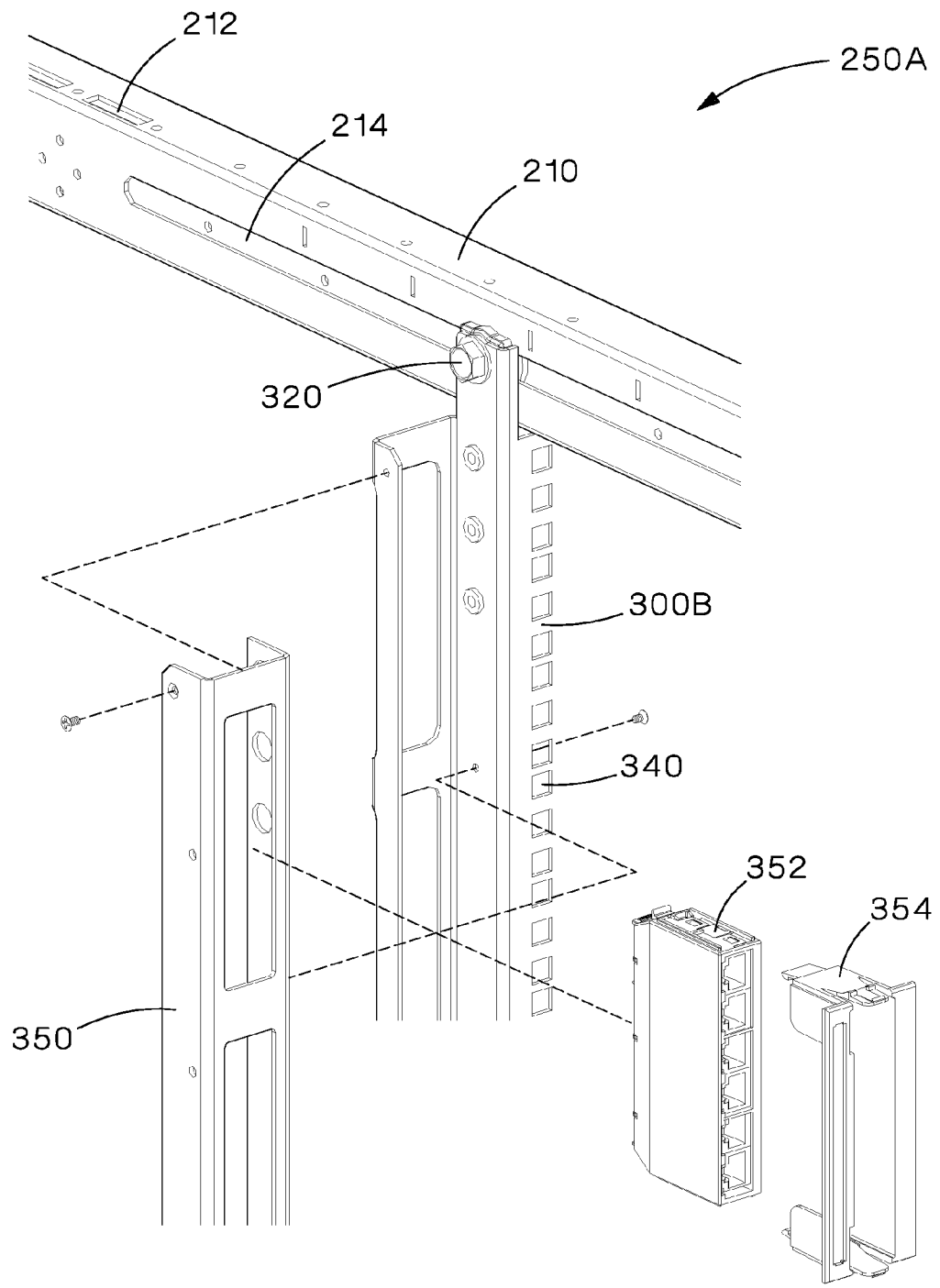
FIG. 24 is a partially exploded top back perspective view of FIG. 23.

For example, as shown in FIGS. 22-24, equipment rails 300B include patch panel cassette mounting brackets 350 for mounting patch panel cassettes 352 to equipment rails 300B.

As shown in FIG. 24, patch panel cassette mounting brackets 350 are removably connected to equipment rails 300B, for example, using removable connectors, such as nuts and bolts and screws, but it is likewise contemplated that patch panel cassette mounting brackets 350 are permanently connected to equipment rails 300B, for example, using permanent connectors, such as rivets and welds. Alternatively, equipment rails 300B and patch panel cassette mounting brackets 350 are integrally formed. Patch panel cassettes 352 snap-fit into patch panel cassette housings 354, which in turn, snap-fit into patch panel cassette mounting brackets 350. As such, patch panel cassette housings 354 are quickly and easily removed from patch panel cassette mounting brackets 350, providing greater access to patch panel cassettes 350.

Figure 25:
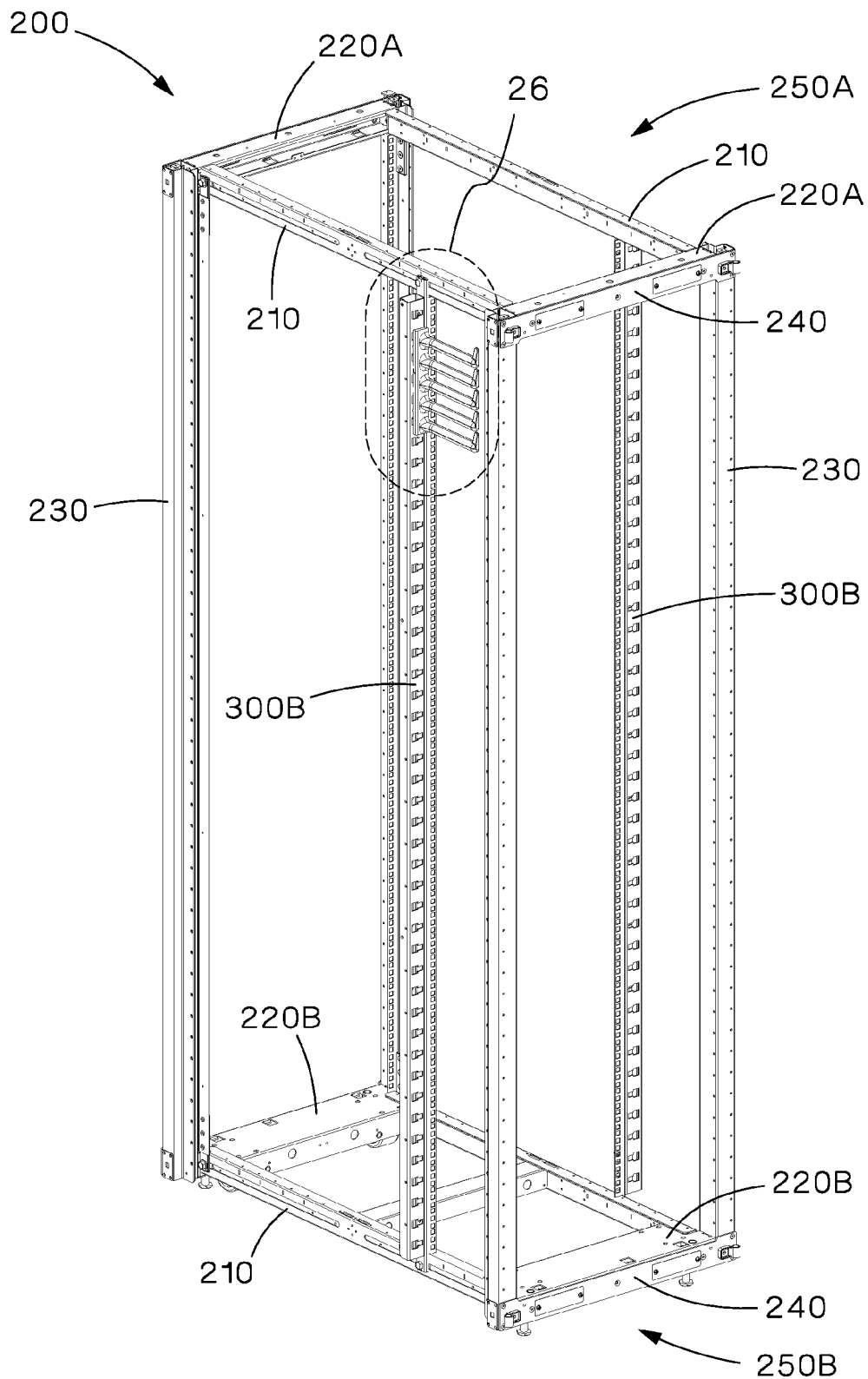
FIG. 25 is a top back perspective view of the cabinet frame of FIG. 17, showing cable management fingers installed on the equipment rails.
Figure 26:
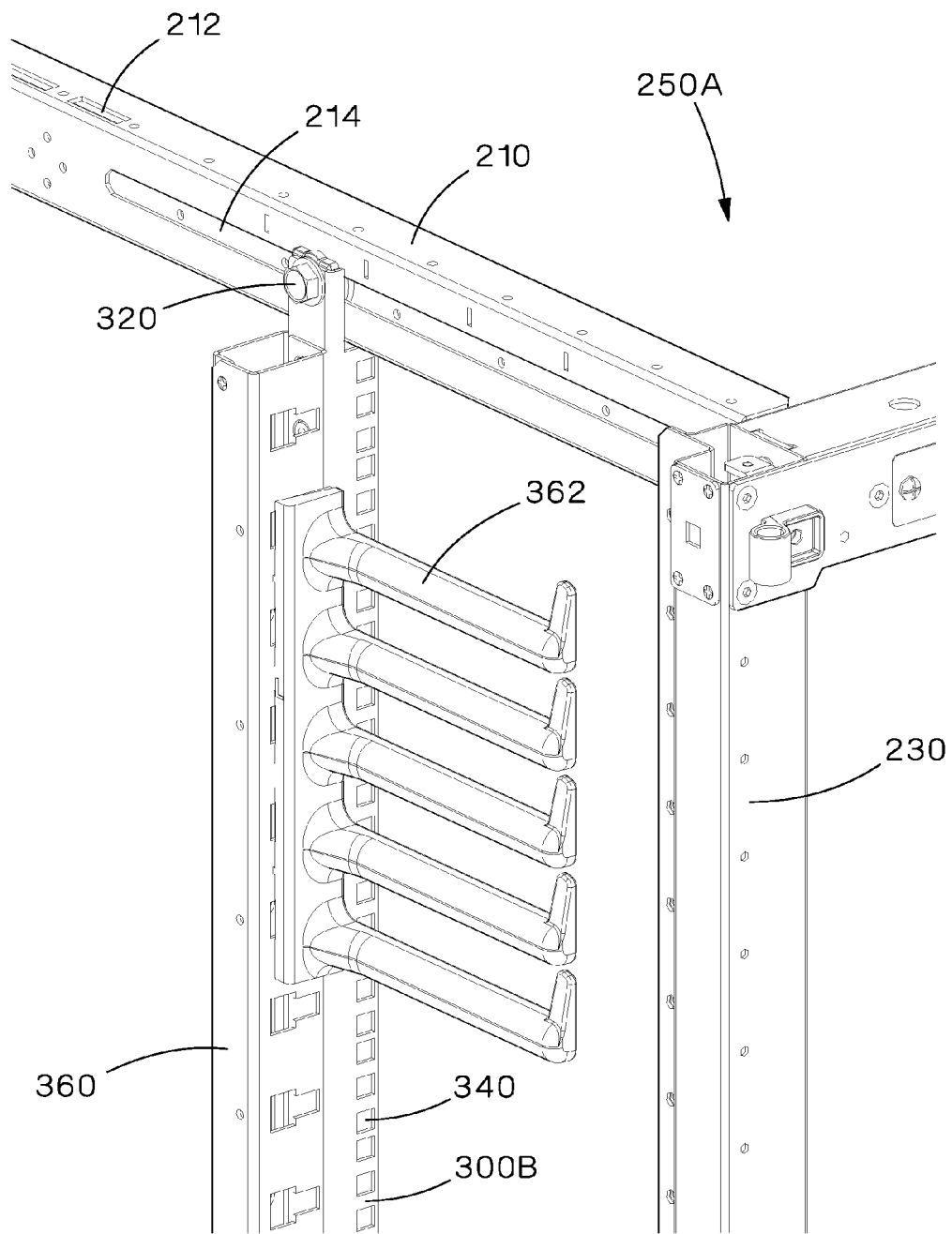
FIG. 26 is an enlarged top back perspective view of detail 26 of FIG. 25.
Figure 27:
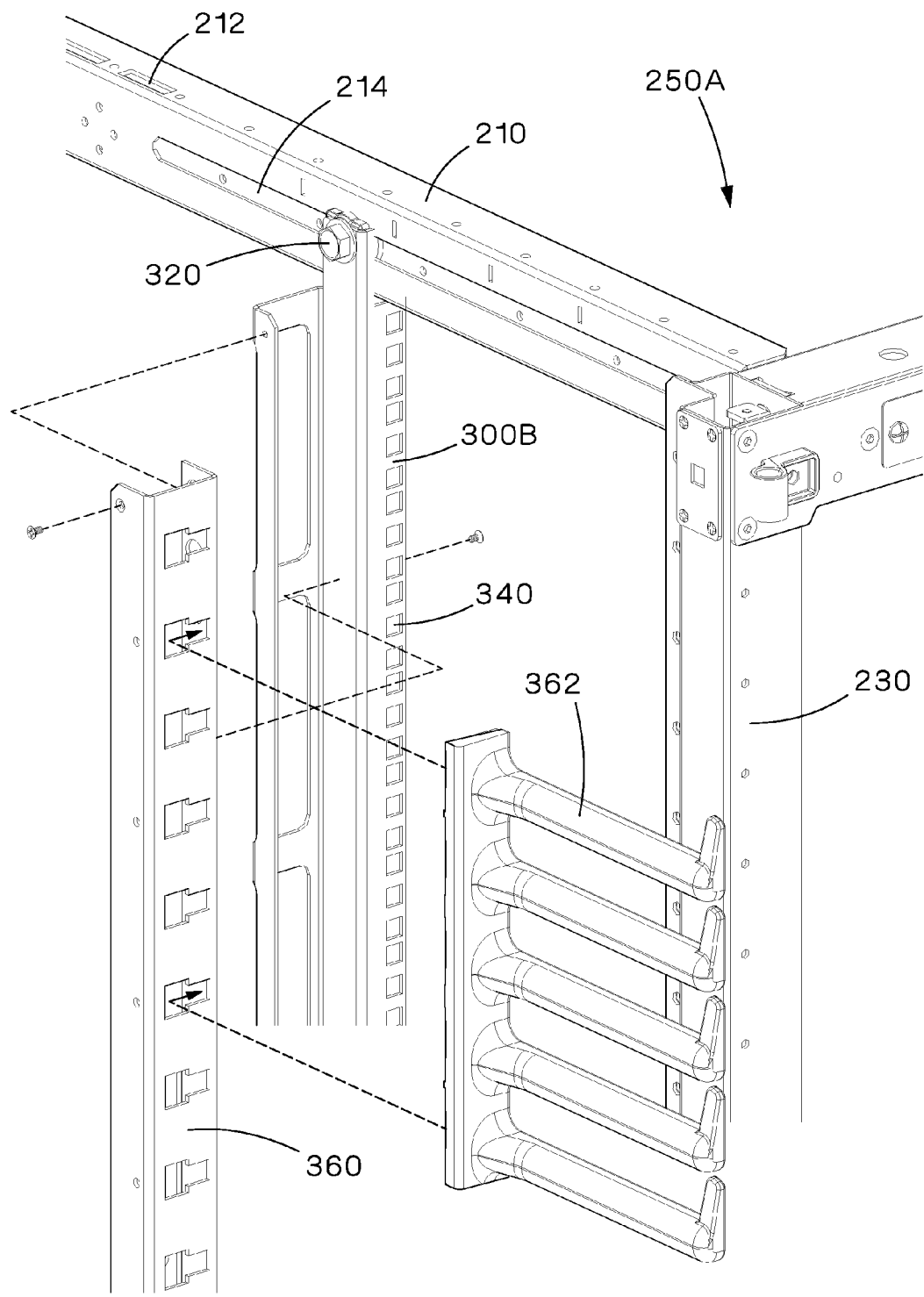
FIG. 27 is a partially exploded top back perspective view of FIG. 26.
Figure 28:
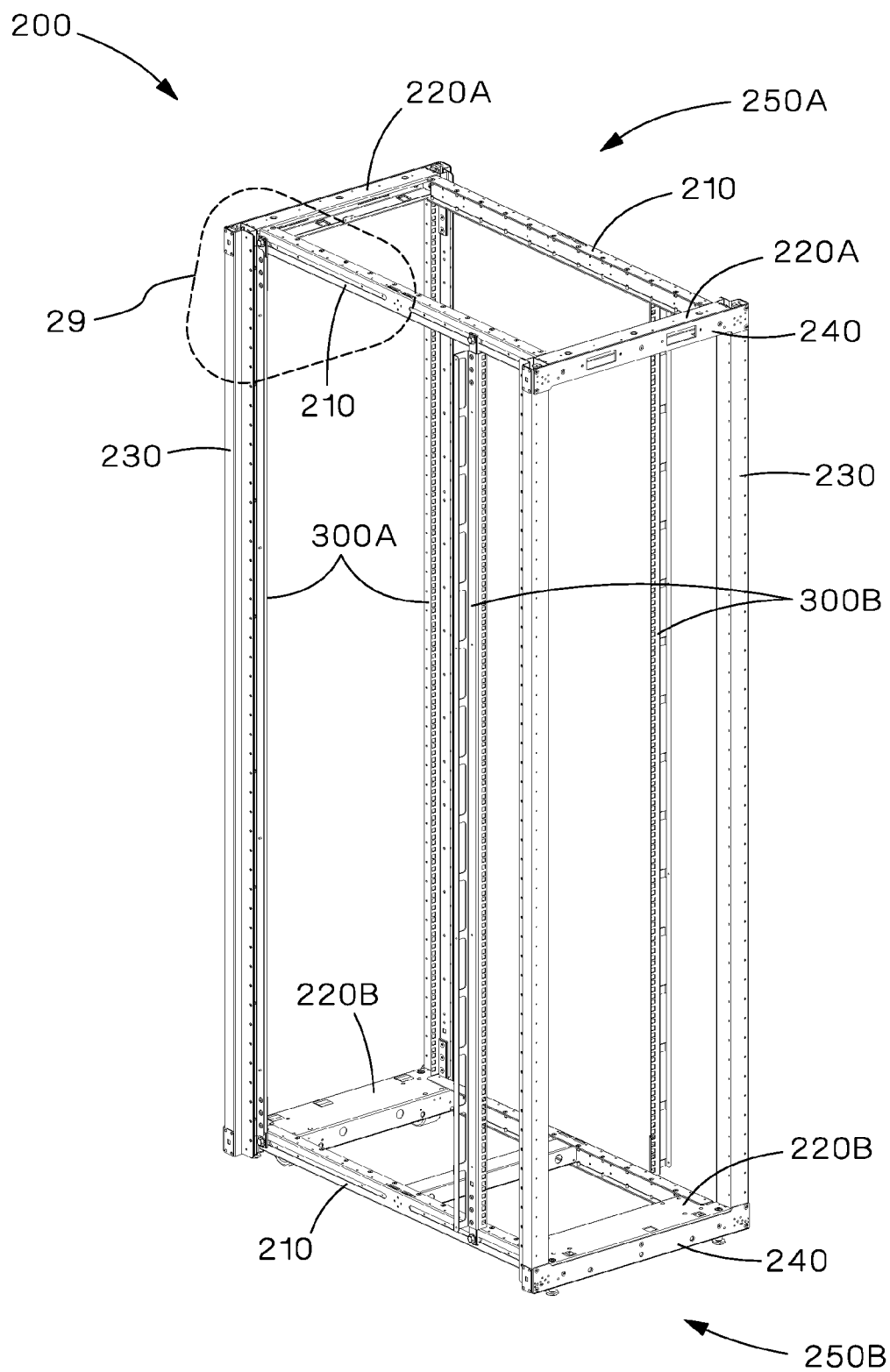
FIG. 28 is a top back perspective view of the cabinet frame of FIG. 17, showing vertical blanking panels installed on the equipment rails.
Figure 29:
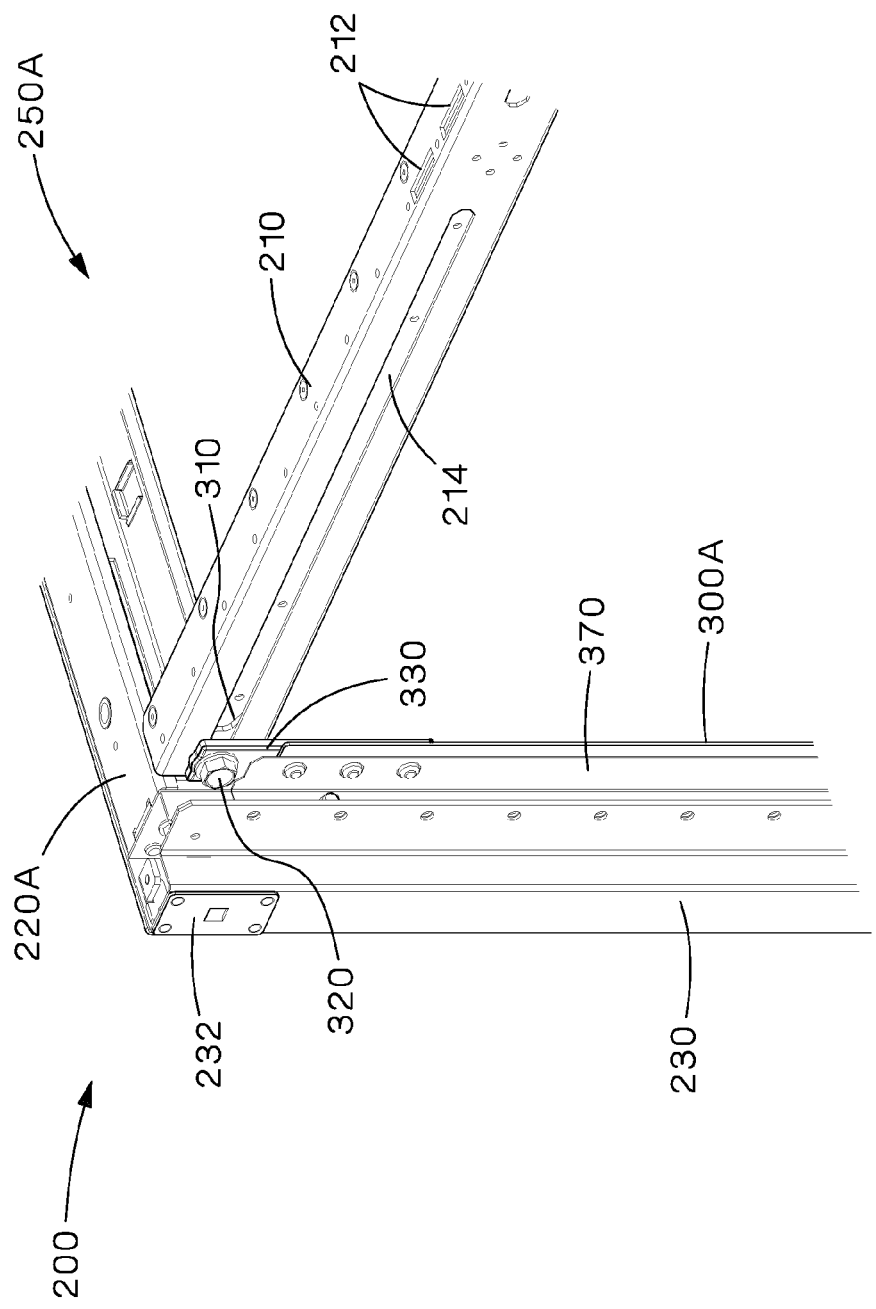
FIG. 29 is an enlarged top back perspective view of detail 29 of FIG. 28.

Alternatively, as shown in FIGS. 25-27, equipment rails 300B include cable management finger mounting brackets 360 for mounting cable management fingers 362 to equipment rails 300B. As shown in FIG. 27, cable management finger mounting brackets 360 are removably connected to equipment rails 300B, for example, using removable connectors, such as nuts and bolts and screws, but it is likewise contemplated that cable management finger mounting brackets 350 are permanently connected to equipment rails 300B, for example, using permanent connectors, such as rivets and welds. Alternatively, equipment rails 300B and cable management finger mounting brackets 360 are integrally formed. Cable management fingers 362 snap-fit into cable management finger mounting brackets 360.

As shown in FIGS. 28-31, equipment rails 300A include mounting openings 340 for mounting electronic equipment, such as servers, patch panels, and switches, in electronics cabinet 100, and are configured to receive blanking panels, such as horizontal blanking panels (not shown), which are typically mounted to equipment rails 300A using mounting openings 340, and vertical blanking panels 370, for sealing open areas of electronics cabinet 100 to separate cooled intake air and heated exhaust air.

Figure 30:
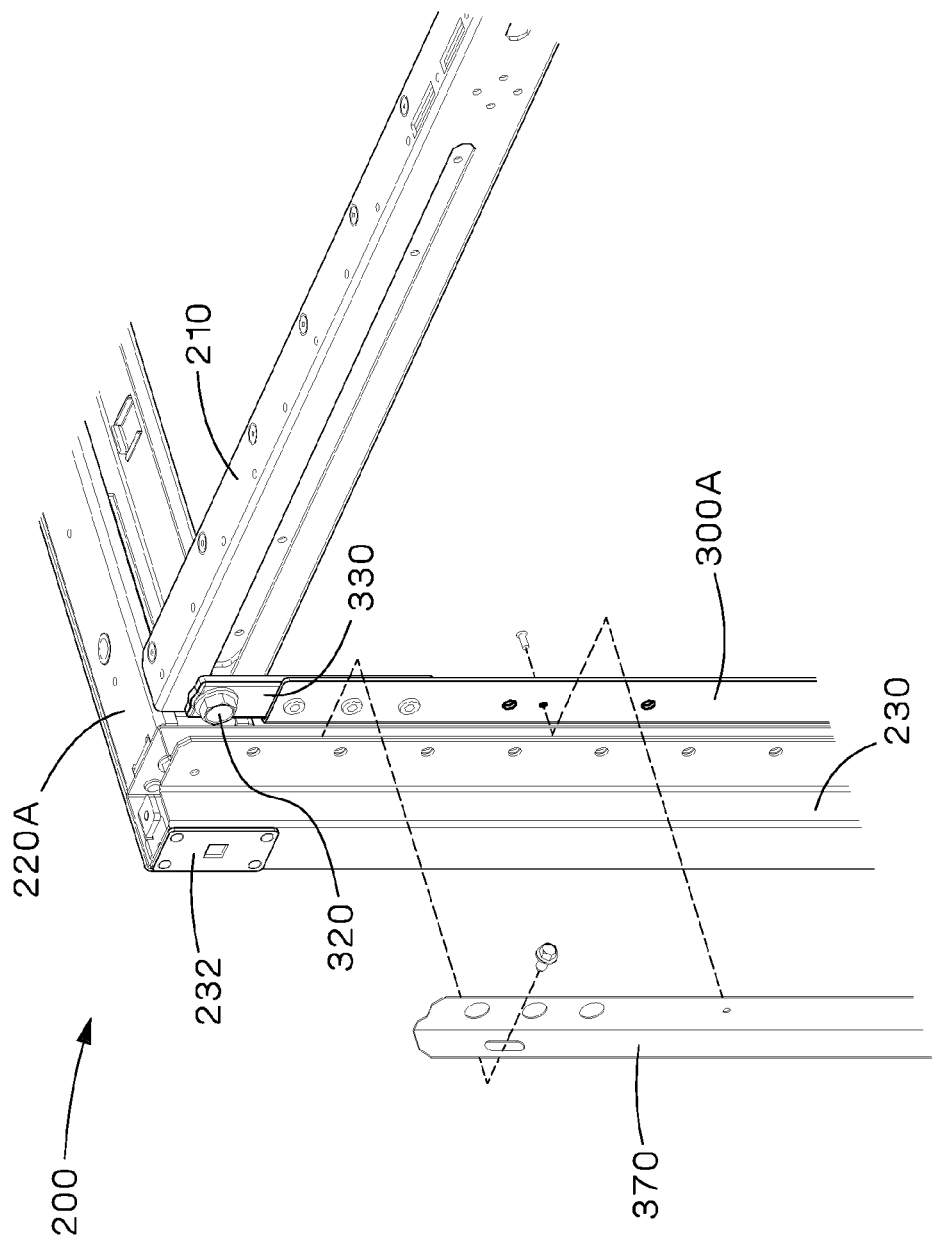
FIG. 30 is a partially exploded top back perspective view of FIG. 29.

For example, as shown in FIGS. 28-31, equipment rails 300A include vertical blanking panels 370. As shown in FIG. 30, vertical blanking panels 370 are removably connected to equipment rails 300A, for example, using removable connectors, such as nuts and bolts and screws, but it is likewise contemplated that vertical blanking panels 370 are permanently connected to equipment rails 300A, for example, using permanent connectors, such as rivets and welds. Alternatively, equipment rails 300A and vertical blanking panels 370 are integrally formed. Additionally, vertical blanking panels 370 are removably connected to vertical posts 230, providing additional stiffness to cabinet frame 200, and more particularly, vertical posts 230.

Figure 32:
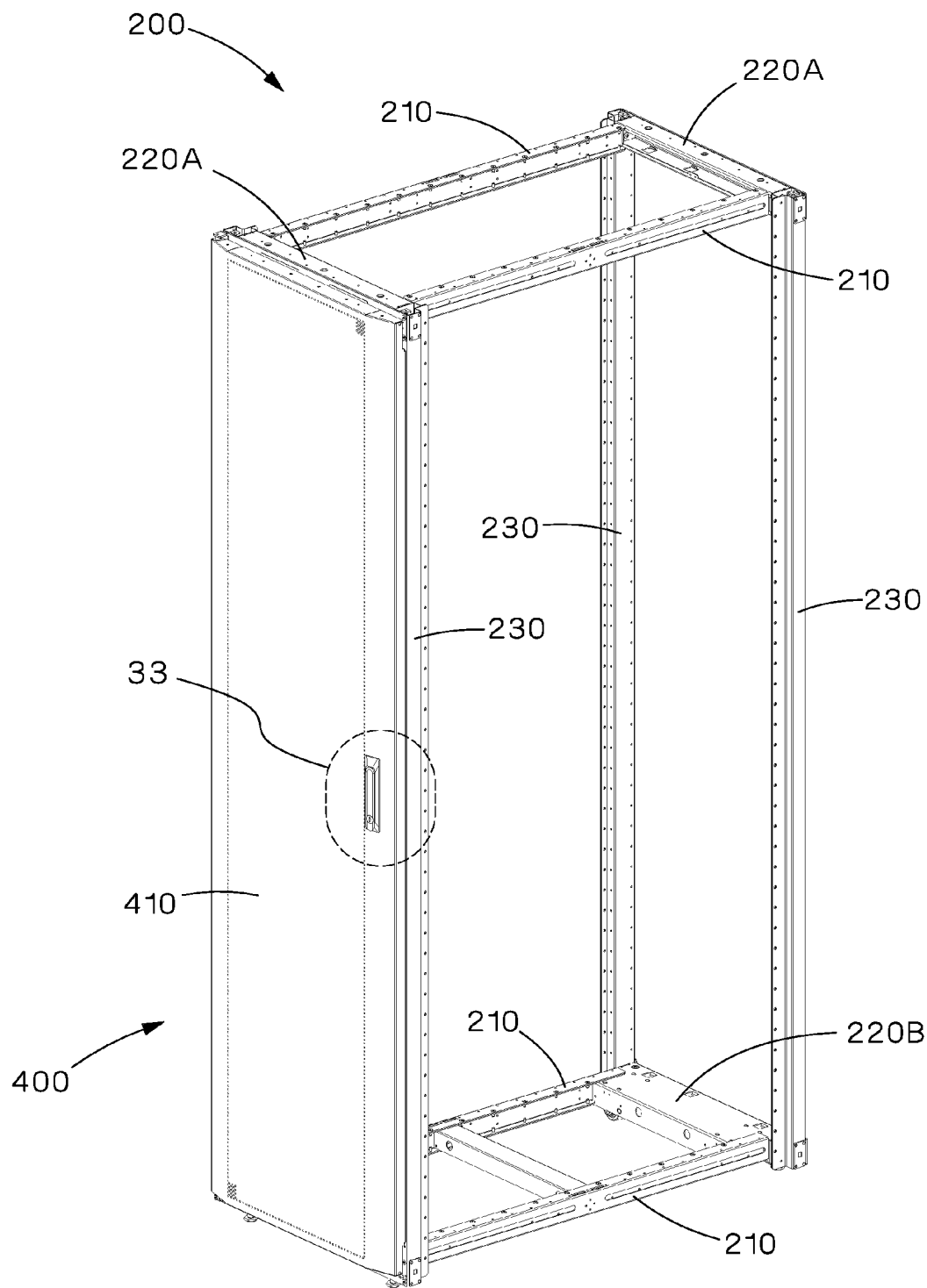
FIG. 32 is a top front perspective view of the cabinet frame of FIG. 4, showing the front door installed and in a closed position.
Figure 33:
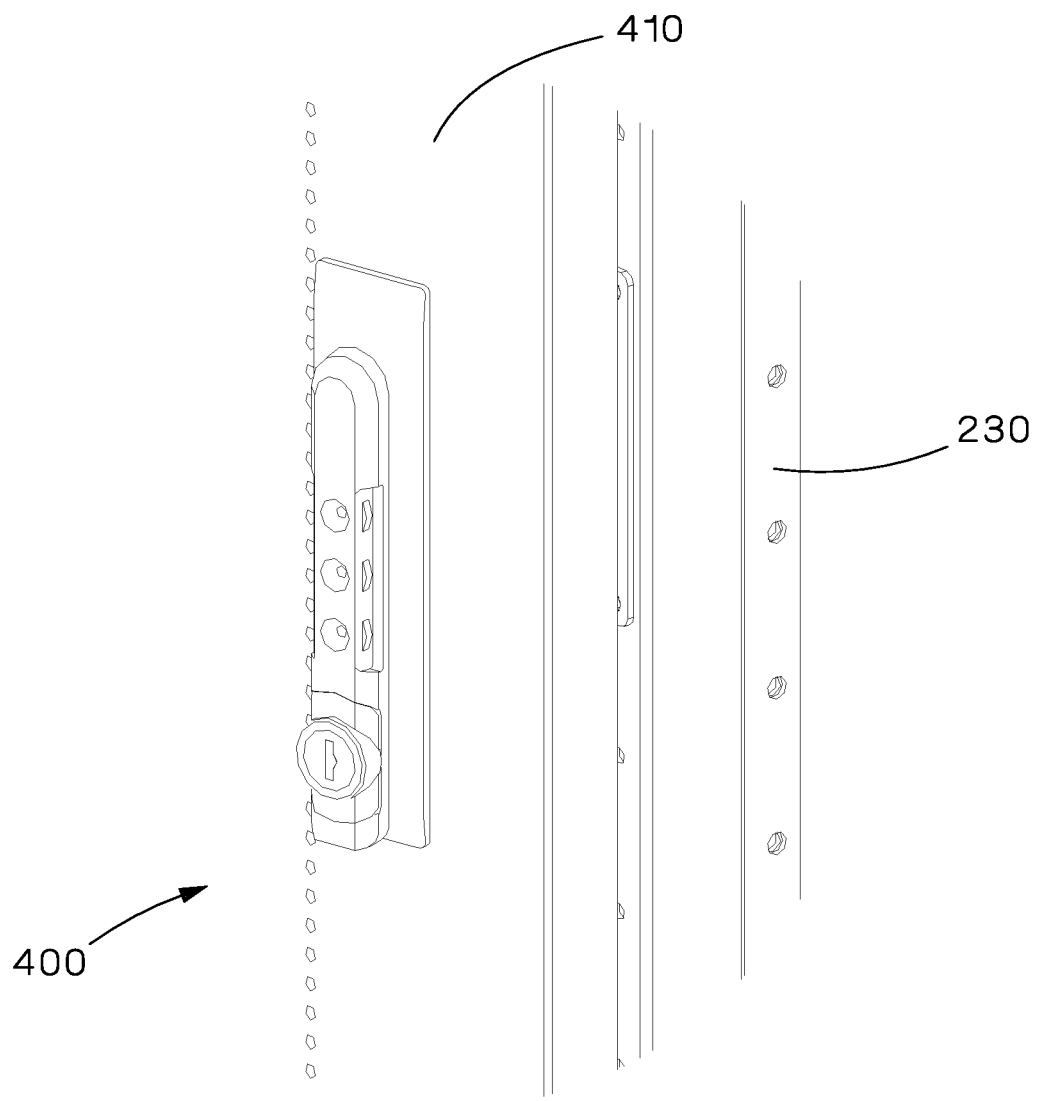
FIG. 33 is an enlarged top front perspective view of detail 33 of FIG. 32.
Figure 34:
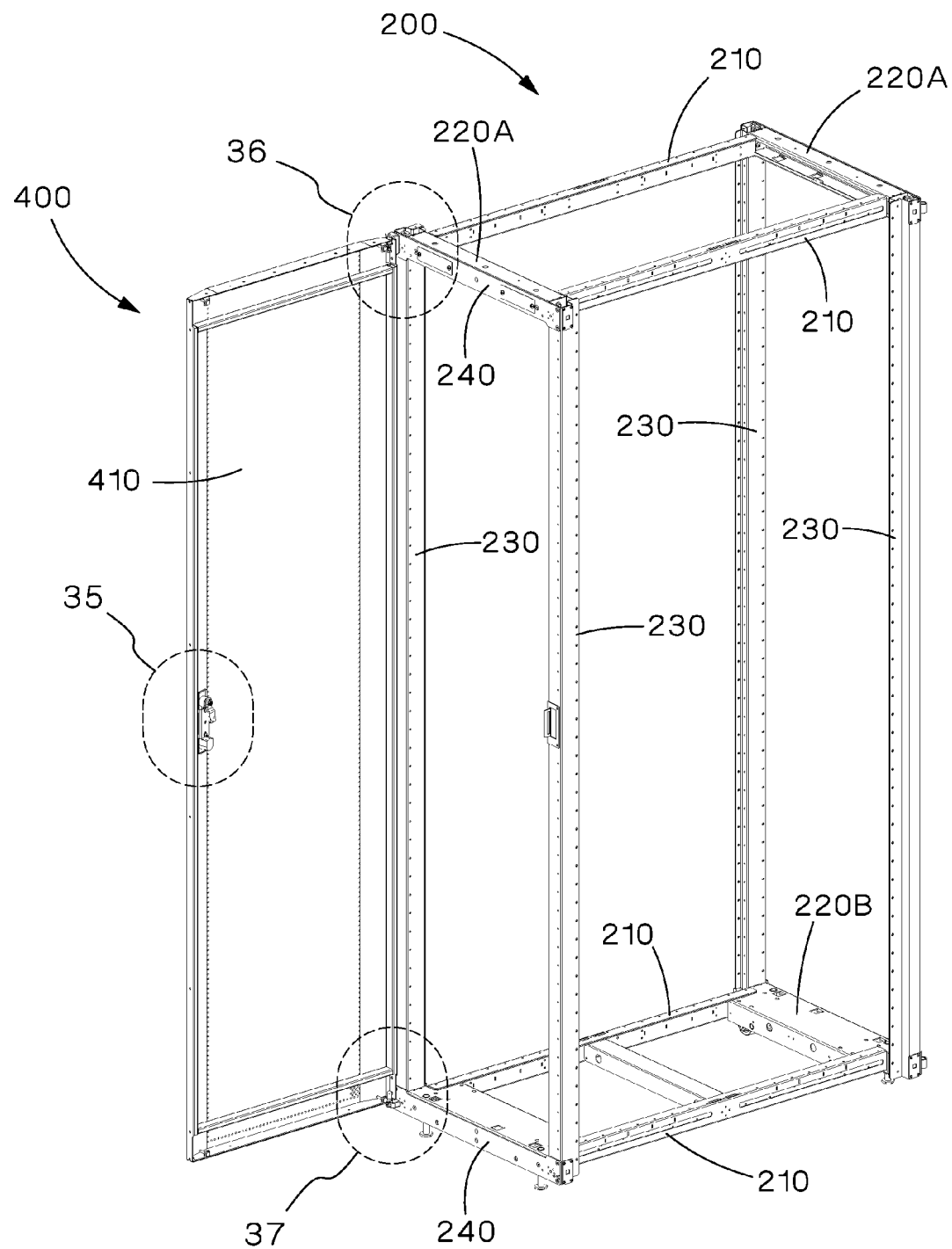
FIG. 34 is a top front perspective view of the cabinet frame of FIG. 32, showing the front door in an open position.
Figure 35:
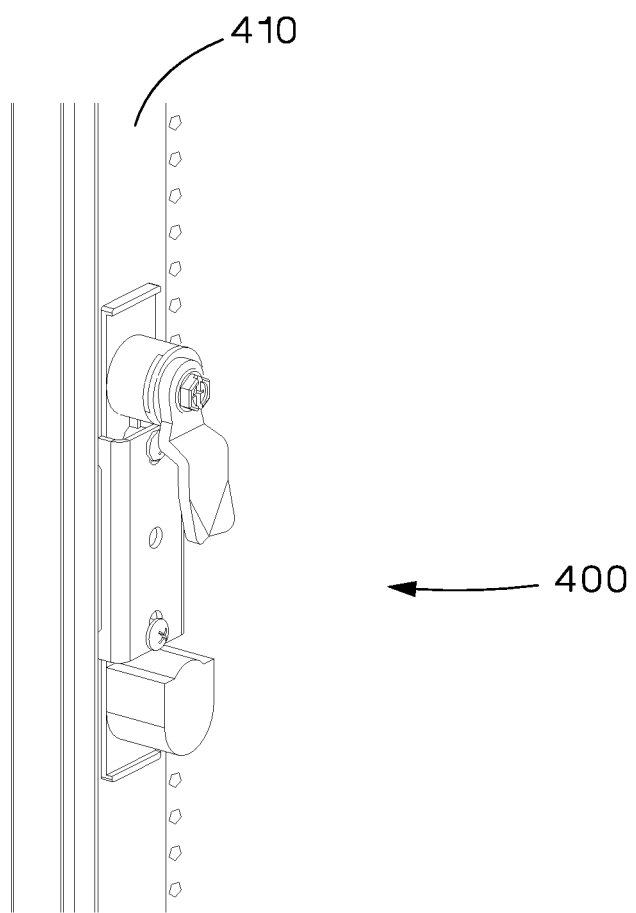
FIG. 35 is an enlarged top front perspective view of detail 35 of FIG. 34.
Figure 36:
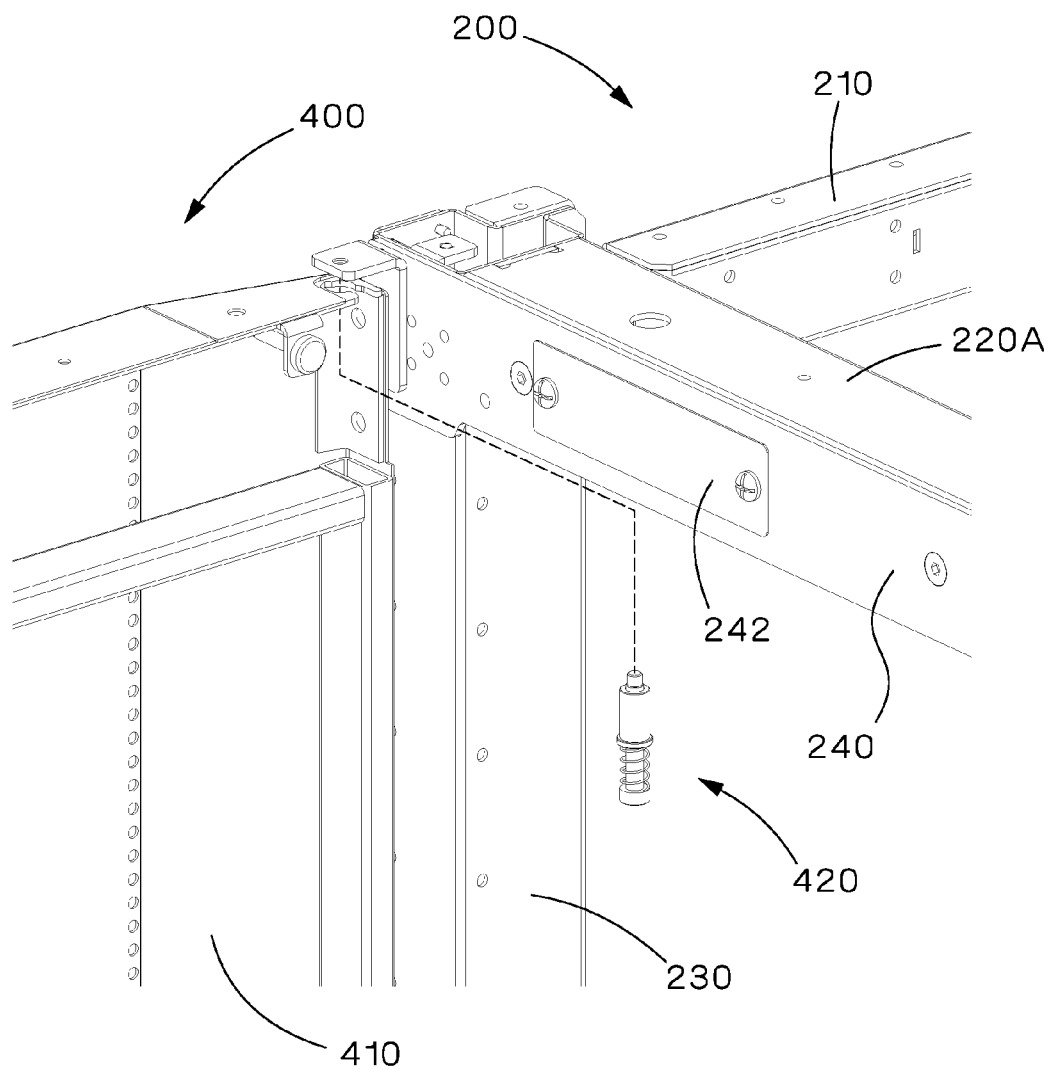
FIG. 36 is an enlarged top front perspective view of detail 36 of FIG. 34.
Figure 37:
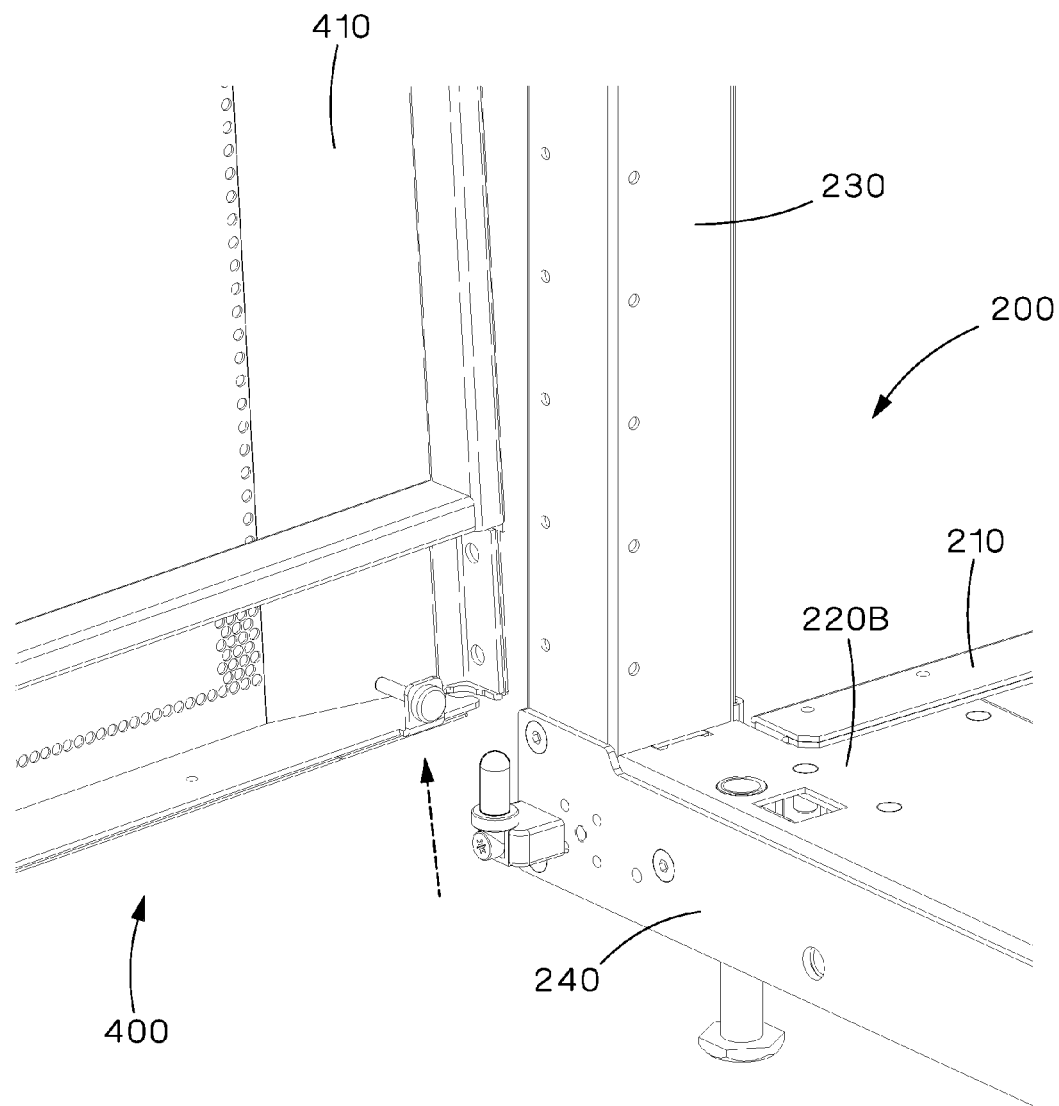
FIG. 37 is an enlarged top front perspective view of detail 37 of FIG. 34.

As shown in FIGS. 32 and 34, front door 400 includes front door panel 410, which is rotatably connected to cabinet frame 200, and more particularly, face plate 240, and ultimately, vertical post 230, and rotates from closed position (FIG. 32) to open position (FIG. 34). Additionally, as shown in FIGS. 36 and 37, front door panel 410 is removably connected to cabinet frame 200, and includes spring-loaded hinge pins 420 for quick and easy installation and removal thereof.

Figure 38:
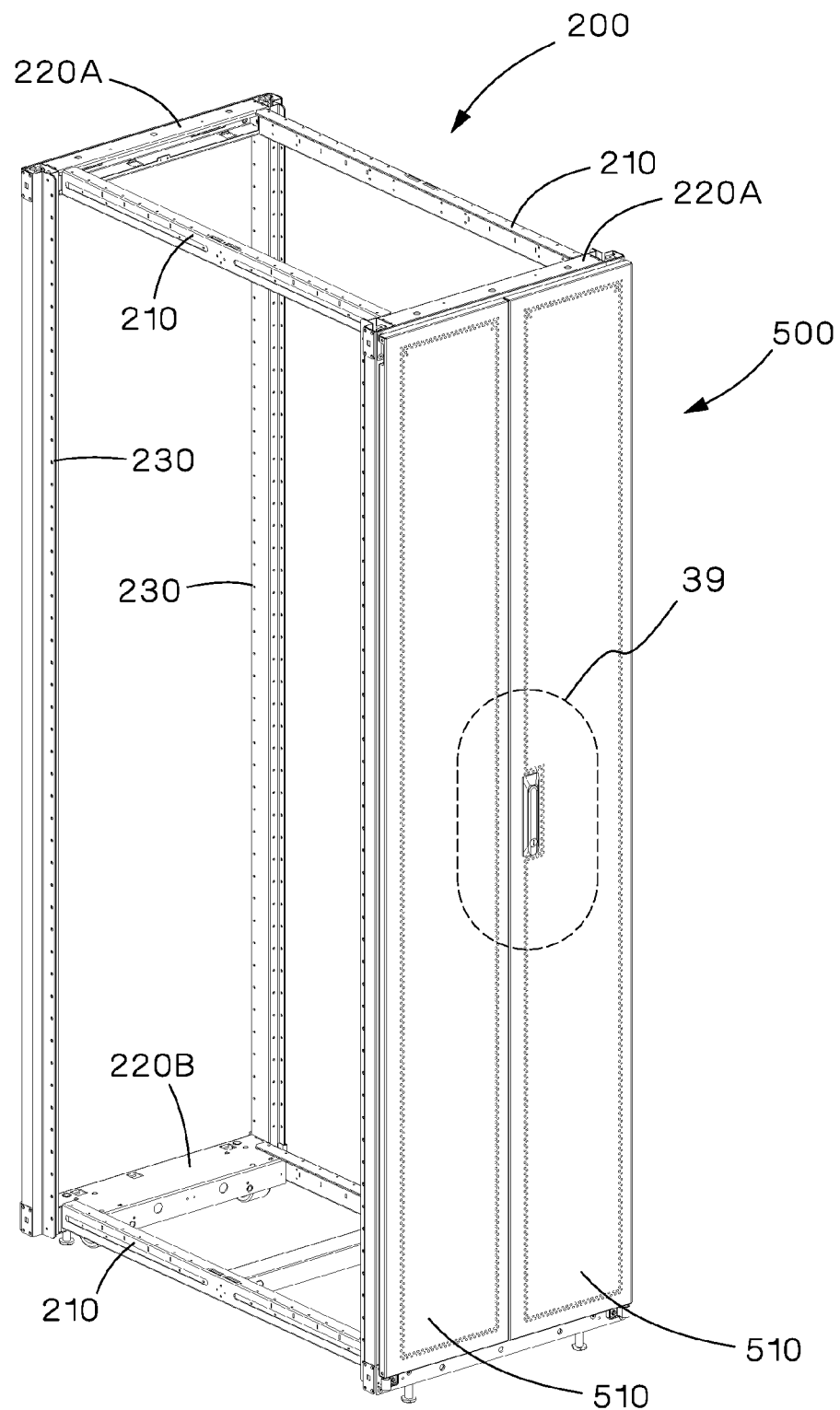
FIG. 38 is a top back perspective view of the cabinet frame of FIG. 4, showing the back door installed and in a closed position.
Figure 39:
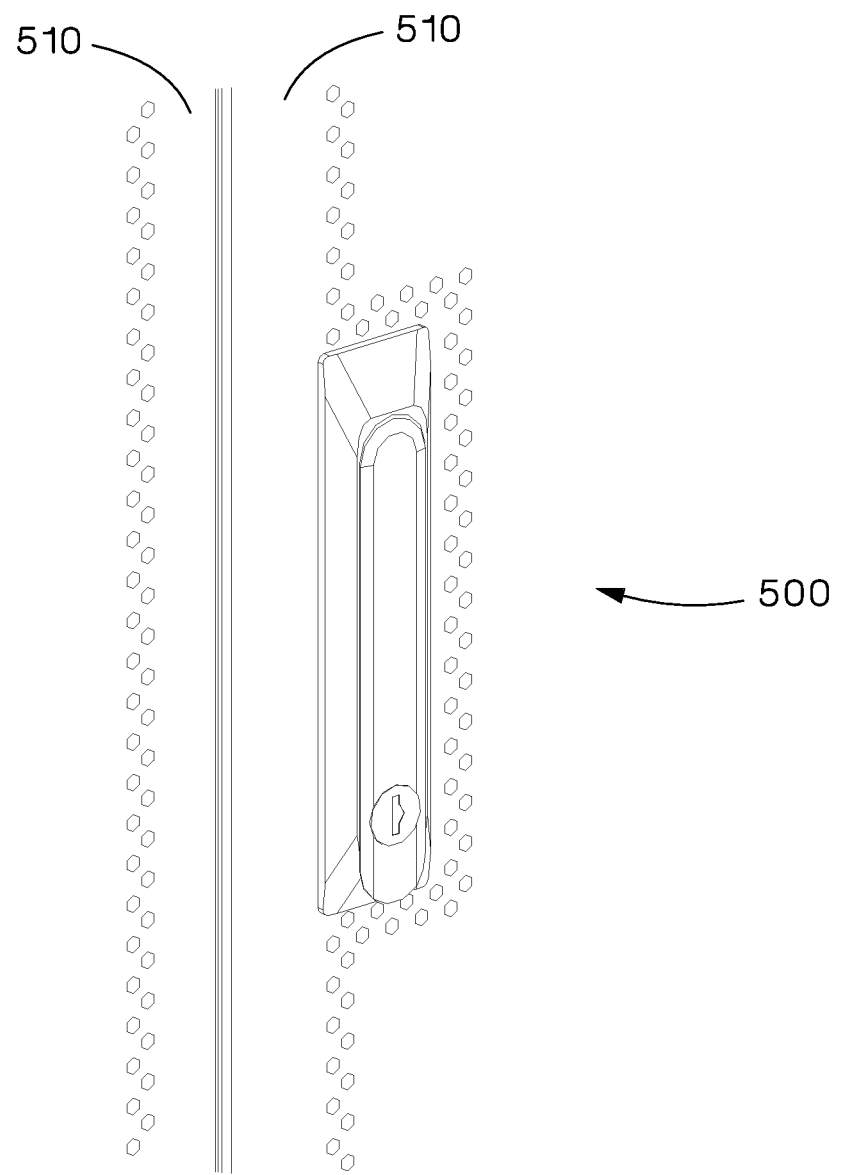
FIG. 39 is an enlarged top back perspective view of detail 39 of FIG. 38.
Figure 40:
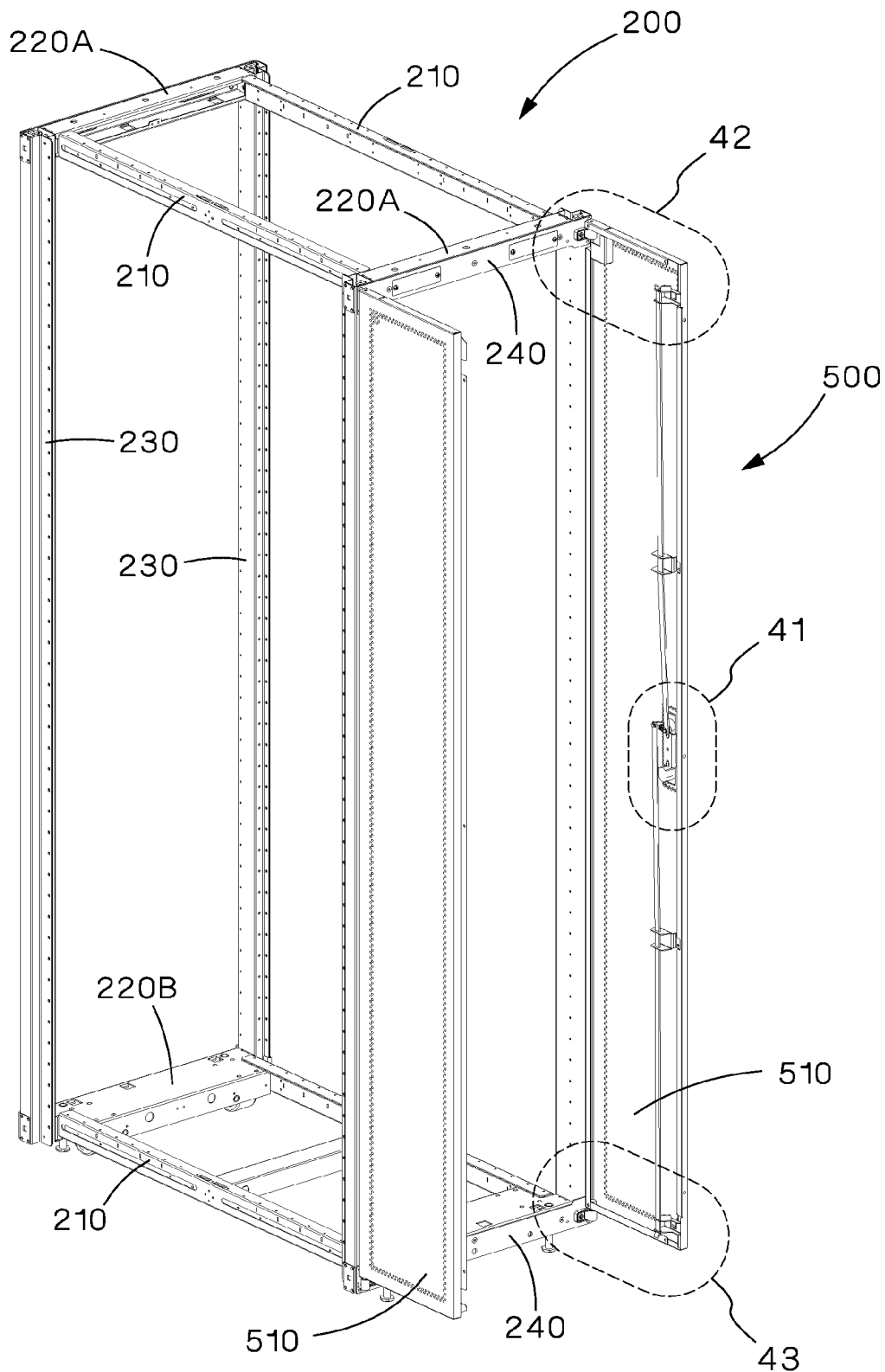
FIG. 40 is a top back perspective view of the cabinet frame of FIG. 38, showing the back door in an open position.
Figure 41:
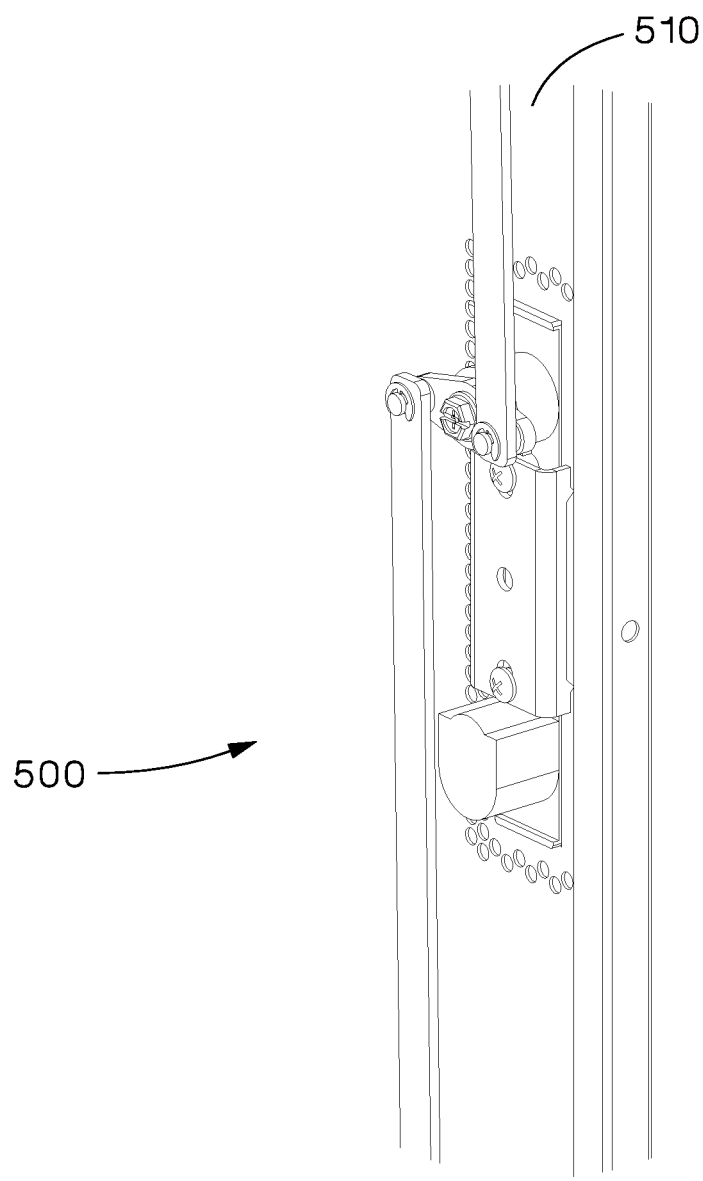
FIG. 41 is an enlarged top back perspective view of detail 41 of FIG. 40.
Figure 42:
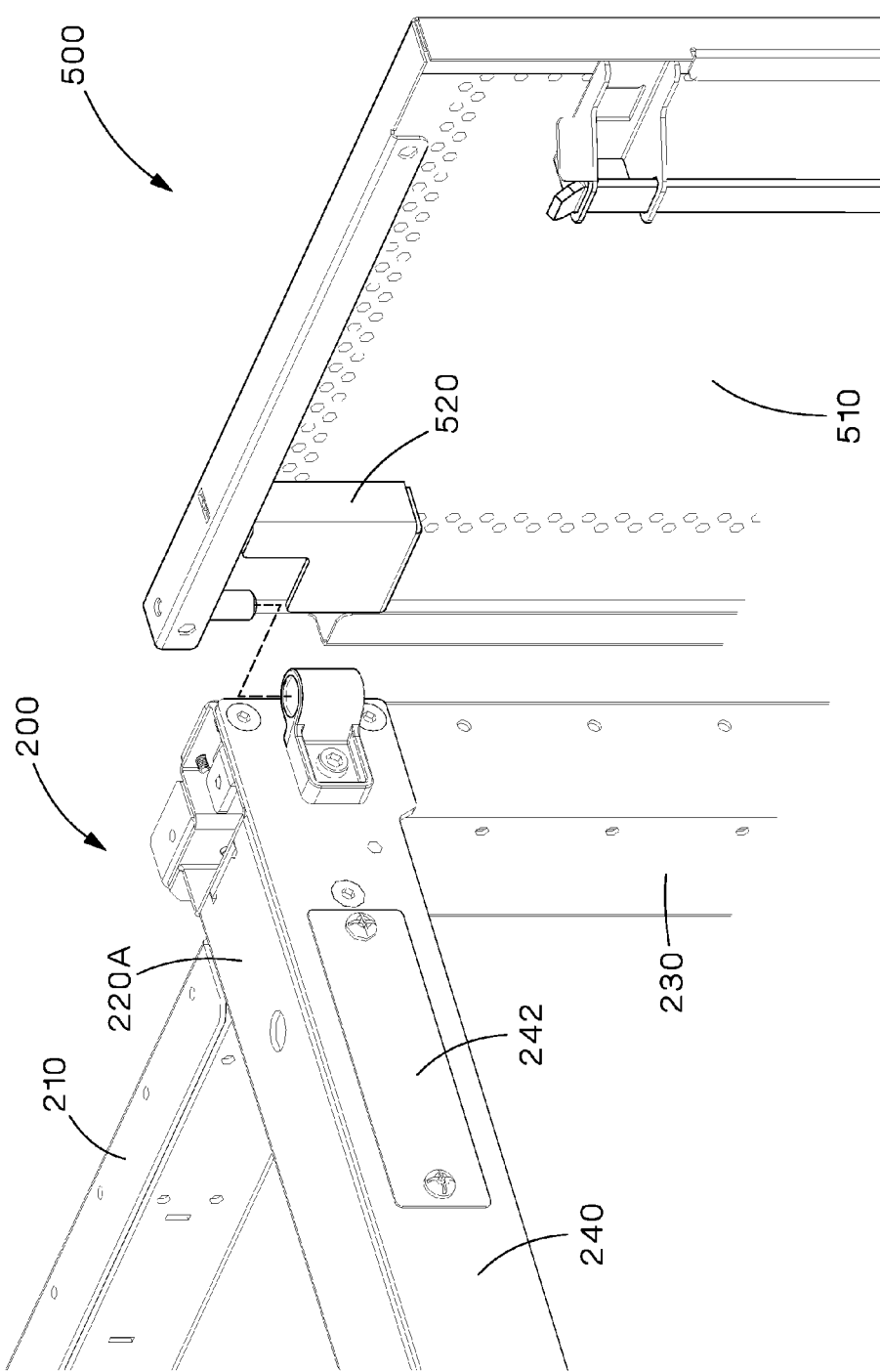
FIG. 42 is an enlarged top back perspective view of detail 42 of FIG. 40.
Figure 43:
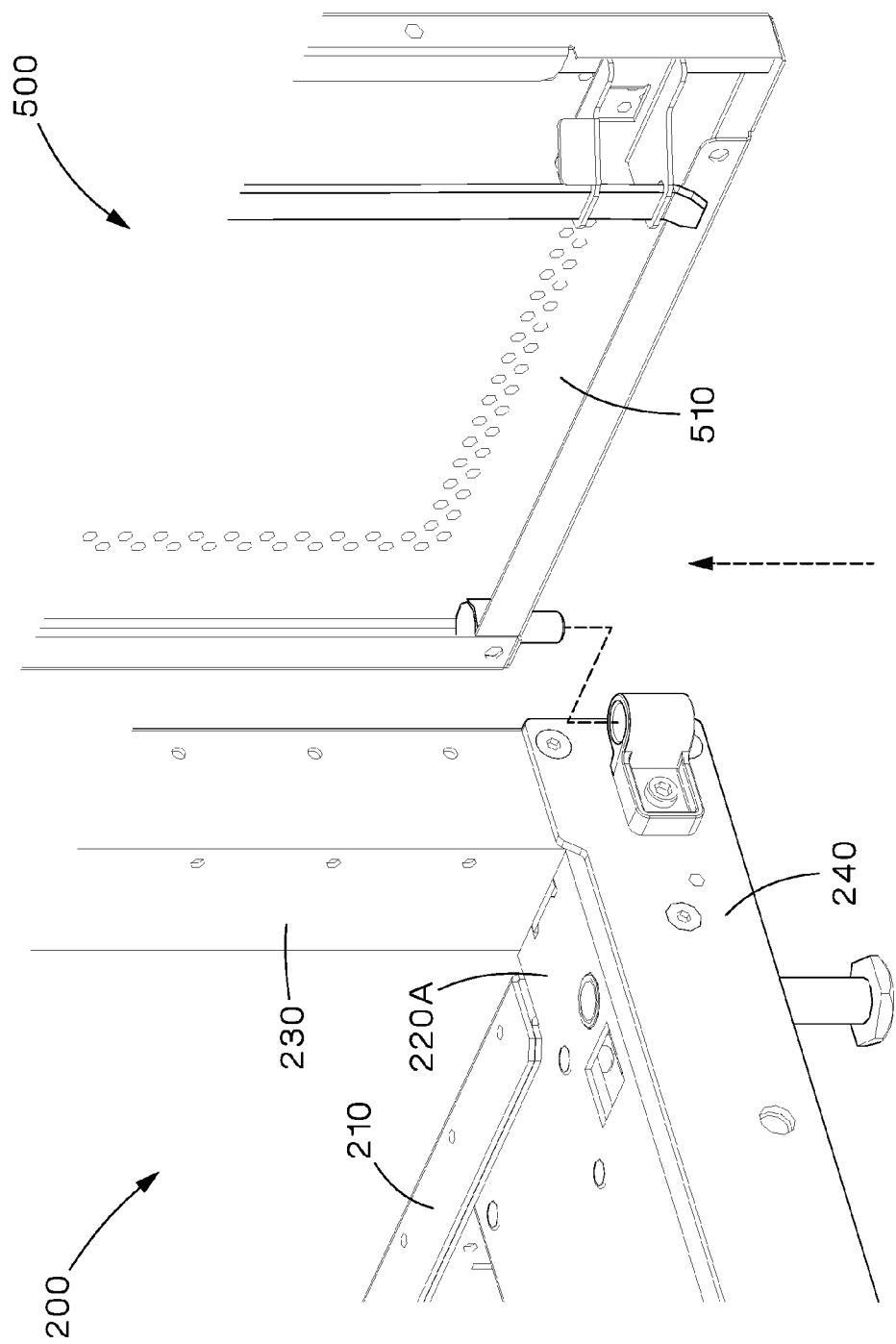
FIG. 43 is an enlarged top back perspective view of detail 43 of FIG. 40.

As shown in FIGS. 38 and 40, back door 500 includes back door panels 510, which are rotatably connected to cabinet frame 200, and more particularly, face plate 240, and ultimately, vertical post 230, and rotate from closed position (FIG. 38) to open position (FIG. 40). Additionally, as shown in FIGS. 42 and 43, back door panels 510 are removably connected to cabinet frame 200, and include flanges 520 to prevent removal of back door panels 510 when open.

Figure 44:
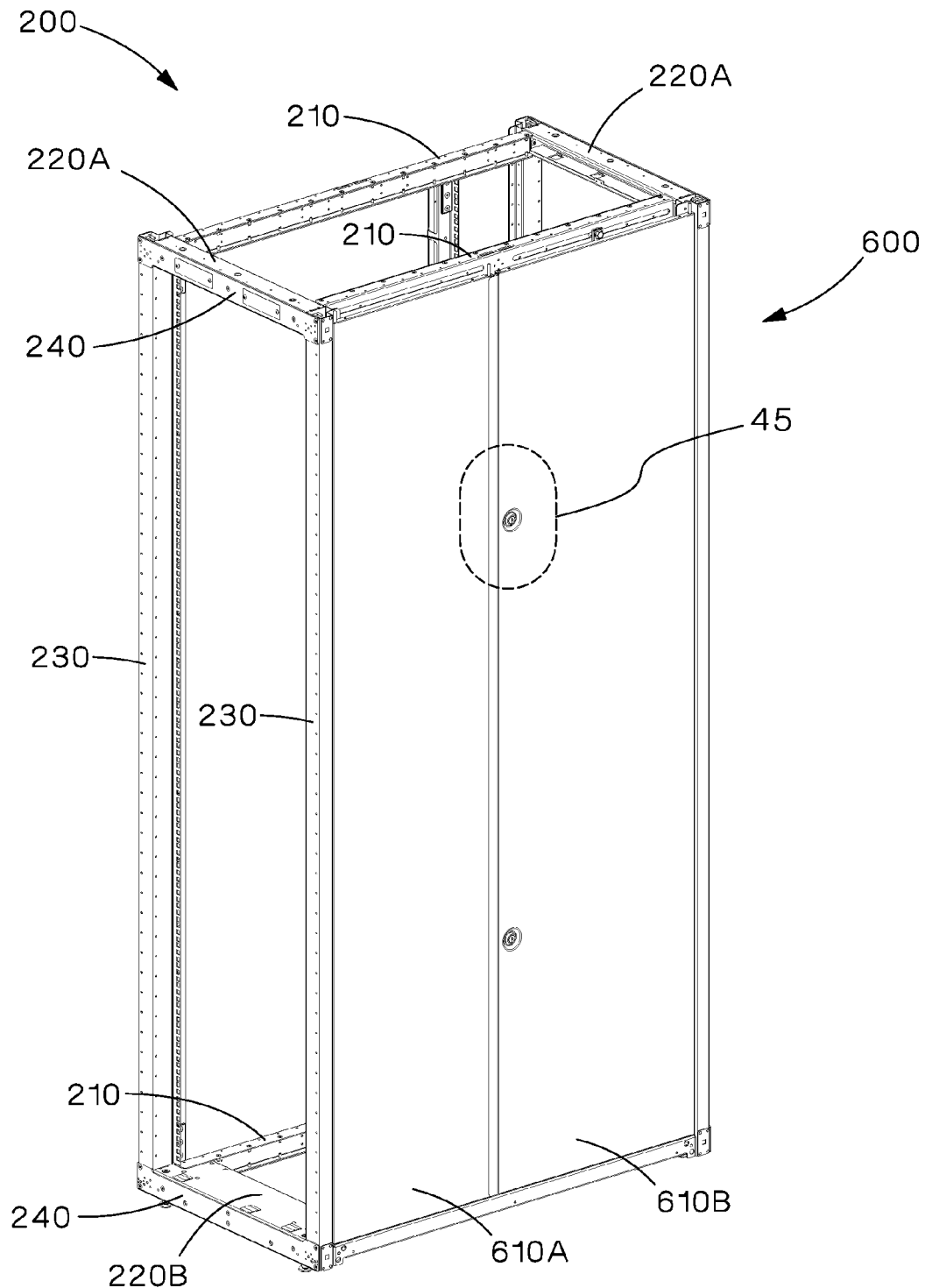
FIG. 44 is a top front perspective view of the cabinet frame of FIG. 4, showing the side door installed and in a closed position.
Figure 45:
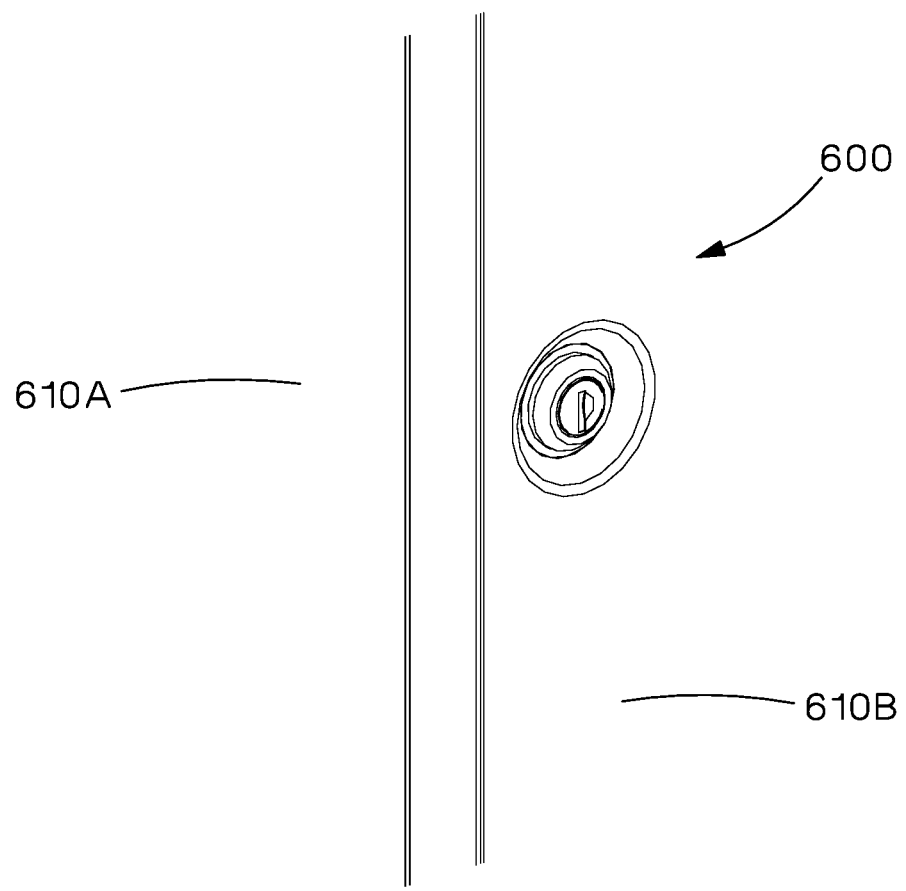
FIG. 45 is an enlarged top front perspective view of detail 45 of FIG. 44.
Figure 46:
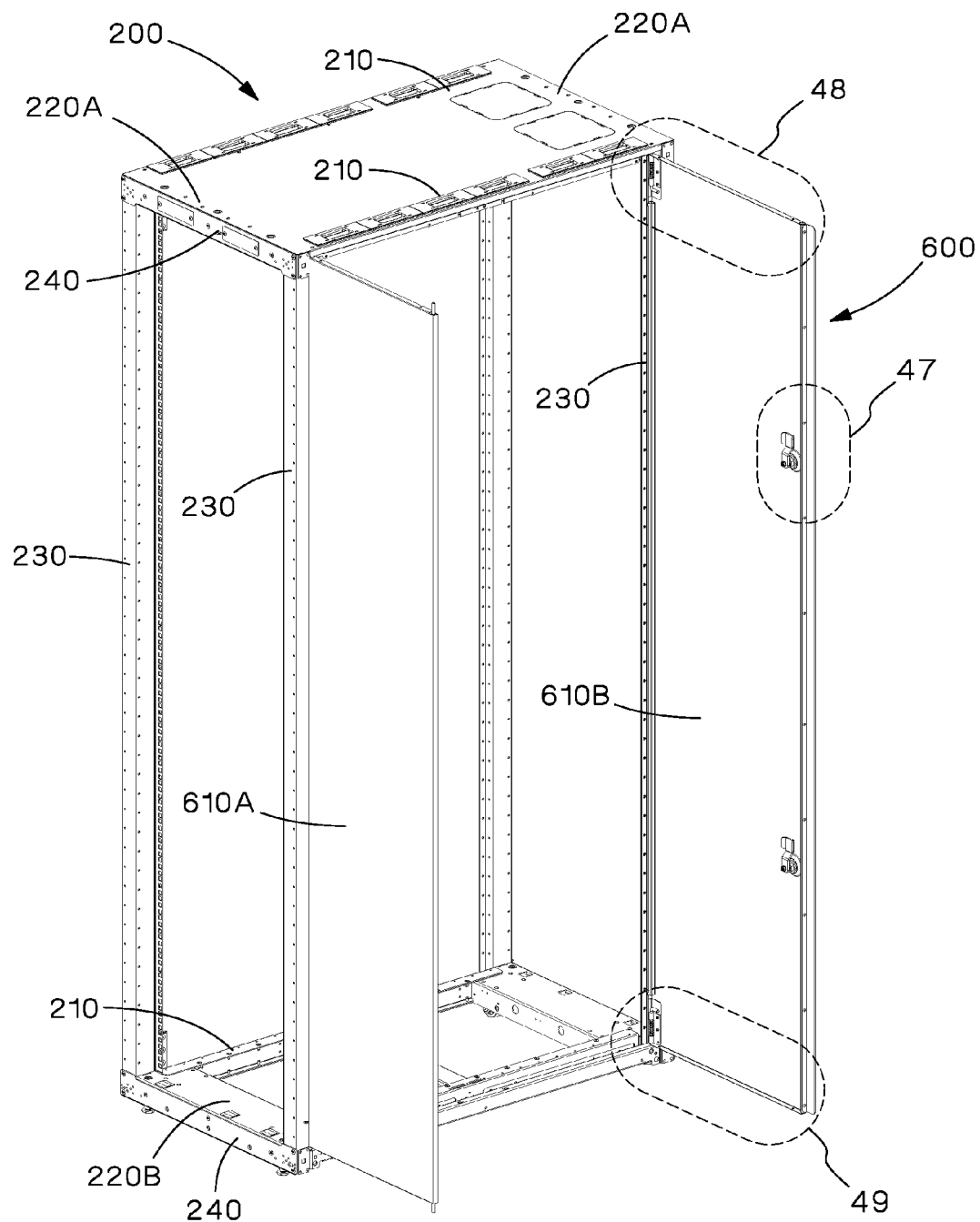
FIG. 46 is a top front perspective view of the cabinet frame of FIG. 44, showing the side door in an open position.
Figure 47:
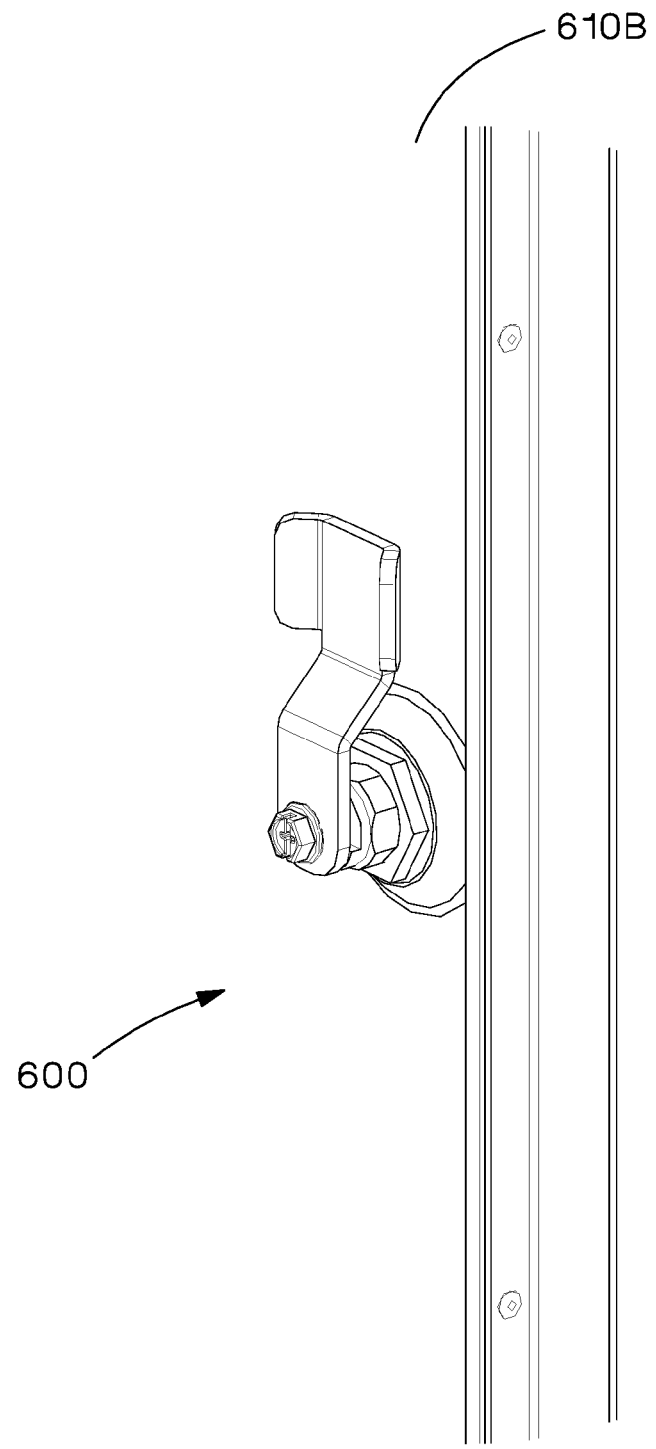
FIG. 47 is an enlarged top front perspective view of detail 47 of FIG. 46.
Figure 48:
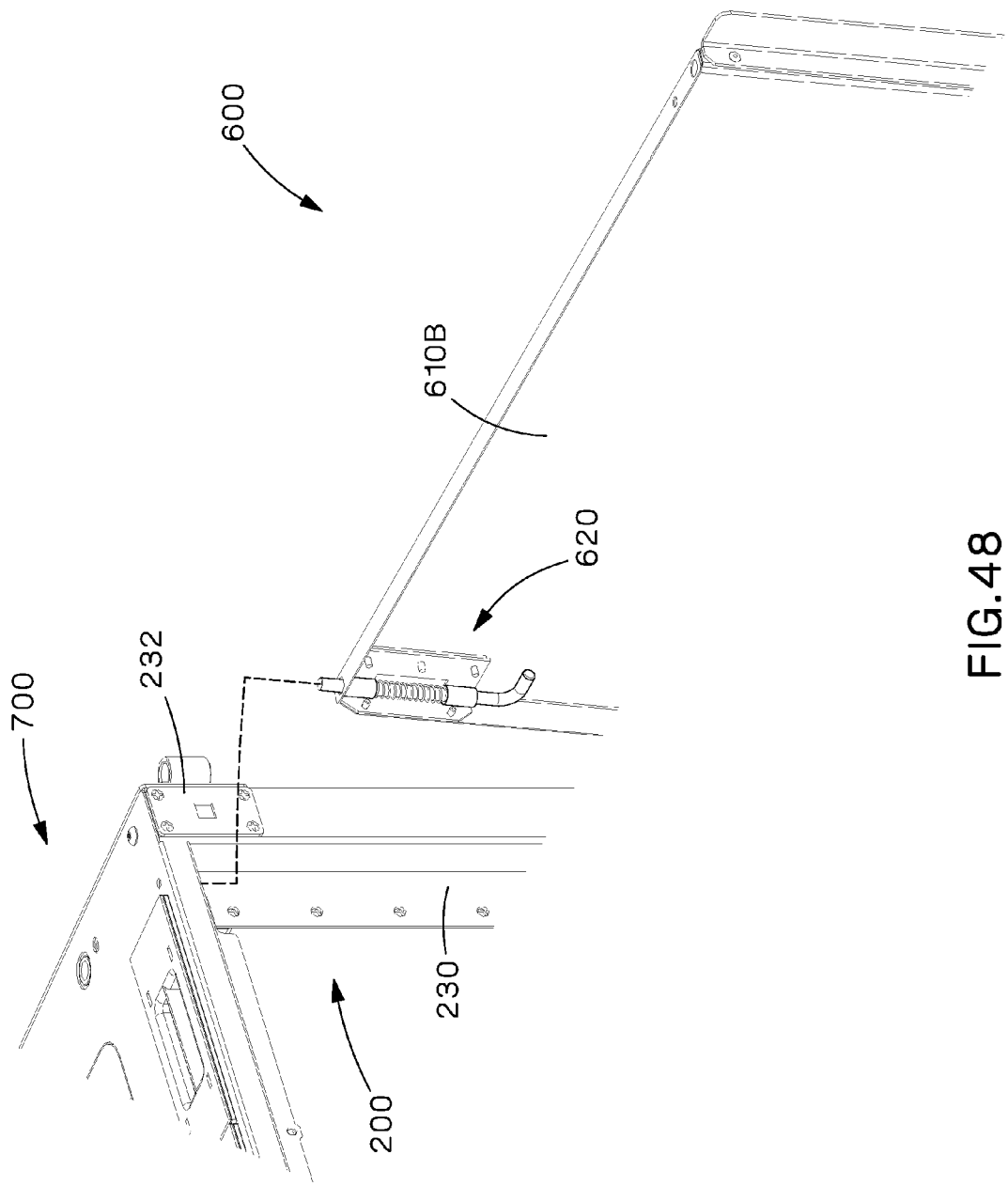
FIG. 48 is an enlarged top front perspective view of detail 48 of FIG. 46.
Figure 49:
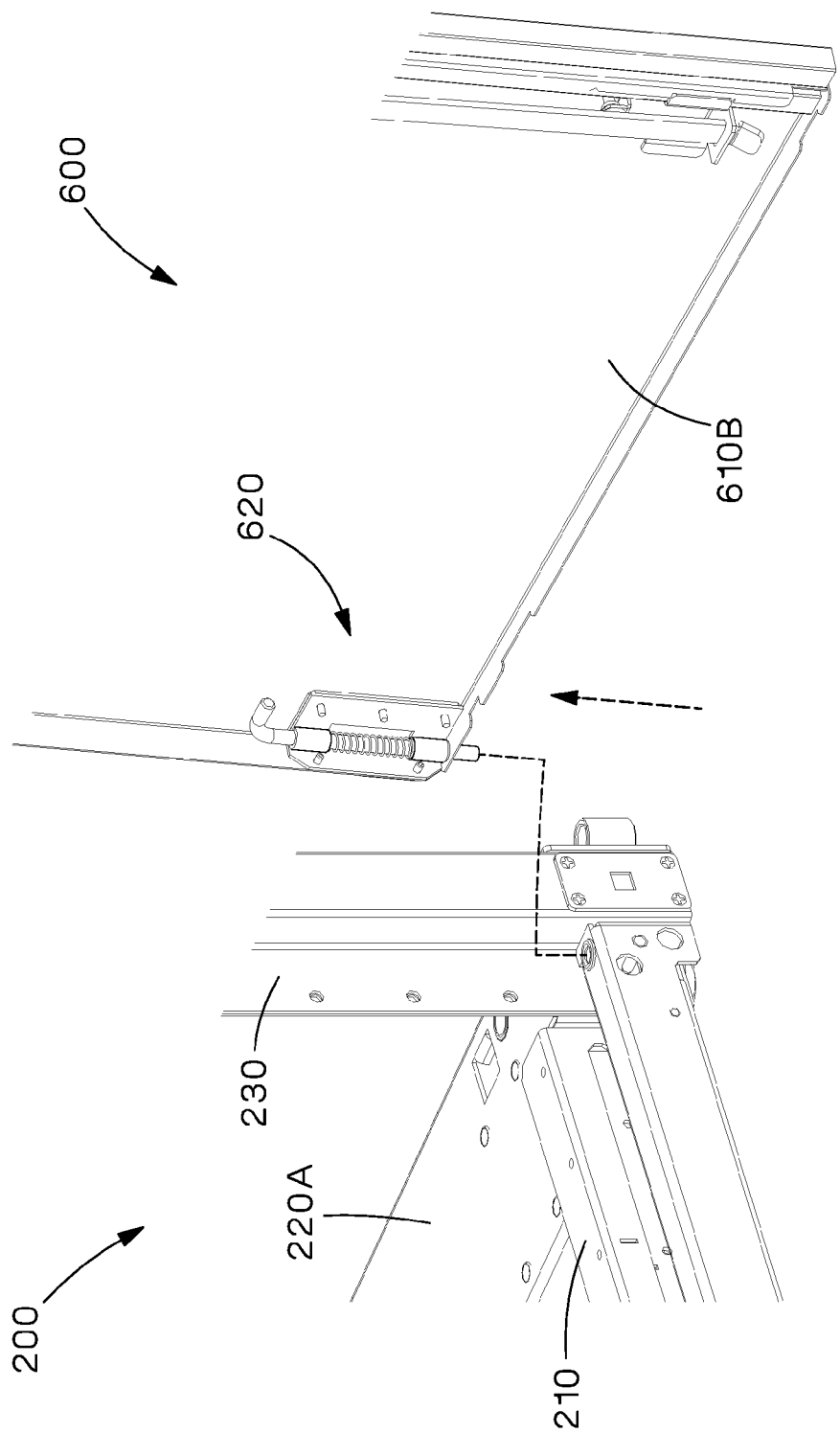
FIG. 49 is an enlarged top front perspective view of detail 49 of FIG. 46.
Figure 50:
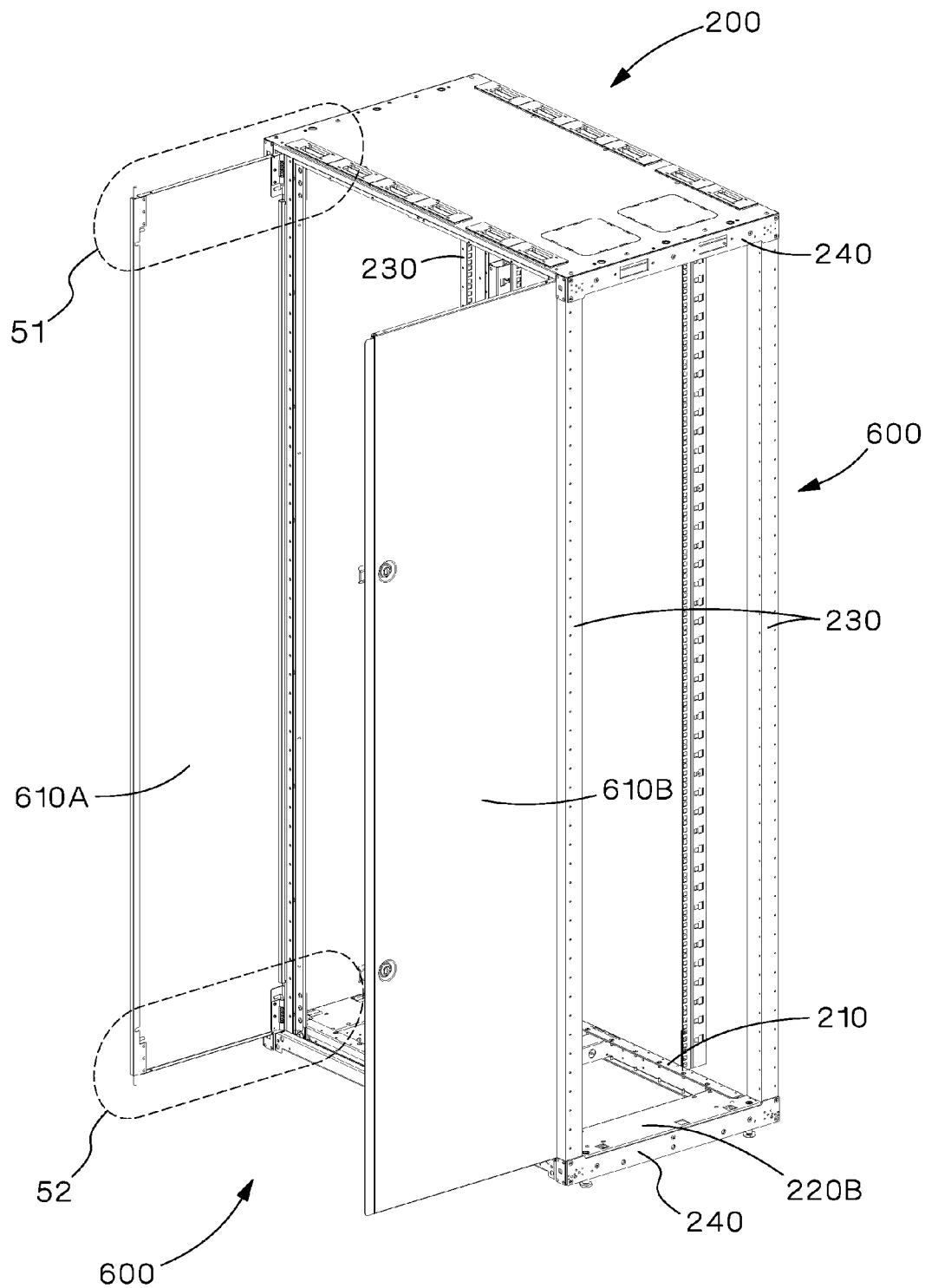
FIG. 50 is a top back perspective view of the cabinet frame of FIG. 44, showing the side door in an open position.
Figure 51:
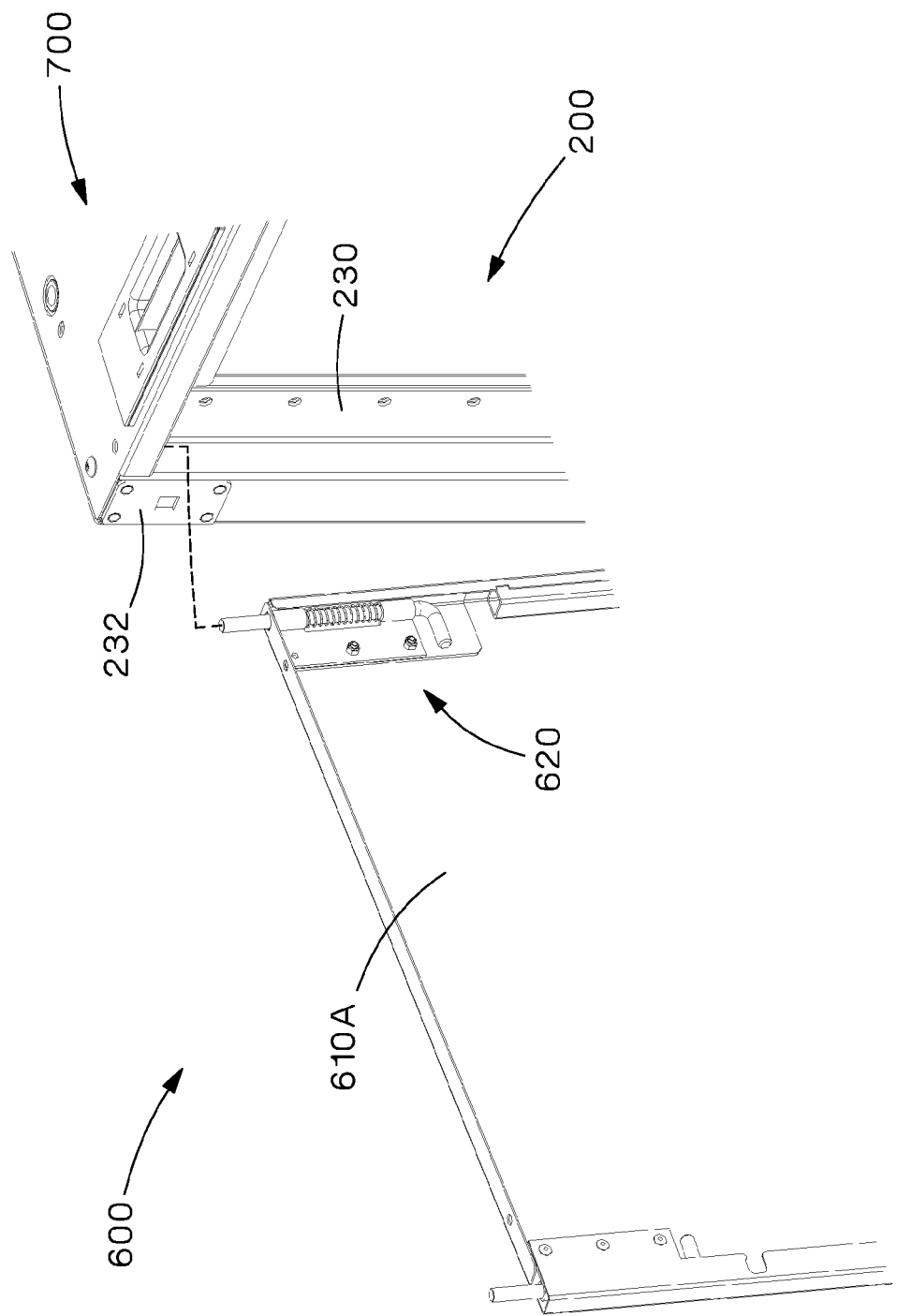
FIG. 51 is an enlarged top back perspective view of detail 51 of FIG. 50.
Figure 52:
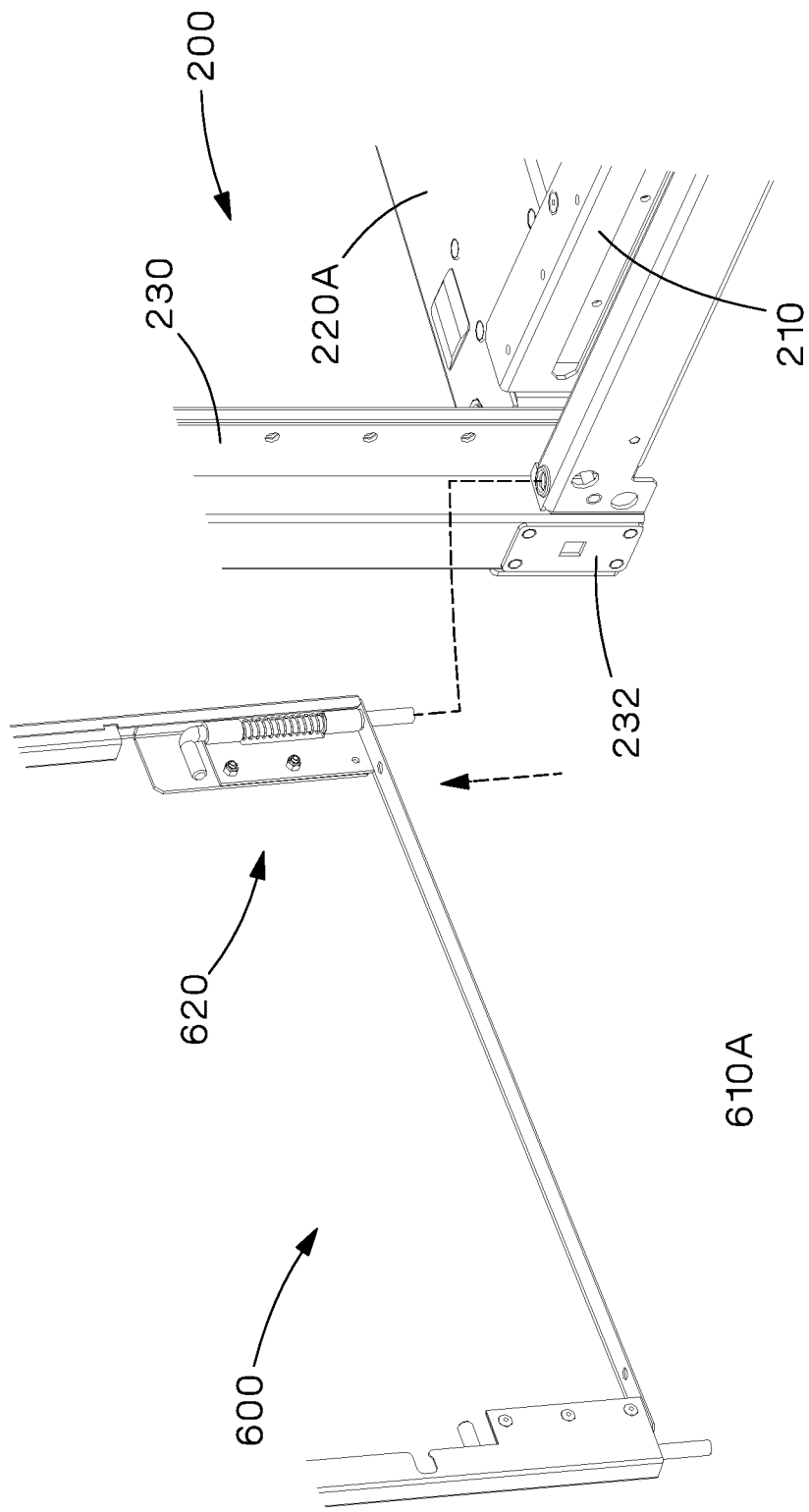
FIG. 52 is an enlarged top back perspective view of detail 52 of FIG. 50.

As shown in FIGS. 44, 46, and 50, side door 600 includes side door panels 610A, 610B, which are rotatably connected to cabinet frame 200, and more particularly, vertical posts 230, as well as top cap 700, and rotate from closed position (FIG. 46) to open position (FIGS. 46 and 50). Additionally, as shown in FIGS. 48, 49, 51, and 52, side door panels 610A, 610B are removably connected to cabinet frame 200, as well as top cap 700, and include spring-loaded hinge pins 620 for quick and easy installation and removal thereof.

Figure 53:
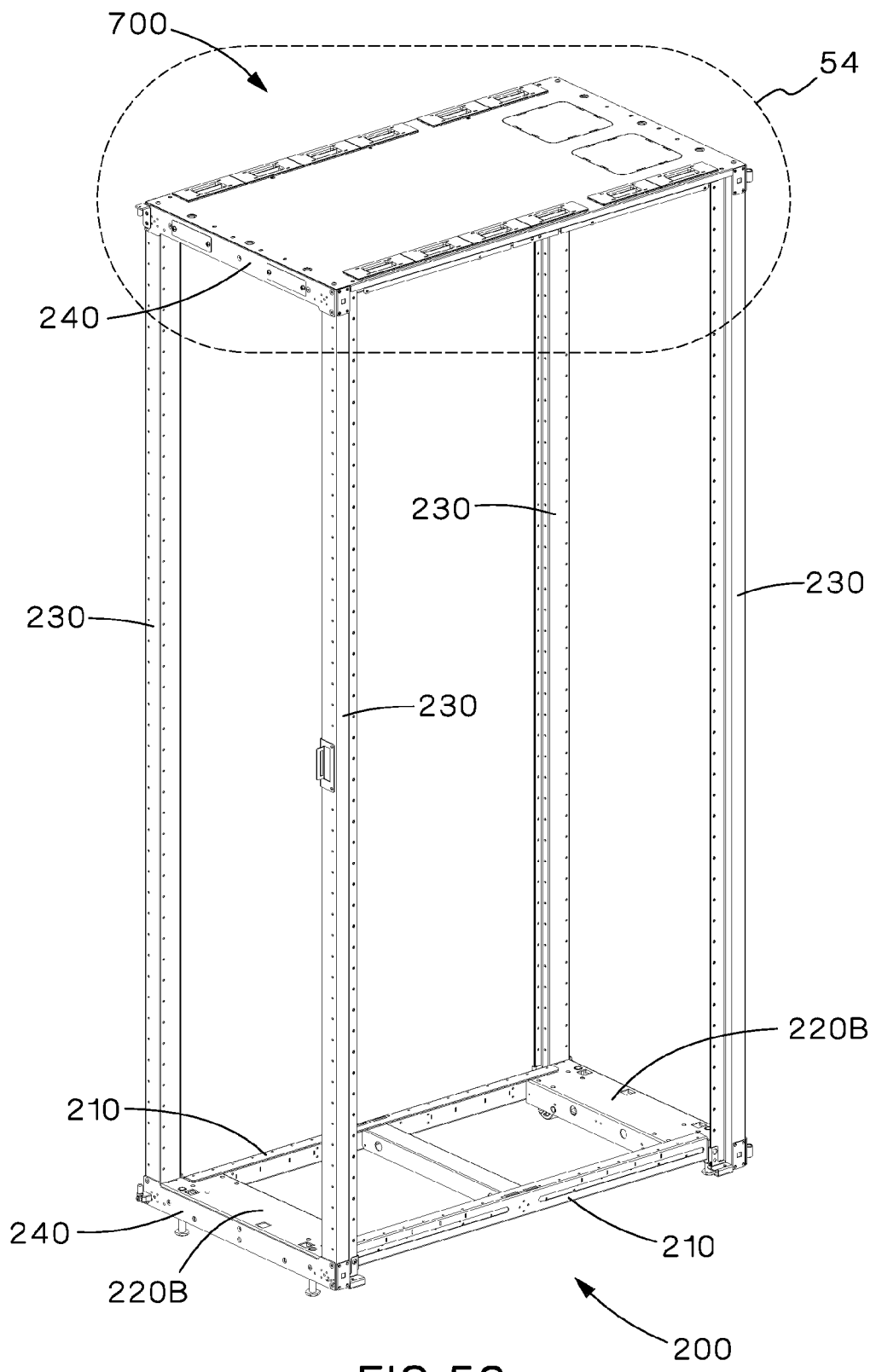
FIG. 53 is top front perspective view of the cabinet frame of FIG. 4, showing the top cap installed.
Figure 54:
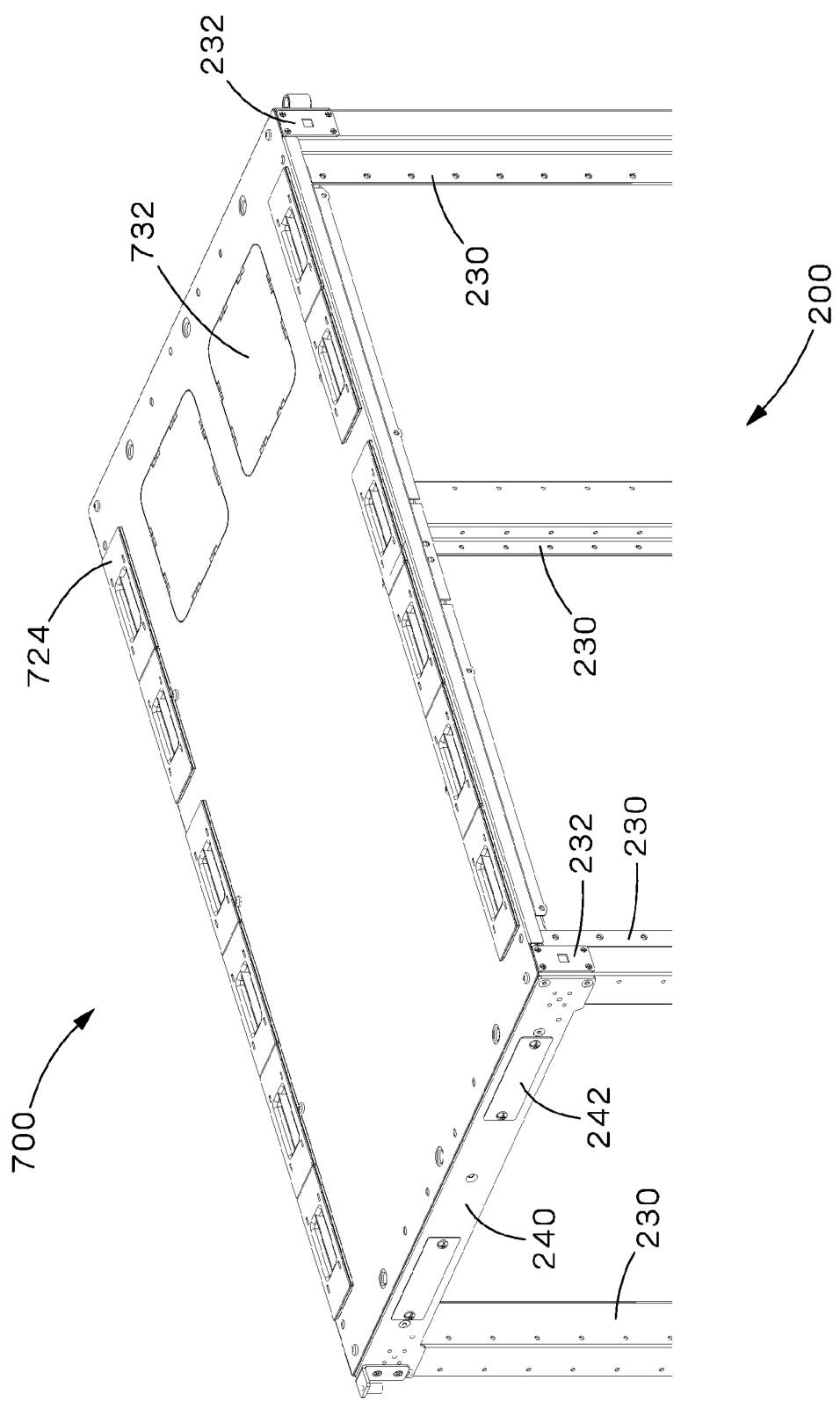
FIG. 54 is an enlarged top front perspective view of detail 54 of FIG. 53.
Figure 55:
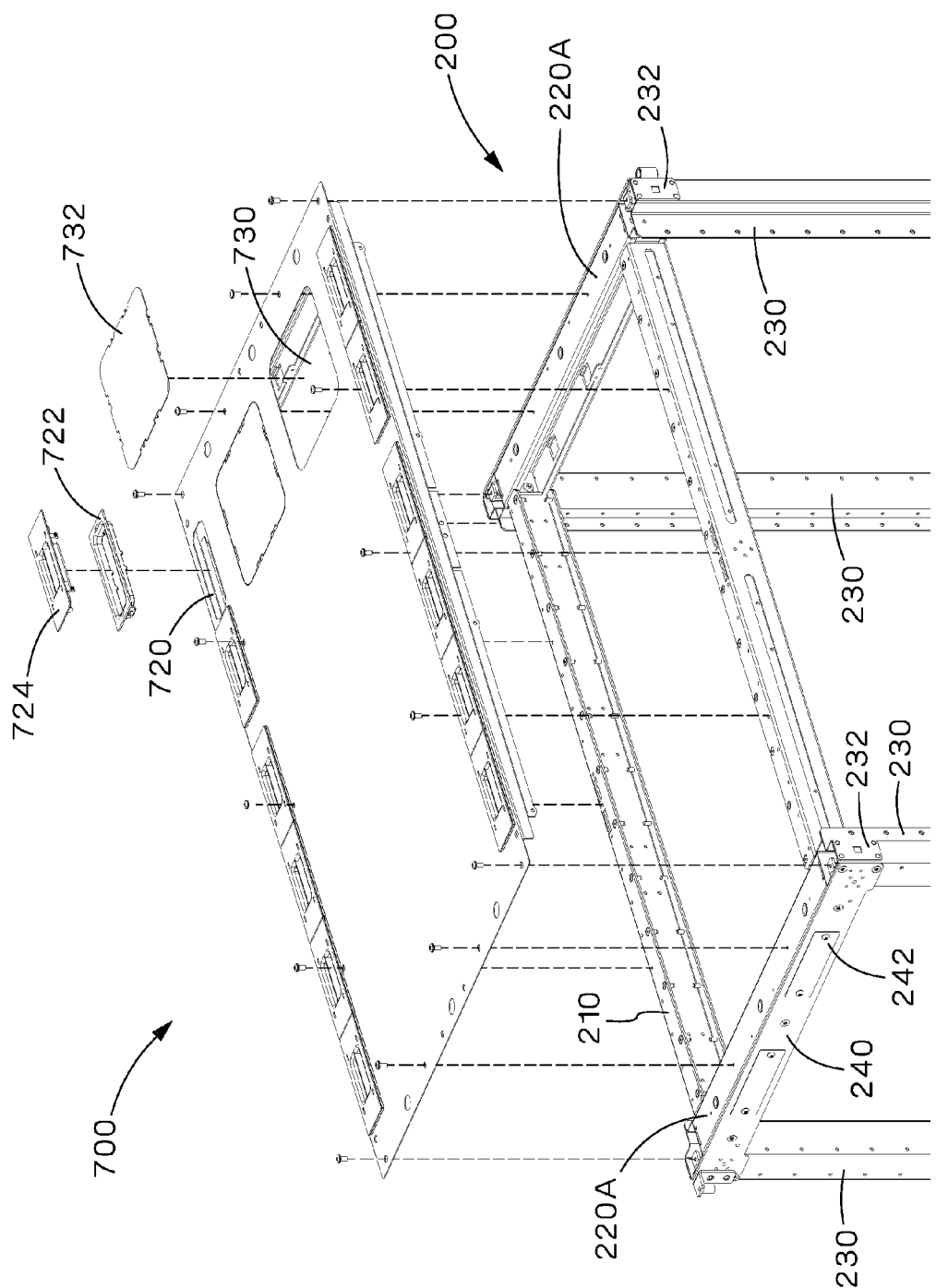
FIG. 55 is a partially exploded top front perspective view of FIG. 54.
Figure 56:
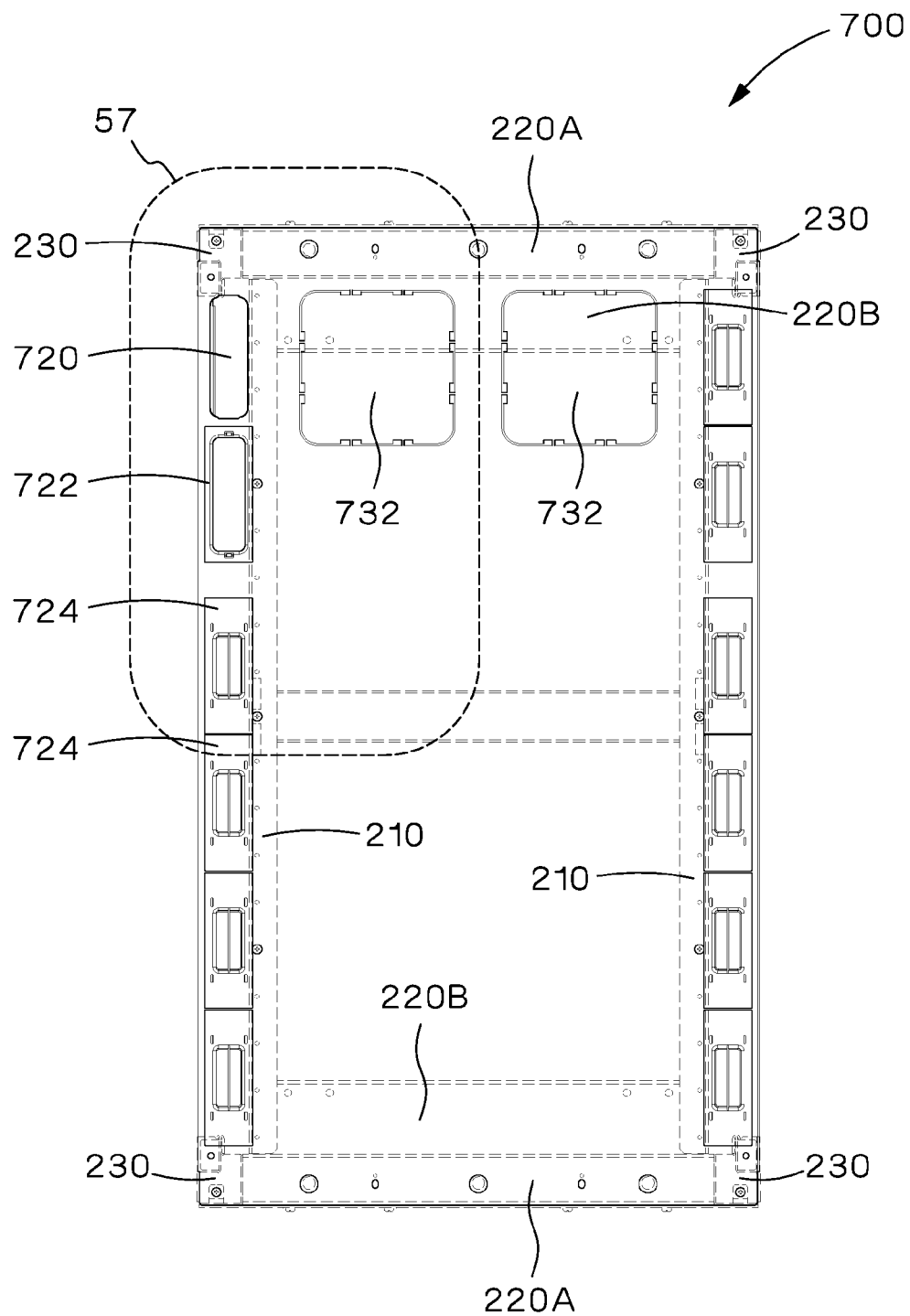
FIG. 56 is a top view of the top cap of FIG. 53, showing the cabinet frame below it in hidden lines.
Figure 57:
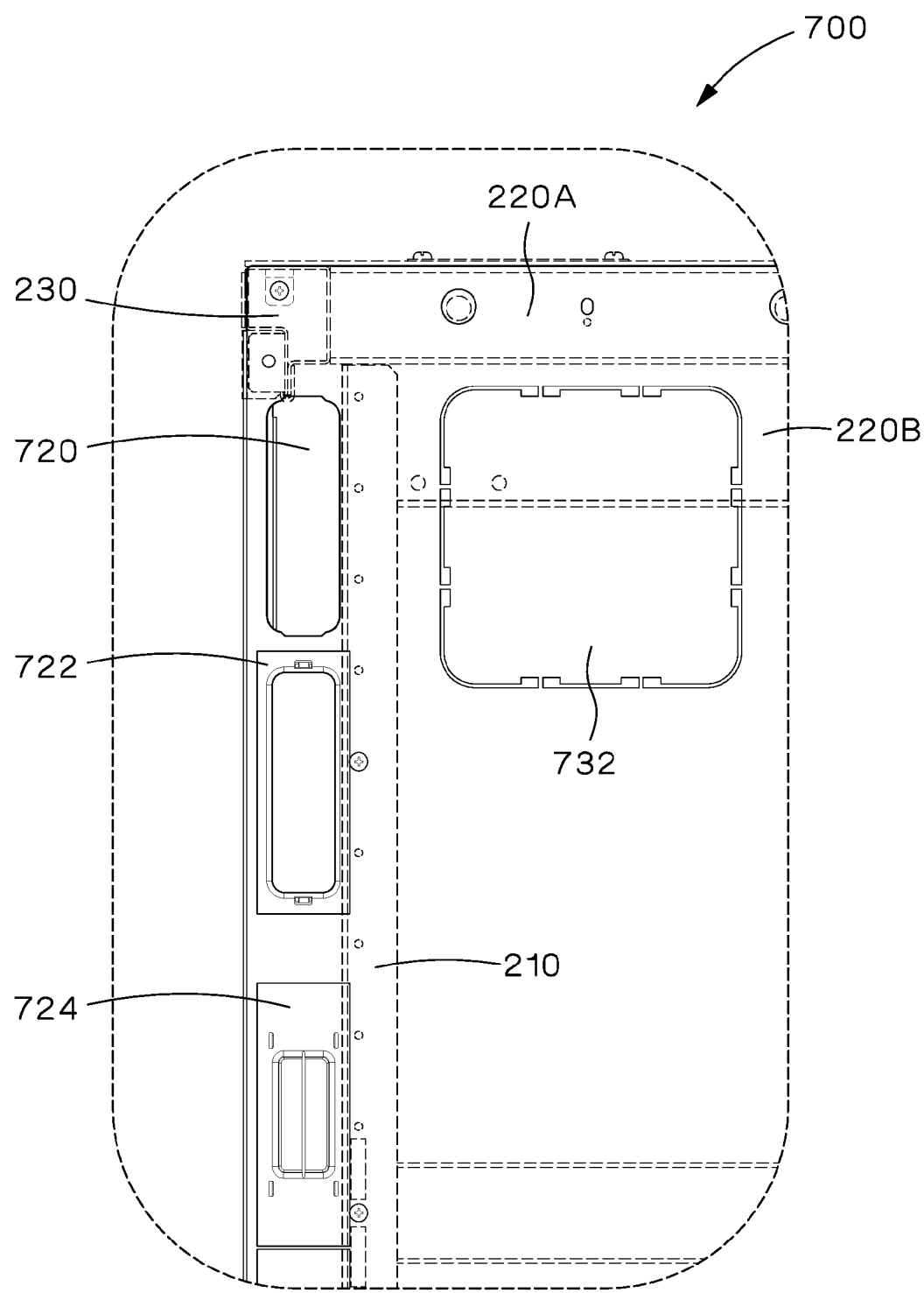
FIG. 57 is an enlarged top view of detail 57 of FIG. 56.
Figure 58:
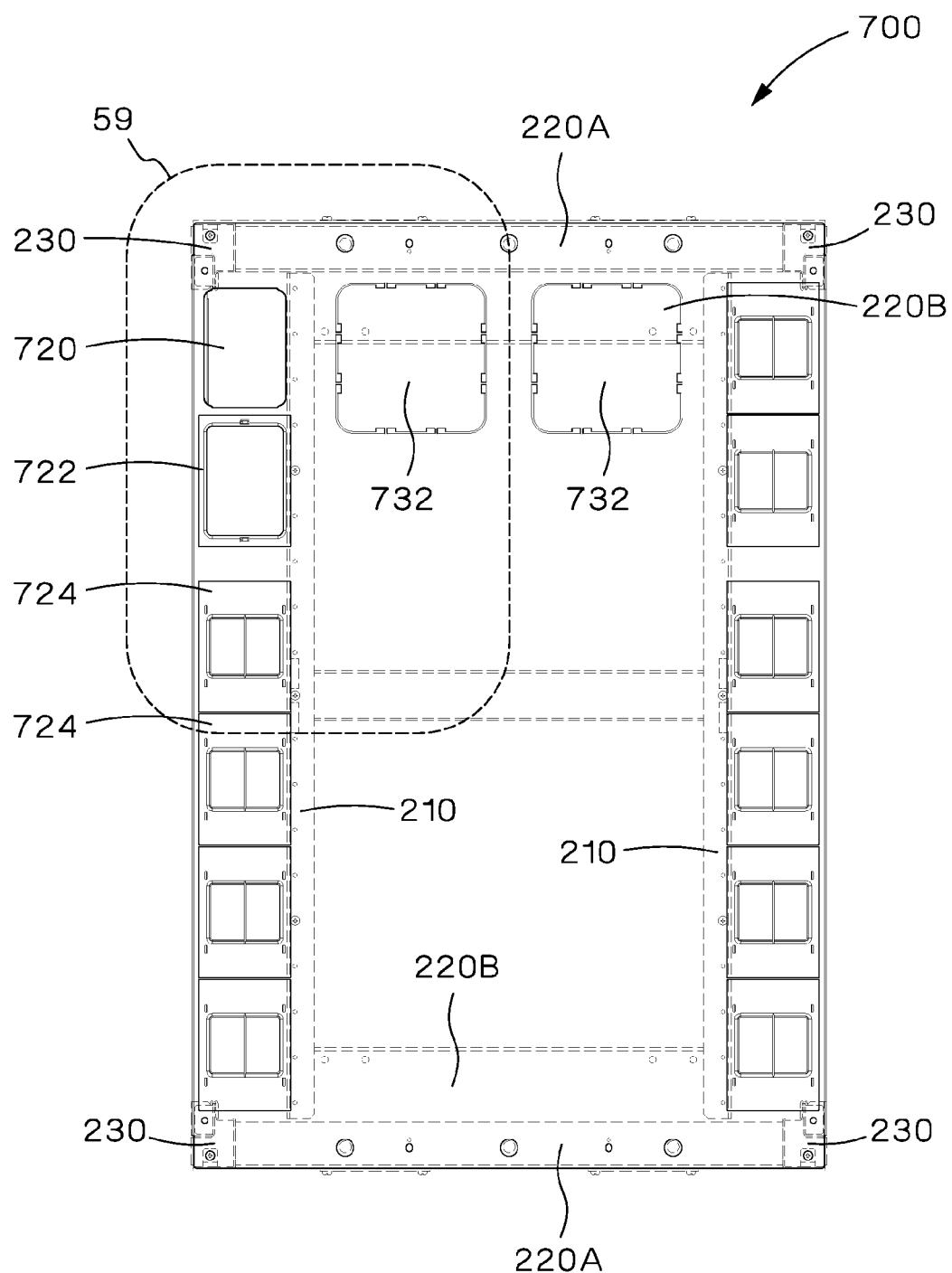
FIG. 58 is a top view of a top cap for a cabinet frame having a width (e.g., 700 mm) greater than the width (e.g., 600 mm) of the cabinet frame of FIG. 53, showing the wider cabinet frame below it in hidden lines and some of the grommets partially or fully removed.
Figure 59:
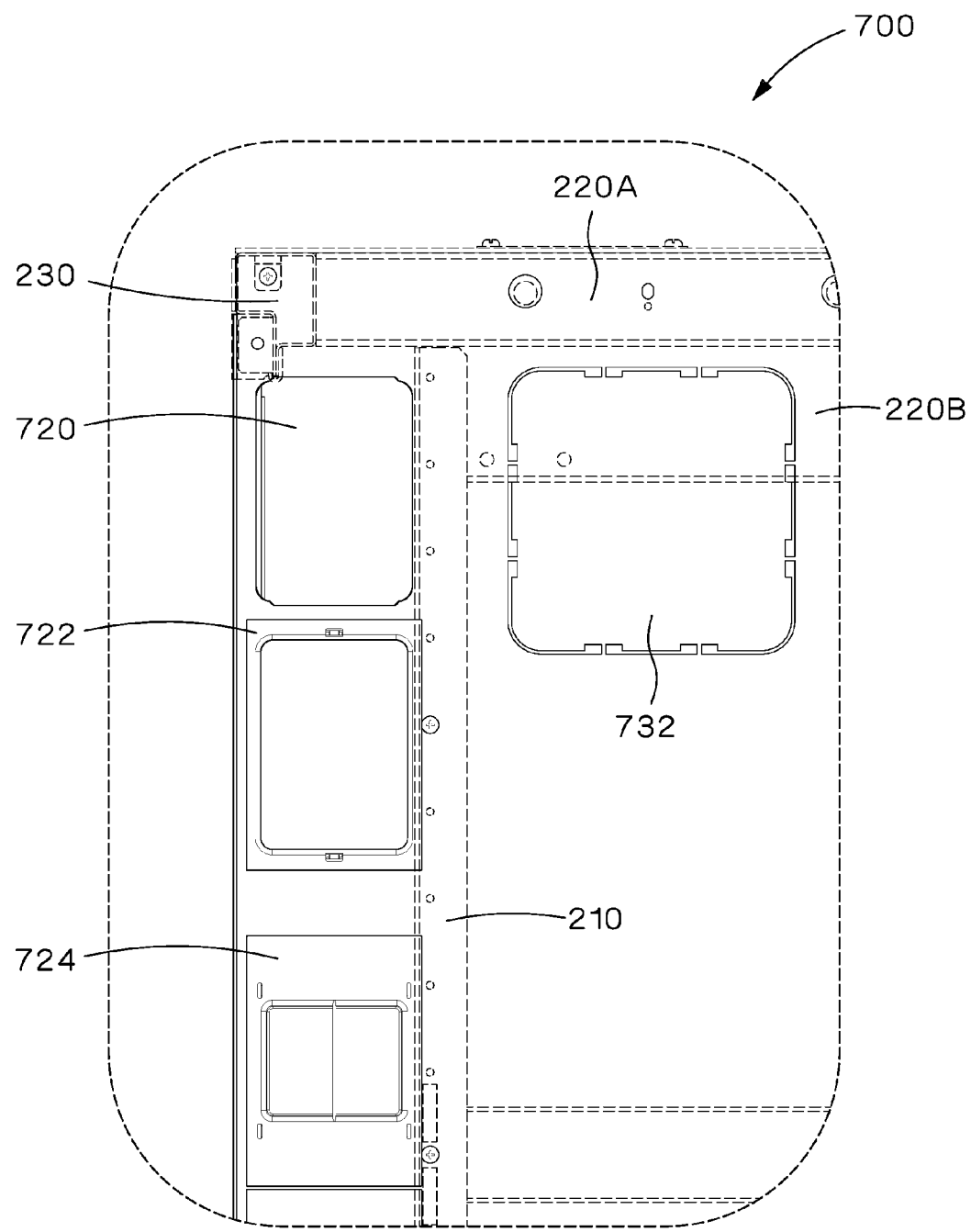
FIG. 59 is an enlarged top view of detail 59 of FIG. 58.
Figure 60:
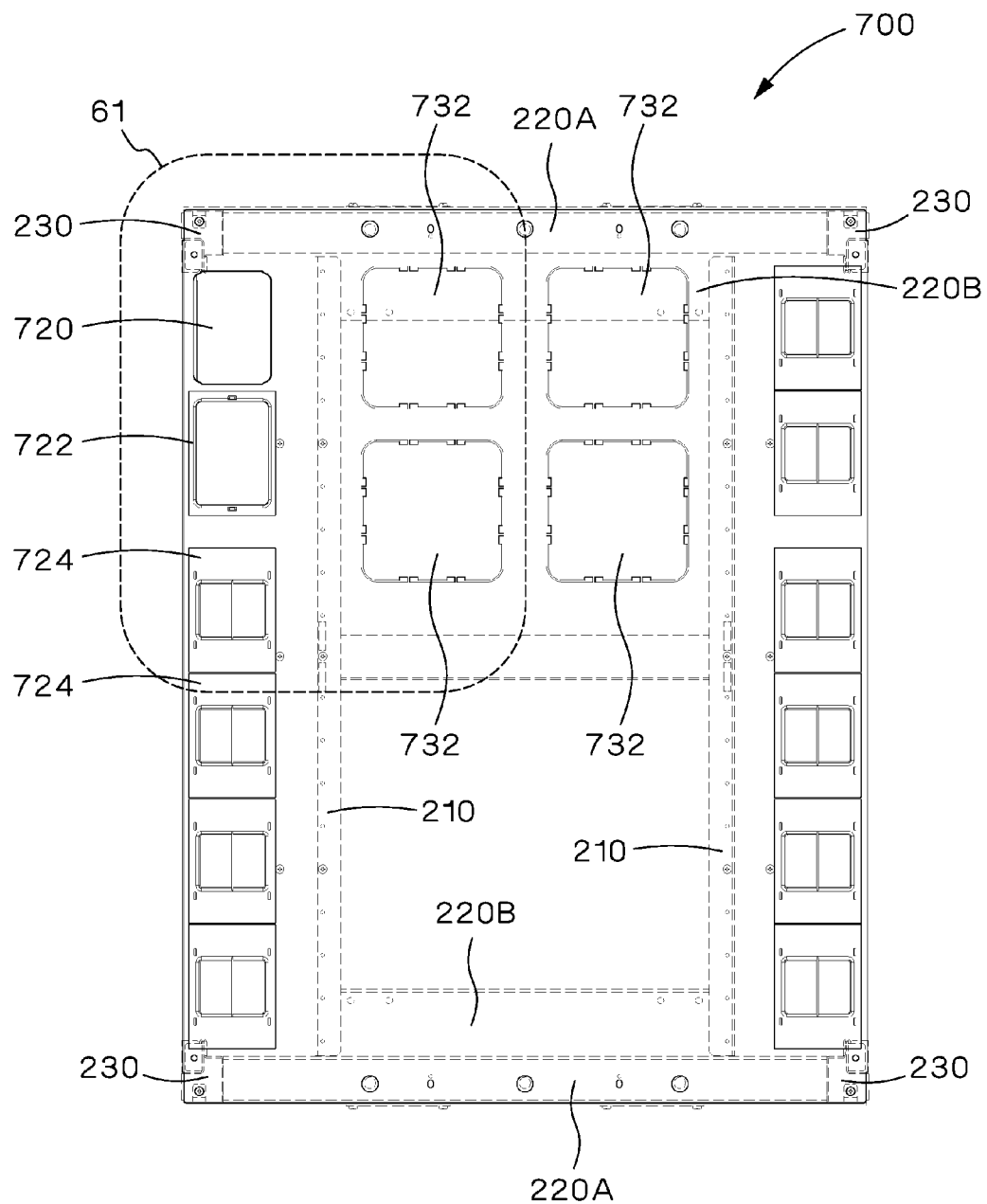
FIG. 60 is a top view of a top cap for a cabinet frame having a width (e.g., 800 mm) greater than the width (e.g., 600 mm) of the cabinet frame of FIG. 58, showing the wider cabinet frame below it in hidden lines and some of the grommets partially or fully removed.
Figure 61:
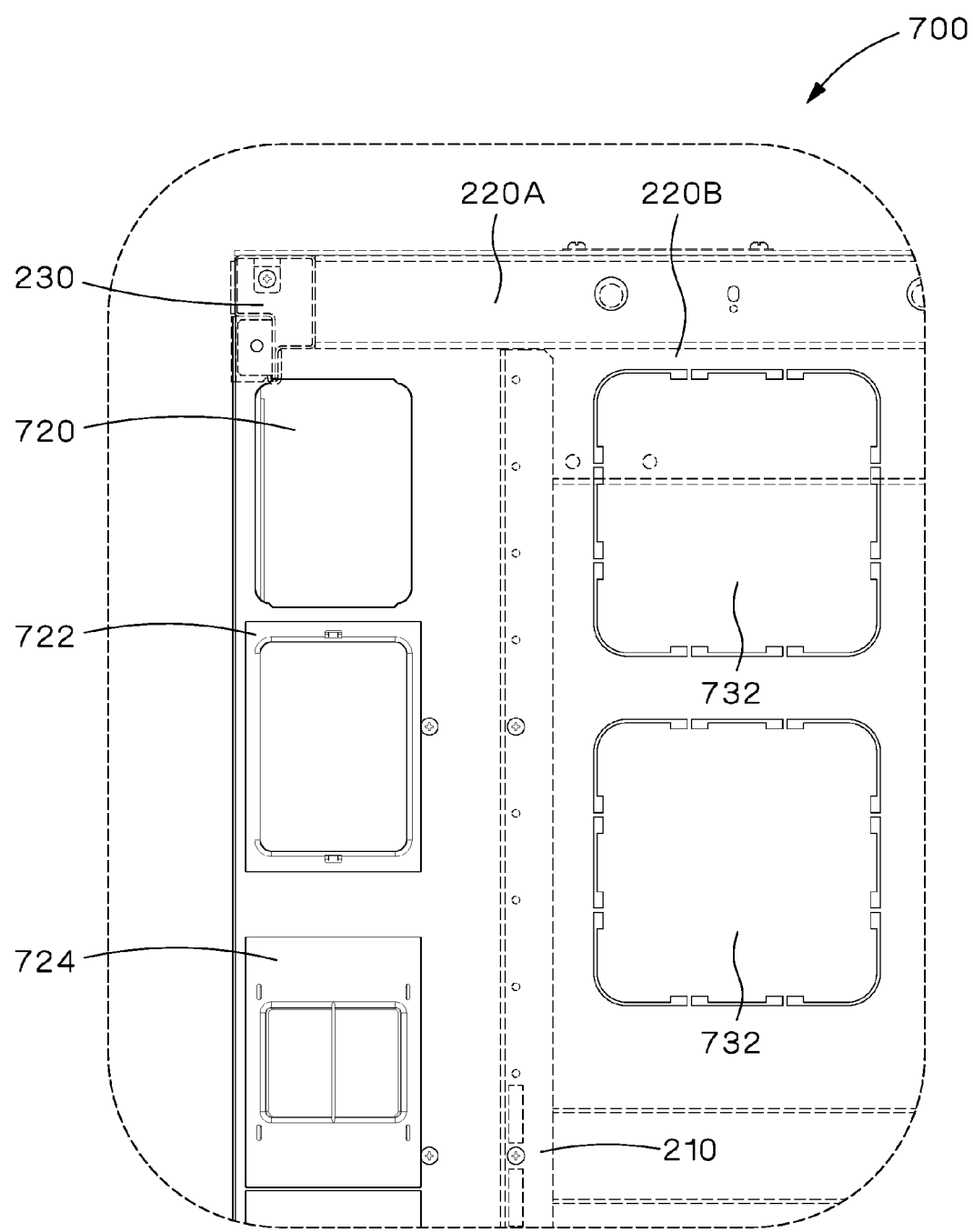
FIG. 61 is an enlarged top view of detail 61 of FIG. 60.

As shown in FIGS. 53-55, top cap 700 is removably connected to cabinet frame 200, and more particularly, front-to-back beams 210 and side-to-side beams 220A of top frame 250A and vertical posts 230, for example, using removable connectors, such as nuts and bolts and screws, and includes data cable openings 720, for example, fitted with grommets 722 and grommet covers 724, disposed above the sides of sever cabinet 100, and more particularly, cable-routing areas 280, and power cable openings 730, for example, fitted with knock-outs 732, disposed above the back of electronics cabinet 100.

As the width of electronics cabinet 100 is increased, for example, from 600 mm (FIGS. 56 and 57) to 700 mm (FIGS. 58 and 59) and 800 mm (FIGS. 60 and 61), the width of data cable opening 720 is increased, for example, to accommodate the additional width of cable-routing area 280.

In certain embodiments of the present invention, sensors (not shown), such as door position sensors and environmental sensors (e.g., temperature, humidity, etc.) are mounted on cabinet frame 200, for example, in openings 224, 244.

In certain embodiments of the present invention, modular jacks (not shown), such as Panduit® Mini-Com® modular jacks, can be mounted, for example, in openings 224, 244 for quick and easy connection and disconnection of door-mounted electronics, such as handles, keypads, readers, and sensors.

Figure 62:
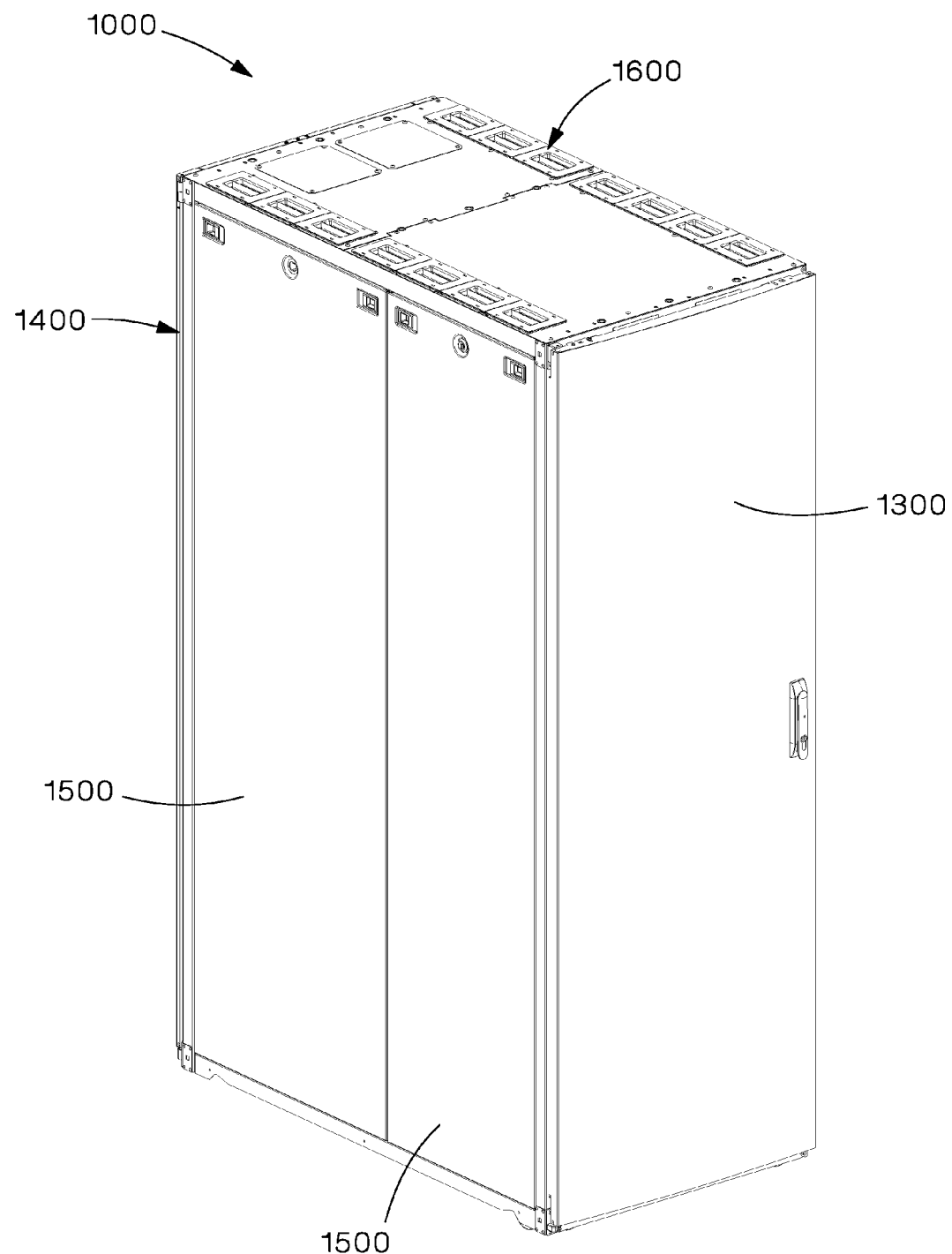
FIG. 62 is a top front perspective view of an electronics cabinet according to a second embodiment of the present invention.
Figure 63:
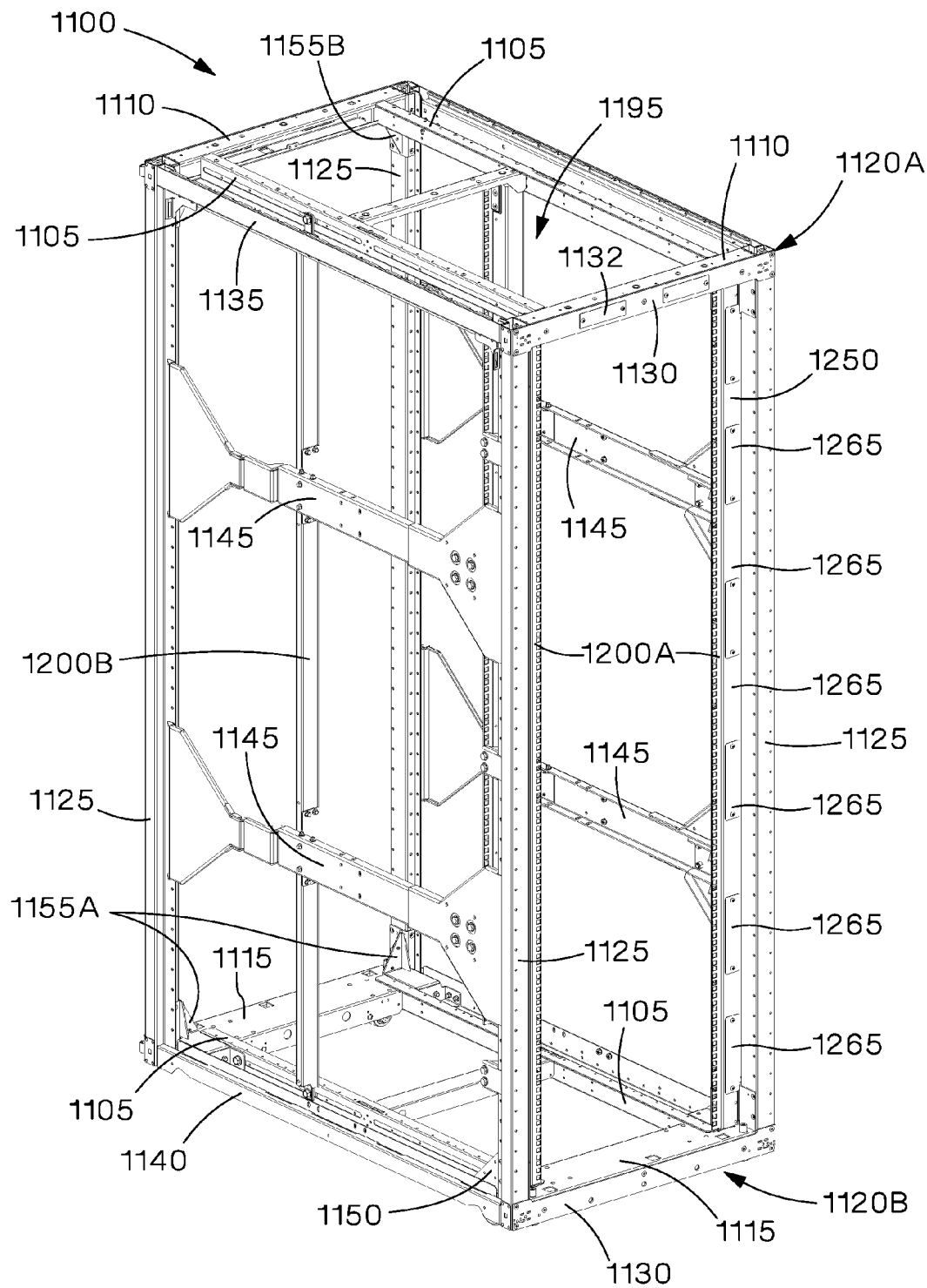
FIG. 63 is a top front perspective view of one example of a cabinet frame of the electronics cabinet of FIG. 62.

Referring to FIGS. 62-63, another example of an electronics cabinet 1000 is shown that includes a reinforced cabinet frame 1100 so that the electronics cabinet 1000 can be shipped and moved fully loaded with electronic equipment. The example electronic cabinet 1000 with reinforced cabinet frame 1100 is capable of being shipped with a 2000 pound equipment load while maintaining the structural integrity of the cabinet and the security of the electronic equipment. The example electronics cabinet 1000 can be used for server cabinet applications and is a 700 mm wide by 1200 mm deep by 42 rack unit (RU) tall server type cabinet, but could be any size cabinet as desired depending on the particular application. In addition to cabinet frame 1100, electronics cabinet 1000 generally includes front and rear equipment rails 1200A and 1200B, front door 1300, rear door 1400, side panels 1500, and top cap 1600.

As shown in FIGS. 63 and 65-67, cabinet frame 1100 generally includes front-to-back beams 1105, top and bottom side to side beams 1110, 1115, vertical posts 1125, and face plates 1130, which are all similar to the front-to-back beams 210, top and bottom side-to-side beams 220A, 220B, vertical posts 230, and face plates 240 described above. In addition, cabinet frame 1100 also includes upper side panel beams 1135, lower side panel beams 1140, and reinforcing front-to-back beams 1145.

A pair of front-to-back beams 1105 are welded, or otherwise securely fastened or connected, to top side-to-side beams 1110 to form a top frame 1120A and another pair of front-to-back beams 1105 are welded, or otherwise securely fastened or connected, to bottom side-to-side beams 1115 to form a bottom frame 1120B. Vertical posts 1125 are welded, or otherwise securely fastened or connected, to top and bottom frames 1120A, 1120B and, in the particular example shown, are welded to top side-to-side beams 1110 and bottom side-to-side beams 1115, near the ends of top and bottom side-to-side beams 1110, 1115. Front-to-back beams 1105 are inset relative to vertical posts 1125 and relative to the intersection of top and bottom side-to-side beams 1110, 1115 and vertical posts 1125, forming cable-routing areas 1190 (FIG. 68) along the side of cabinet frame 1100 and between equipment-mounting area 1195, as defined by front and rear equipment rails 1200A, 1200B, and side panels 1500. Depending on the width of electronics cabinet 1000 (e.g., 600 mm, 700 mm, 800 mm, etc.) the width of cable-routing area 1190 will be larger or smaller, while the width of equipment-mounting area 1195 remains the same.

Face plates 1130 can also be removably connected to top and bottom side-to-side beams 1110, 1115 and to vertical posts 1125, for example using removable connectors such as nuts and bolts or screws, or can be permanently connected to top and bottom side-to-side beams 1110, 1115 using a permanent connection such as rivets or welds. Face plates 1130 can be used to provide additional rigidity to cabinet frame 1100, and more particularly, to top and bottom side-to-side beams 1110, 1115 and vertical posts 1125. Cover plates 1132 can also be removably connected to face plates 1130 using removable connectors, such as nuts and bolts or screws, and when removed can provide access to cable routing openings.

Upper side panel beams 1135 are welded to upper portions of vertical posts 1125 and tube shaped lower side panel beams 1140 are welded to bottom portions of vertical posts 1125. Upper and lower side panel beams 1135, 1140 support and secure side panels 1500, as described below, and enhance the front to back directional strength of cabinet frame 1100 by restricting torsional twist of top and bottom side-to-side beams 1110, 1115, which can experience extreme forces during shipping.

In the example shown, cabinet frame 1100 also includes reinforcing front-to-back beams 1145 to increase the overall rigidity of cabinet frame 1100, making electronics cabinet 1000 more resistant to impact deformation. In the particular example shown, each of the reinforcing front-to-back beams 1145 consist of a three piece assembly and are welded, or otherwise securely fastened or connected, to between vertical posts 1125. However, reinforcing front-to-back beams 1145 can also be a single, unitary unit. Welding or otherwise securing reinforcing front-to-back beams 1145 between vertical posts 1125 creates rigidity in the front to back direction of cabinet frame 1100, which translates to a reduction of frame deflection from vibrations and impacts during the shipping and transporting of the final loaded electronics cabinet 1000. As describe in more detail below, reinforcing front-to-back beams 1145 are also connected to the front and rear equipment rails 1200A, 1200B, which distributes a portion of the vertical load encountered by the front and rear equipment rails 1200A, 1200B to the vertical posts 1125 of the cabinet frame 1100, where additional structural support exists.

Cabinet frame 1100 can also include front and rear gussets 1150, 1155A, 1155B to further increase the rigidity of cabinet frame 1100. A pair of front gussets 1150 can be welded, or otherwise securely fastened or connected, to front vertical posts 1125 and lower front-to-back beams 1105, a first pair of rear gussets 1155A can be welded, or otherwise securely fastened or connected, to rear vertical posts 1125 and lower front-to-back beams 1105, and a second pair of rear gussets 1155B can be welded, or otherwise securely fastened or connected, to rear vertical posts 1125 and rear top side-to-side beam 1110. With the rear of cabinet frame 1100 lacking the added support of structural air dams 1250, as described below, rear gussets 1155A, 1155B provide increased rigidity.

As discussed above for electronics cabinet 100, leveling legs 1185 or casters can be connected to bottom frame 1120B, and more particularly, bottom side-to-side beams 1115 as shown in FIGS. 70-71. Preferably, leveling legs 1185 or casters would be rotatably connected to bottom frame 1120B to aid in the positioning and leveling of electronics cabinet 1000.

Figure 74A:
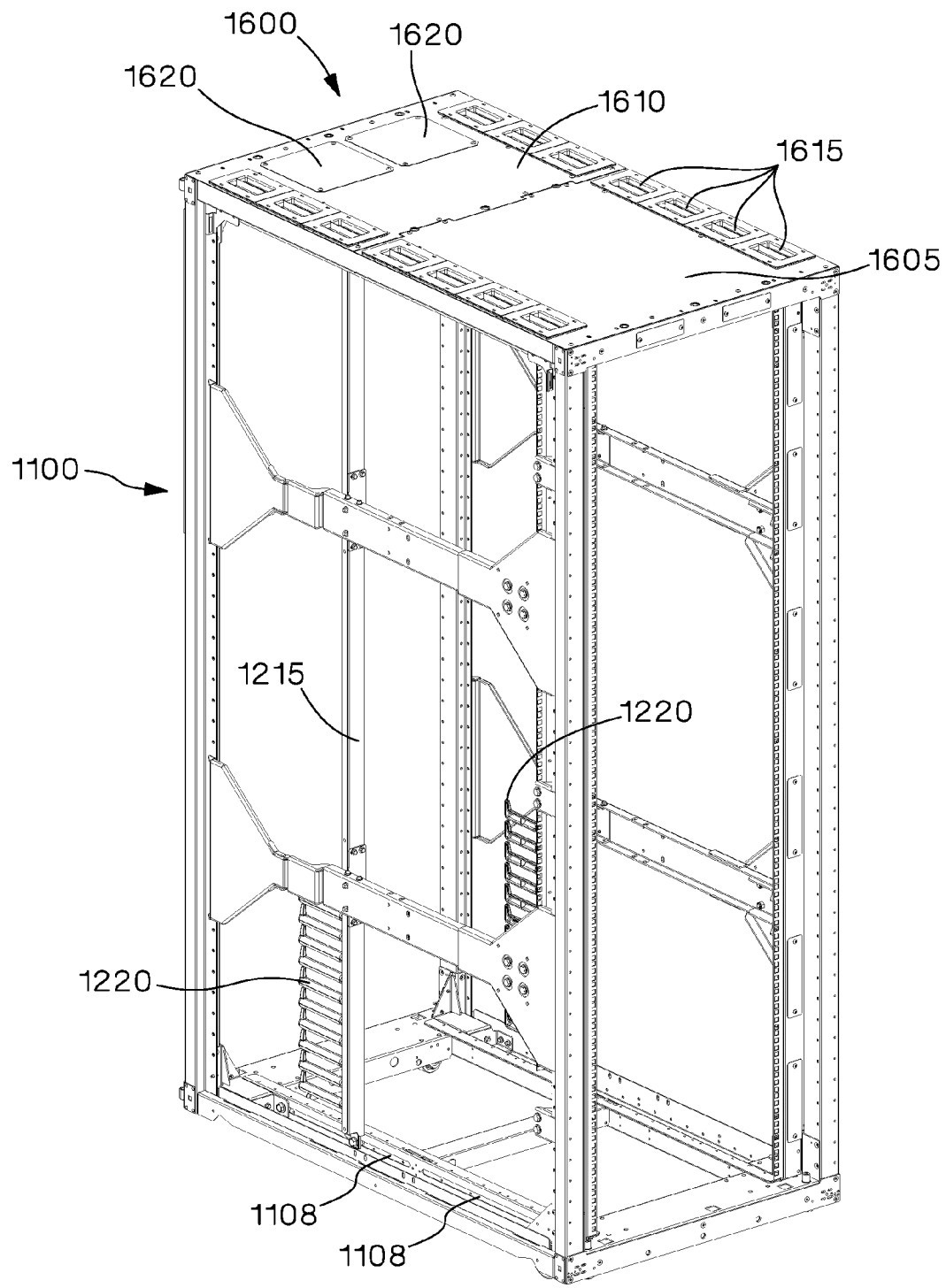
FIG. 74A is a top front perspective view of the cabinet frame of FIG. 63 with cable management fingers and a top cap.

Referring to FIGS. 63-68, standard front and rear equipment rails 1200A, 1200B are removably connected to front-to-back beams 1105 of top and bottom frames 1120A, 1120B with removable connectors, such as nuts, bolts, channel nuts, screws, etc., in the same manner discussed above for equipment rails 300A, 300B and front-to-back beams 210. Front and rear equipment rails 1200A, 1200B include mounting openings 1205 for mounting electronic equipment, such as servers, patch panels, and switches, in electronics cabinet 1000 and are configured to receive horizontal blanking panels (not shown). As discussed above, rear equipment rail 1200B can also be configured to receive accessory mounting brackets, such as patch panel cassette mounting brackets and cable management finger mounting brackets 1215, for mounting accessories, such as patch panel cassettes and cable management fingers 1220 in electronics cabinet 1000 (FIG. 74A). In the example shown, front equipment rail 1200A is secured to front vertical posts 1125, while rear equipment rail 1200B is adjustable.

Figure 64A:
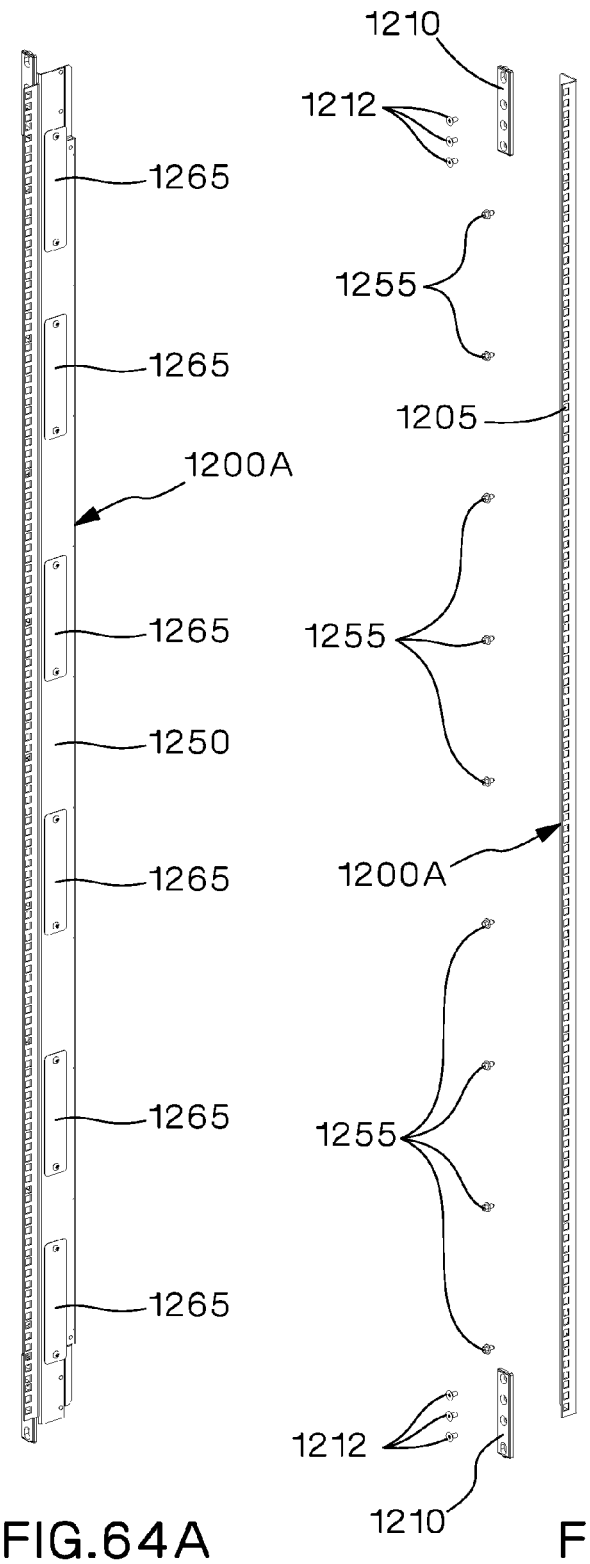
FIG. 64A is a top front perspective view of an equipment rail and air dam of the cabinet frame of FIG. 63.
Figure 64B:
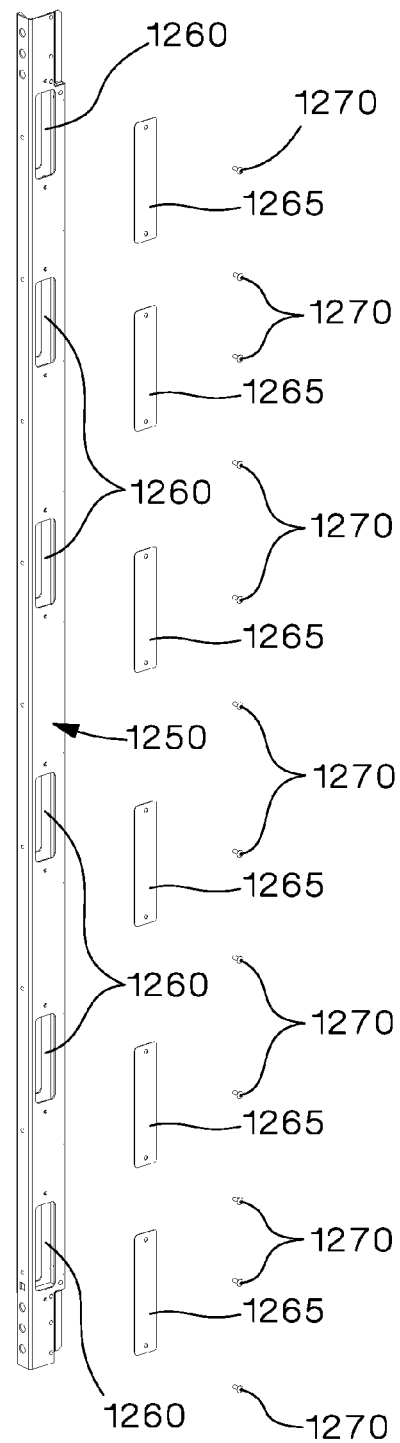
FIG. 64B is an exploded view of the equipment rail and air dam of FIG. 64A.
Figure 65:
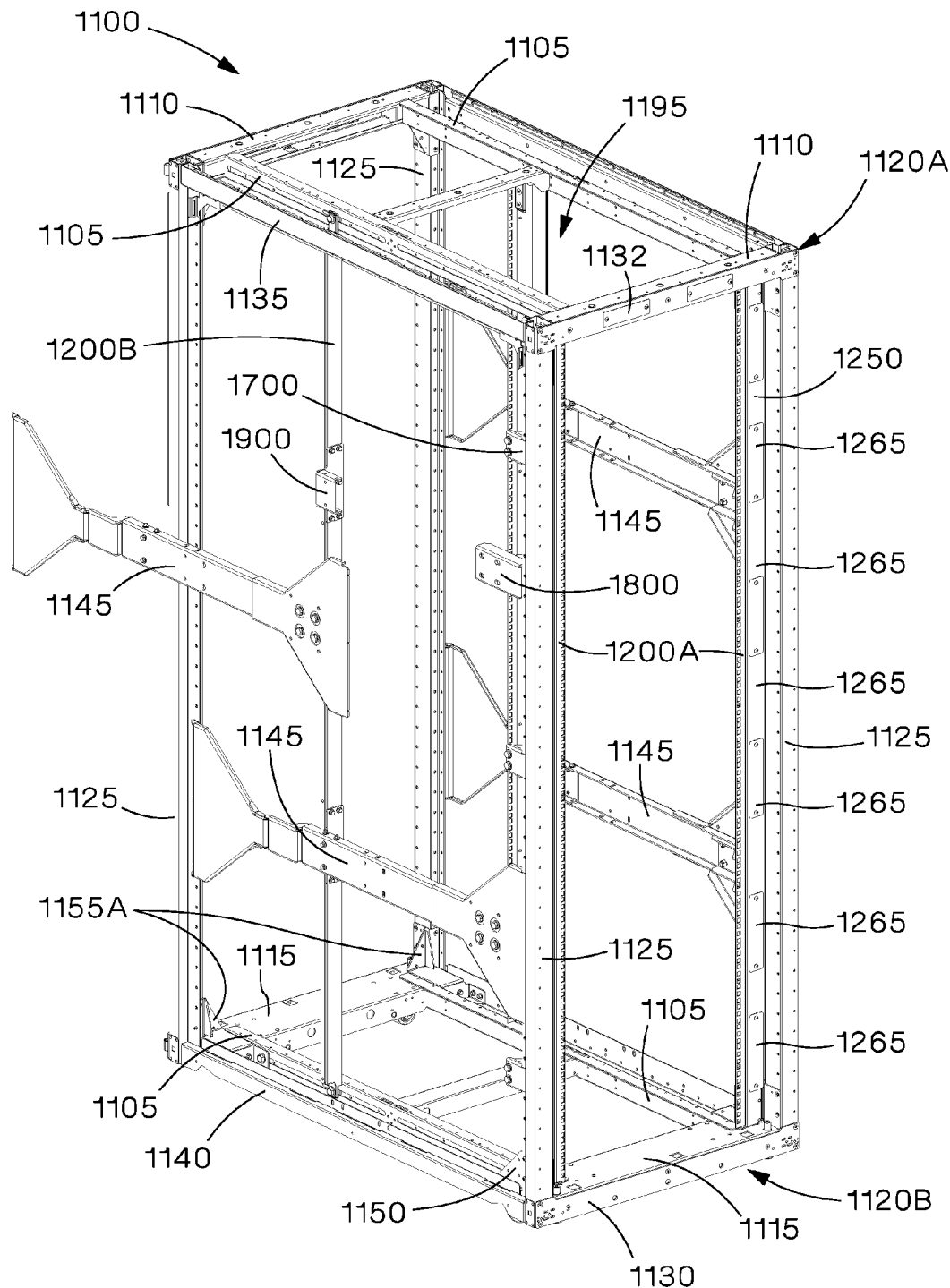
FIG. 65 is a partial exploded view of the cabinet frame of FIG. 63.

As shown in FIGS. 64A and 64B, front and rear equipment rails 1200A, 1200B can also include stiffeners 1210, which can be removably connected to equipment rails 1200A, 1200B using removable connectors, such as nuts and bolts and screws. Alternatively, equipment rails 1200A, 1200B and stiffeners 1210 could be integrally formed.

To provide additional strength and rigidity to cabinet frame 1100 and to the front and rear equipment rails 1200A, 1200B, additional structural features and connections are also incorporated into cabinet frame 1100.

Figure 68:
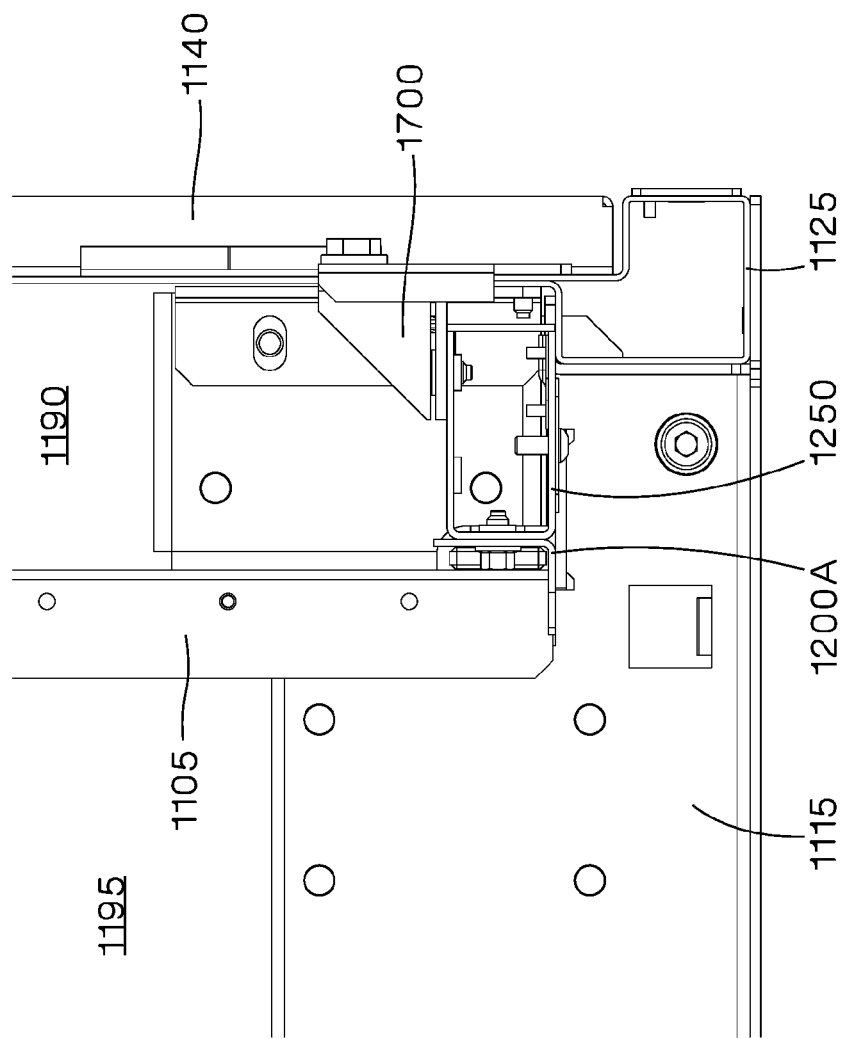
FIG. 68 is a top plan view of the front right corner of the cabinet frame of FIG. 63.
Figure 69:
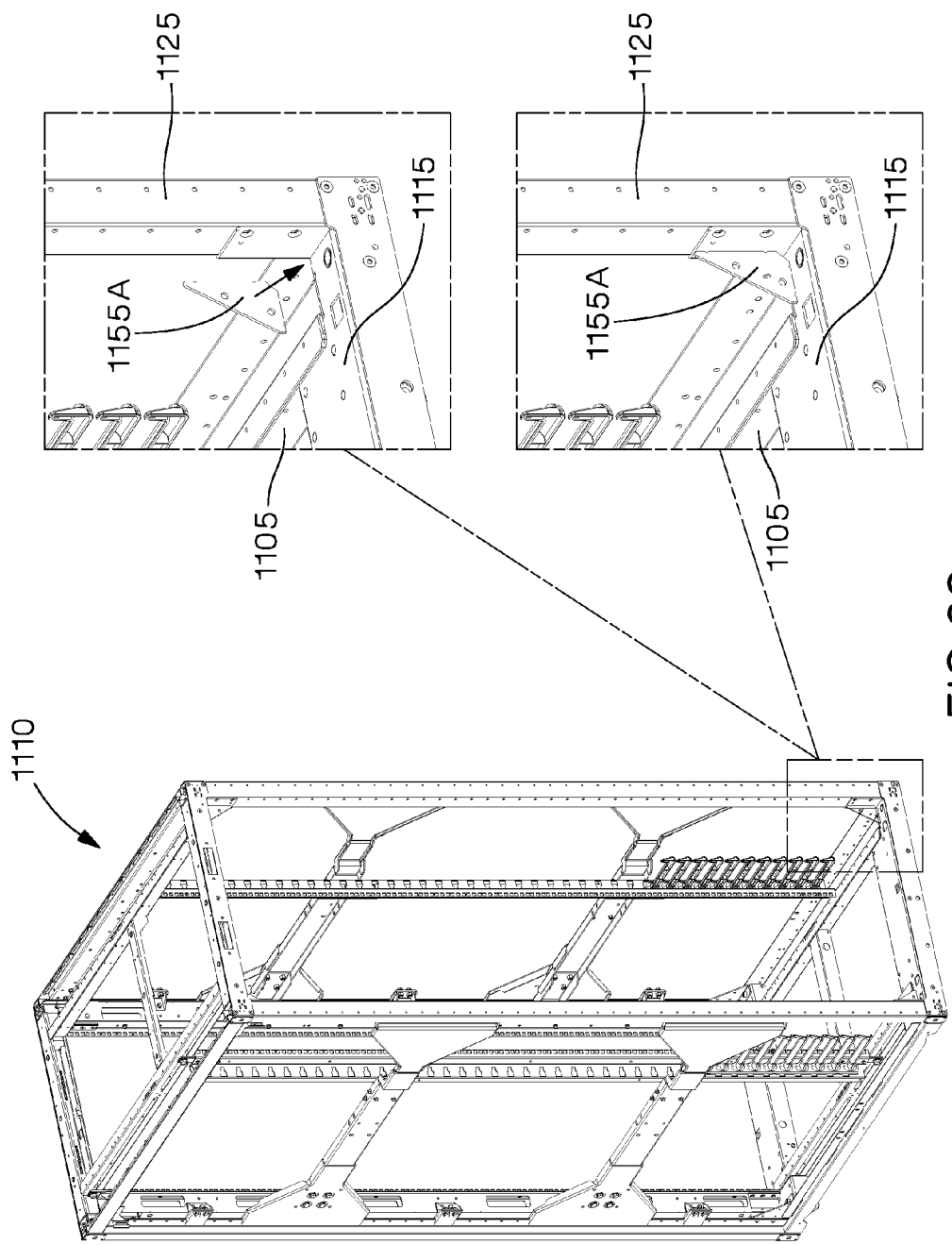
FIG. 69 is a top rear perspective view of the cabinet frame of FIG. 63 with cable management fingers.

As shown in FIGS. 64A, 64B, and 68, each front equipment rail 1200A is connected to a structural air dam 1250 with threaded members 1255, such as screws or nuts and bolts, or could be permanently attached to a structural air dam 1250 through rivets, welds, etc., to form a front equipment rail assembly. When installed in cabinet frame 1100 as described below, the front equipment rail assembly can be used to transfer some of the dynamic forces encountered by front equipment rails 1200A into the front vertical posts 1125. Structural air dams 1250 have a generally C-shaped cross section and have pass-thru cutouts 1260 to allow cabling and power to pass through from the front to the rear of electronics cabinet 1000 without utilizing open RU spacing. The size and shape of each pass-thru cutout 1260 is optimized to allow the maximum amount of cabling to pass through while still utilizing well known sealing solutions, such as blanks, bezels, boots, etc. When not in use, pass-thru cutouts 1260 can be covered with cover plates 1265, which can be secured to structural air dam 1250 with threaded members 1270.

Figure 66:
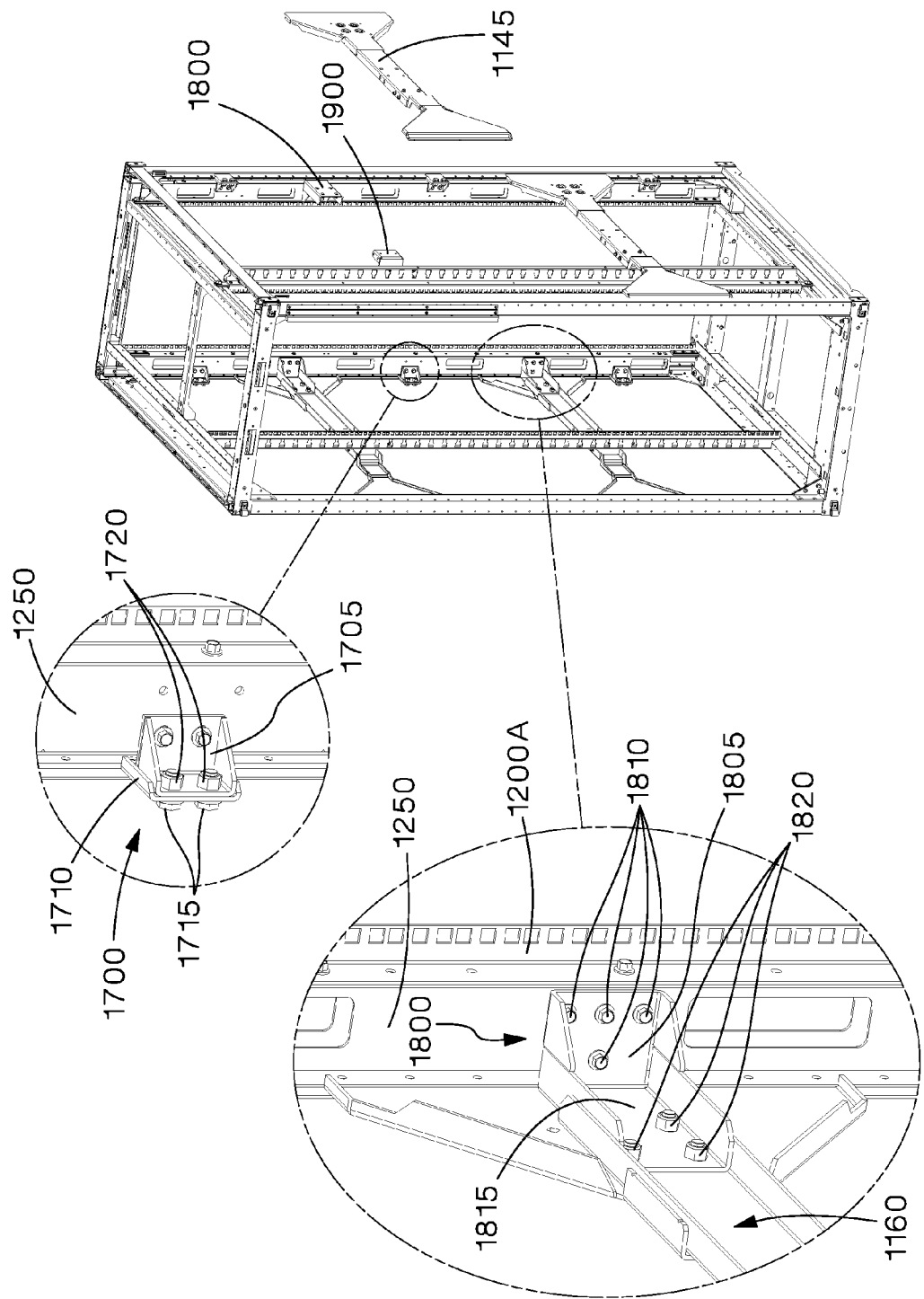
FIG. 66 is a partial exploded top rear perspective view of the cabinet frame of FIG. 63.

Each front equipment rail assembly, having a front equipment rail 1200A and a structural air dam 1250, is positioned adjacent one of the front vertical posts 1125 and the front equipment rail 1200A is connected to the top and bottom front-to-back beams 1105 as described above. As shown in FIG. 66, each structural air dam 1250 is also secured to the corresponding front vertical post 1125 and to each of the adjacent reinforcing front-to-back beams 1145. Structural air dams 1250 are secured to front vertical posts 1125 with post brackets 1700. Each post bracket 1700 has a generally L-shaped first portion 1705 and a generally planar second portion 1710. First portion 1705 of post bracket 1700 is secured to structural air dam 1250 with threaded members 1810, for example with screws or nuts and bolts, and second portion 1710 of post bracket 1700 is secured to front vertical post 1125 with threaded members, for example with screws or nuts and bolts. Bolts 1715 are inserted through aligned holes (not shown) in first and second portions 1705, 1710 and secured by nuts 1720, thereby rigidly securing structural air dam 1250 to front vertical post 1125. Structural air dams 1250 are also secured to each adjacent reinforcing front-to-back beam 1145 with beam brackets 1800. Each beam bracket 1800 is generally L-shaped and has a first portion 1805 and a second portion 1815 that is generally perpendicular to first portion 1805 and is sized to fit in a channel 1160 formed in reinforcing front-to-back beams 1145. First portion 1805 is secured to structural air dam 1250 with threaded members 1810, such as screws or nuts and bolts, and second portion 1815 is secured to reinforcing front-to-back beam 1145 with threaded members 1820, such as screws or nuts and bolts, thereby rigidly securing structural air dam 1250 to reinforcing front-to-back beams 1145.

Post brackets 1700 and beam brackets 1800 connect the structural air dams 1250, and therefore the front equipment rails 1200A, to the front vertical posts 1125 and the reinforcing front-to-back beams 1145, respectively, to create a more robust junction and simplifies construction of structural air dams 1250. The equipment rail assembly has front-to-back and side-to-side strength enhanced by the connection of the equipment rail assembly to front vertical posts 1125 and reinforcing front-to-back beams 1145 and the overall rigidity of cabinet frame 1100 is increased by effectively adding structure to front vertical posts 1125.

Figure 67:
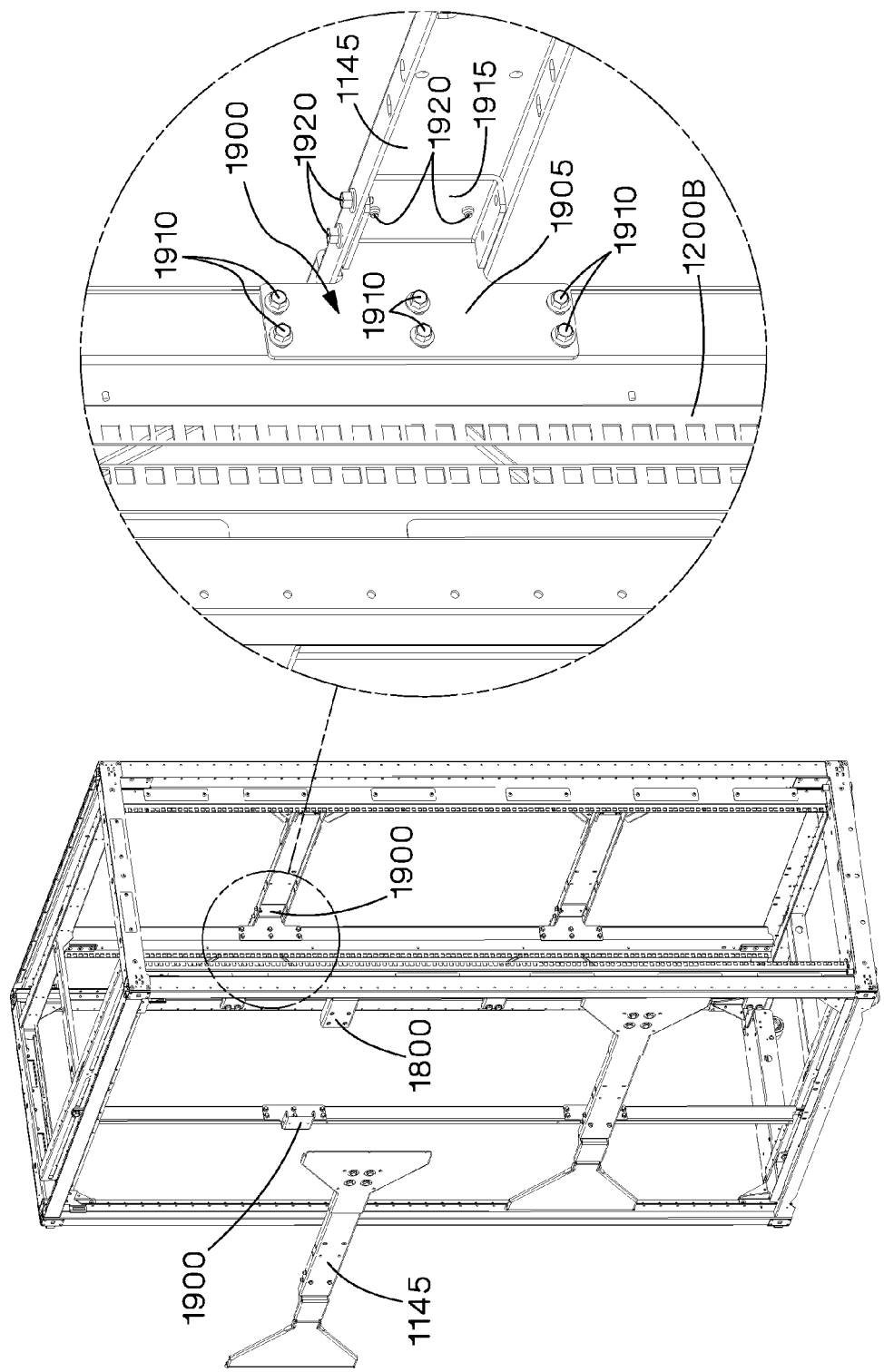
FIG. 67 is a partial exploded view of the cabinet frame of FIG. 63.

Rear equipment rails 1200B are also provided with additional support by connecting rear equipment rails 1200B to reinforcing front-to-back beams. Referring to FIG. 67, rear equipment rails 1200B are secured to adjacent reinforcing front-to-back beams 1145 with rear beam brackets 1900. Each rear beam bracket 1900 is generally L-shaped and has a first portion 1905 and a second portion 1915 that is generally perpendicular to first portion 1905 and is sized to fit in channel 1160 of reinforcing front-to-back beams 1145. First portion 1905 is secured to rear equipment rail 1200B with threaded members 1910, such as screws or nuts and bolts, and second portion 1915 is secured to reinforcing front-to-back beam 1145 with threaded members 1920, such as screws or nuts and bolts, thereby securing rear equipment rail 1200B to reinforcing front-to-back beams 1145.

Referring generally to FIG. 62, front door 1300 and rear door 1400 of electronics cabinet 1000 have the same structure as front door 400 and rear door 500 of electronics cabinet 100 described above and are connected to cabinet frame 1100 in the same manner as that described above for front door 400 and rear door 500 of electronics cabinet 100.

Referring to FIGS. 70-73, side panels 1500 include a panel 1505 and a tubular member 1510 connected adjacent a bottom of panel 1505. An extended steel tab 1515 is connected to tubular member 1510, extends from the bottom of panel 1505, and is configured to engage slot 1142 in lower side panel beams 1140 of cabinet frame 1100. As shown in FIGS. 70-71, a side panel 1500 is positioned such that tab 1515 is aligned with slot 1142 of lower side panel beam 1140 and tab 1515 is inserted into slot 1142. The bottom of panel 1505 then rests directly on the top surface 1143 of lower side panel beam 1140. Once tab 1515 is engaged in slot 1142, side panel 1500 can be rotated towards cabinet frame 1100 until side panel 1500 is vertical and the top of panel 1500 engages the upper side panel beam 1135.

Figure 72:
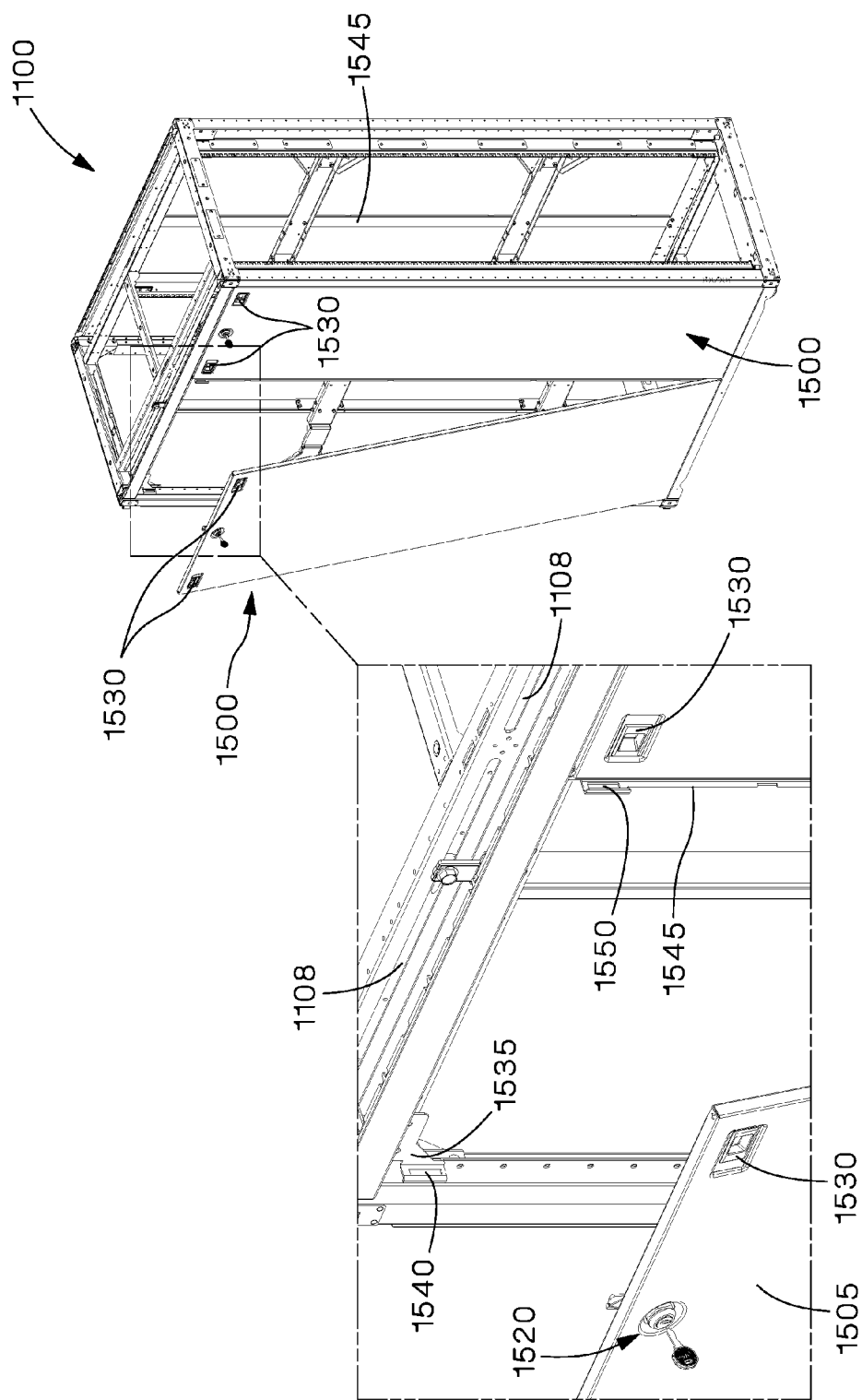
FIG. 72 is a top front perspective view of the cabinet frame of FIG. 63 with one side panel installed and one side panel partially installed.

In the example shown, each side panel 1500 also has a pair of retractable latches 1530 extending from opposite sides of the upper portion of side panel 1500. One of the latches 1530 engages an aperture 1540 formed in a corner bracket 1535 that is bolted, or otherwise secured, to cabinet frame 1100. For example, as can best be seen in FIGS. 72 and 73, corner bracket 1535 can be bolted to upper side panel beam 1135 and vertical post 1125 to secure corner bracket 1535 to cabinet frame 1100. The opposite latch 1530 engages an aperture 1550 formed in a center post that is bolted, or otherwise secured, to upper and lower side panel beams 1135, 1140. As is shown in FIG. 72, in addition to being secured to upper and lower side panel beams 1135, 1140, center post 1545 can also be bolted, or otherwise secured, to one or more reinforcing front-to-back beams 1145 to provide added stability. As side panel 1500 is rotated towards cabinet frame 1100, latches 1530 are manually retracted. When side panel 1500 is vertical and the top of panel 1500 engages upper side panel beam 1135, latches 1530 are released and extend to engage aperture 1540 in corner bracket 1535 and aperture 1550 in center post 1545 to secure side panel 1500 to cabinet frame 1100.

Figure 73:
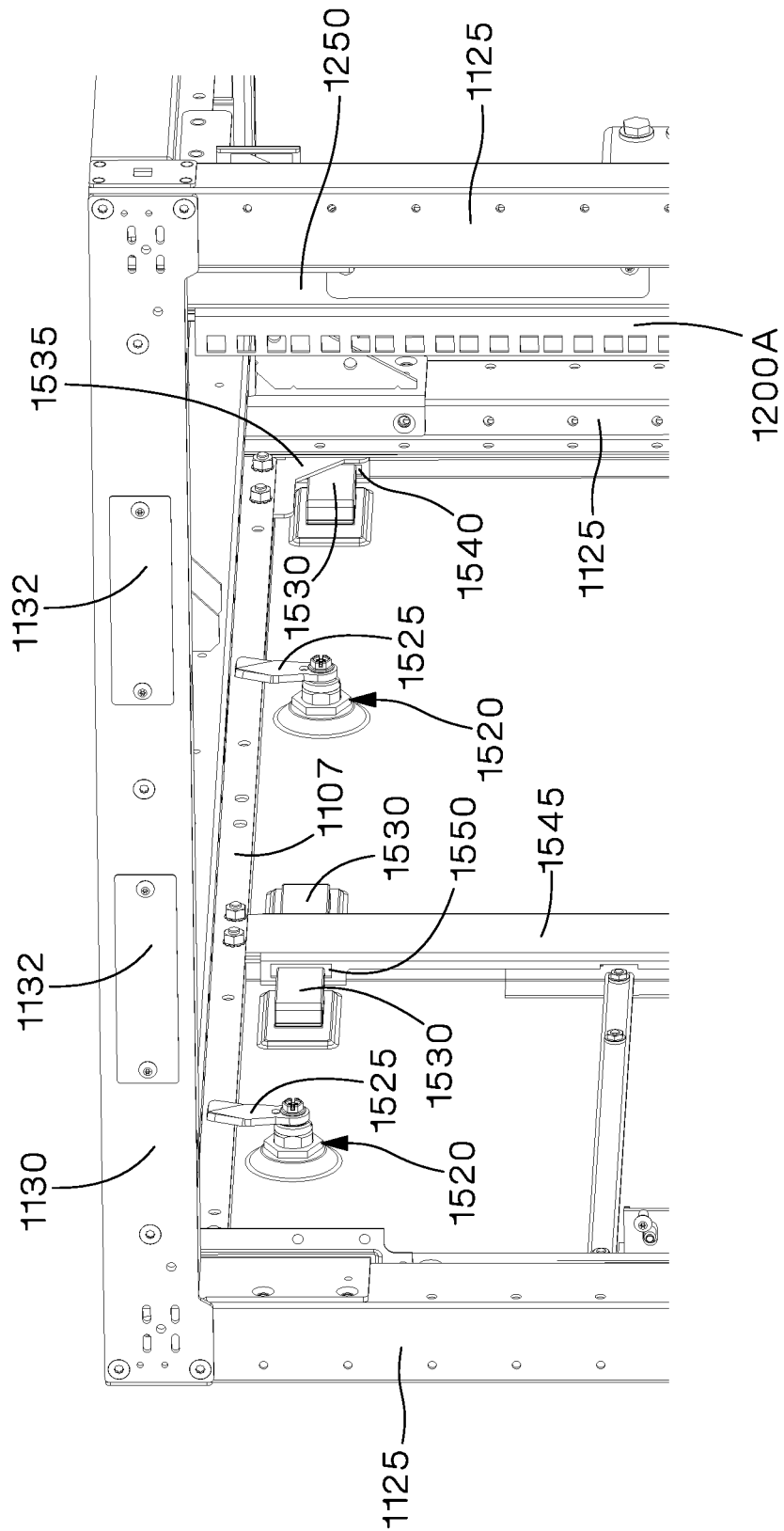
FIG. 73 is a partial bottom front perspective view of the cabinet frame of FIG. 63 with two side panels.

As shown in FIGS. 72 and 73, each side panel 1500 can also include a locking mechanism 1520, such as a key driven quarter turn lock, adjacent a top of side panel 1500, that can be rotated to drive a cam 1525 of locking mechanism 1520 behind a flange 1107 of upper side panel beam 1135 to prevent removal of side panel 1500.

Figure 74B:
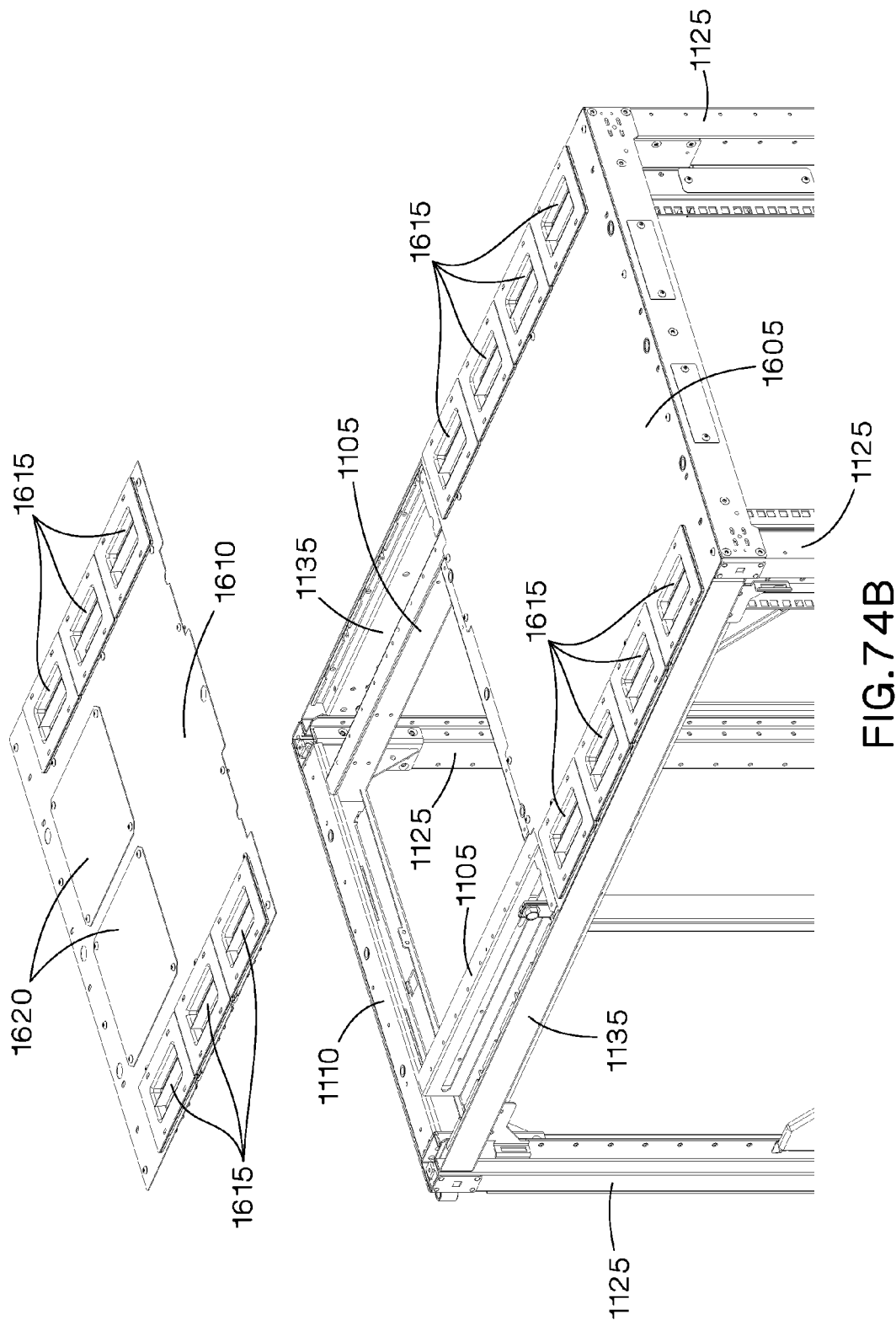
FIG. 74B is a partial exploded view of the cabinet frame of FIG. 74A.
Figure 74C:
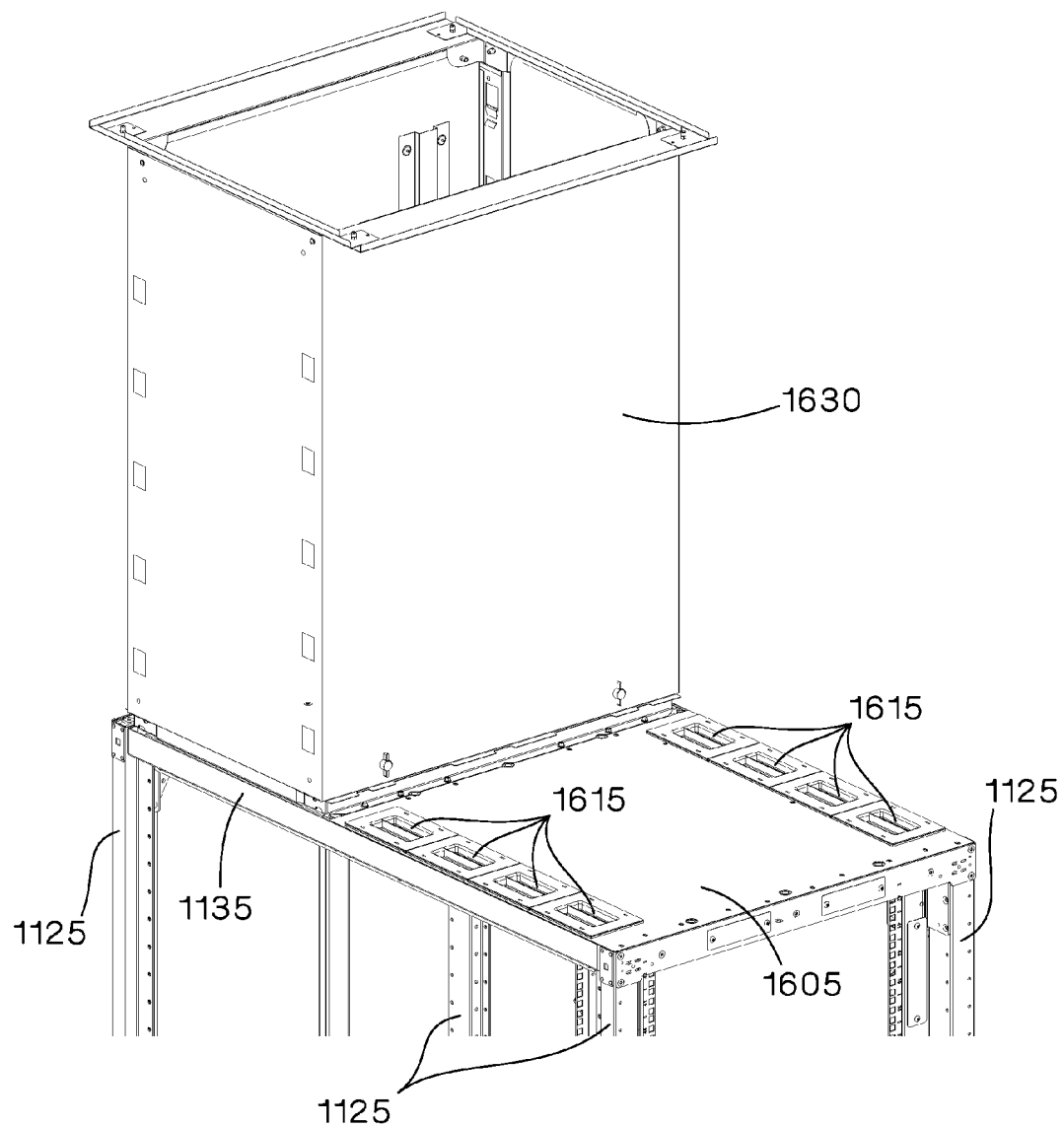
FIG. 74C is a partial top front perspective view of the cabinet frame of FIG. 74A with one top cap and a chimney.

Referring to FIGS. 62 and 74A-C, top cap 1600 is removably connected to front-to-back beams 1105 and top side-to-side beams 1110 of cabinet frame 1100 using threaded members (not shown), such as screws or nuts and bolts. In the example shown, top cap 1600 is a two-piece construction having a front portion 1605 and a rear portion 1610. Front portion 1605 of top cap 1600 can include data cable openings along the sides of front portion 1605 fitted with grommets and grommet covers 1615, as described above for top cap 700 of electronics cabinet 100. Rear portion 1610 of top cap 1600 can also include data cable openings along the sides of rear portion 1610 fitted with grommets and grommet covers 1615 and power cable openings along the rear of rear portion 1610, as described above for top cap 700 of electronics cabinet 100. In the example shown, power cable openings in rear portion 1610 are covered by covers 1620, which are secured to rear portion 1610 by threaded members. As can be seen in FIGS. 74B and 74C, rear portion 1610 of top cap 1600 can be removed to allow the installation of a chimney 1630, or other vertical exhaust duct (VED), such as a standard Panduit® 2.0 VED.

In certain embodiments of electronics cabinet 1000, sensors (not shown), such as door position sensors and environmental sensors (e.g., temperature, humidity, etc.) can be mounted on cabinet frame 100 in the openings in top side-to-side beams that are covered by cover plates 1132. Similarly, modular jacks (not shown), such as Panduit® Mini-Com® modular jacks, can also be mounted on cabinet frame 100 in the openings in top side-to-side beams that are covered by cover plates 1132 for quick and easy connection and disconnection of door-mounted electronics, such as handles, keypads, readers, and sensors.

Referring to FIGS. 75-79, another example of a reinforced cabinet frame 2100 is shown that can also be used with an electronics cabinet that can be shipped and moved fully loaded with electronic equipment. The example electronic cabinet with reinforced cabinet frame 2100 is capable of being shipped with a 1200 pound equipment load while maintaining the structural integrity of the cabinet and the security of the electronic equipment and can be used for network cabinet applications. In the example shown, the electronics cabinet with cabinet frame 1100 is a 800 mm wide by 1200 mm deep by 42 RU tall network type cabinet, but could be any size cabinet as desired depending on the particular application. In addition to cabinet frame 2100, the example electronics cabinet generally would again include front and rear equipment rails 1200A and 1200B, front door 1300, rear door 1400, side panels 1500, and top cap 1600 as discussed above for electronics cabinet 1000. Since front door 1300, rear door 1400, side panels 1500, and top cap 1600 are the same as discussed above for electronics cabinet 1000, these features have been removed from FIGS. 75-79 for clarity and only the cabinet frame 2100 and front and rear equipment rails 2200A and 2200B will be described below.

Cabinet frame 2100 is similar to cabinet frame 1100 described above, but includes various features that are required for a network cabinet application. For example, as described above for cabinet frame 1100, cabinet frame 2100 also generally includes front-to-back beams 1105, top and bottom side to side beams 1110, 1115, vertical posts 1125, face plates 1130, upper side panel beams 1135, and lower side panel beams 1140. As described above, a pair of front-to-back beams 1105 are welded, or otherwise securely fastened or connected, to top side-to-side beams 1110 to form a top frame 1120A, another pair of front-to-back beams 1105 are welded, or otherwise securely fastened or connected, to bottom side-to-side beams 1115 to form a bottom frame 1120B, vertical posts 1125 are welded, or otherwise securely fastened or connected, to top and bottom frames 1120A, 1120B, upper side panel beams 1135 are welded to a top portion of vertical posts 1125, and tube shaped lower side panel beams 1140 are welded to a bottom portion of vertical posts. Face plates 1130 can also be removably connected to top and bottom side-to-side beams 1110, 1115 and to vertical posts 1125 and cover plates 1132 can also be removably connected to face plates 1130 using removable connectors, such as nuts and bolts or screws. Cabinet frame 2100 can also include front and rear gussets 1150, 1155A, 1155B to further increase the rigidity of cabinet frame 2100, as described above.

As discussed above for electronics cabinet 1100, leveling legs or casters 1180 (FIGS. 78, 78B, and 79) can be connected to bottom frame 1120B. Preferably, leveling legs or casters 1180 would be rotatably connected to bottom frame 1120B to aid in the positioning and leveling of electronics cabinet 1000.

Unlike front equipment rails 1200A, front equipment rails 2200A are set back from the front of cabinet frame 2100 to accommodate patch panel cabling. Therefore, to provide additional strength and rigidity to cabinet frame 2100 and to the front and rear equipment rails 2200A, 2200B, additional structural features and connections are also incorporated into cabinet frame 2100. Front and rear equipment rails 2200A, 2200B include mounting openings 1205 for mounting electronic equipment, such as servers, patch panels, and switches and are configured to receive horizontal blanking panels (not shown). Rear equipment rail 2200B can also be configured to receive accessory mounting brackets, such as patch panel cassette mounting brackets and cable management finger mounting brackets 2215 (FIG. 79), for mounting accessories, such as patch panel cassettes and cable management fingers. Front and rear equipment rails 2200A, 2200B can also include stiffeners 1210, which can be removably connected to equipment rails 2200A, 2200B using removable connectors 1212, such as nuts and bolts and screws. Alternatively, equipment rails 2200A, 2200B and stiffeners 1210 could be integrally formed.

Figure 76:
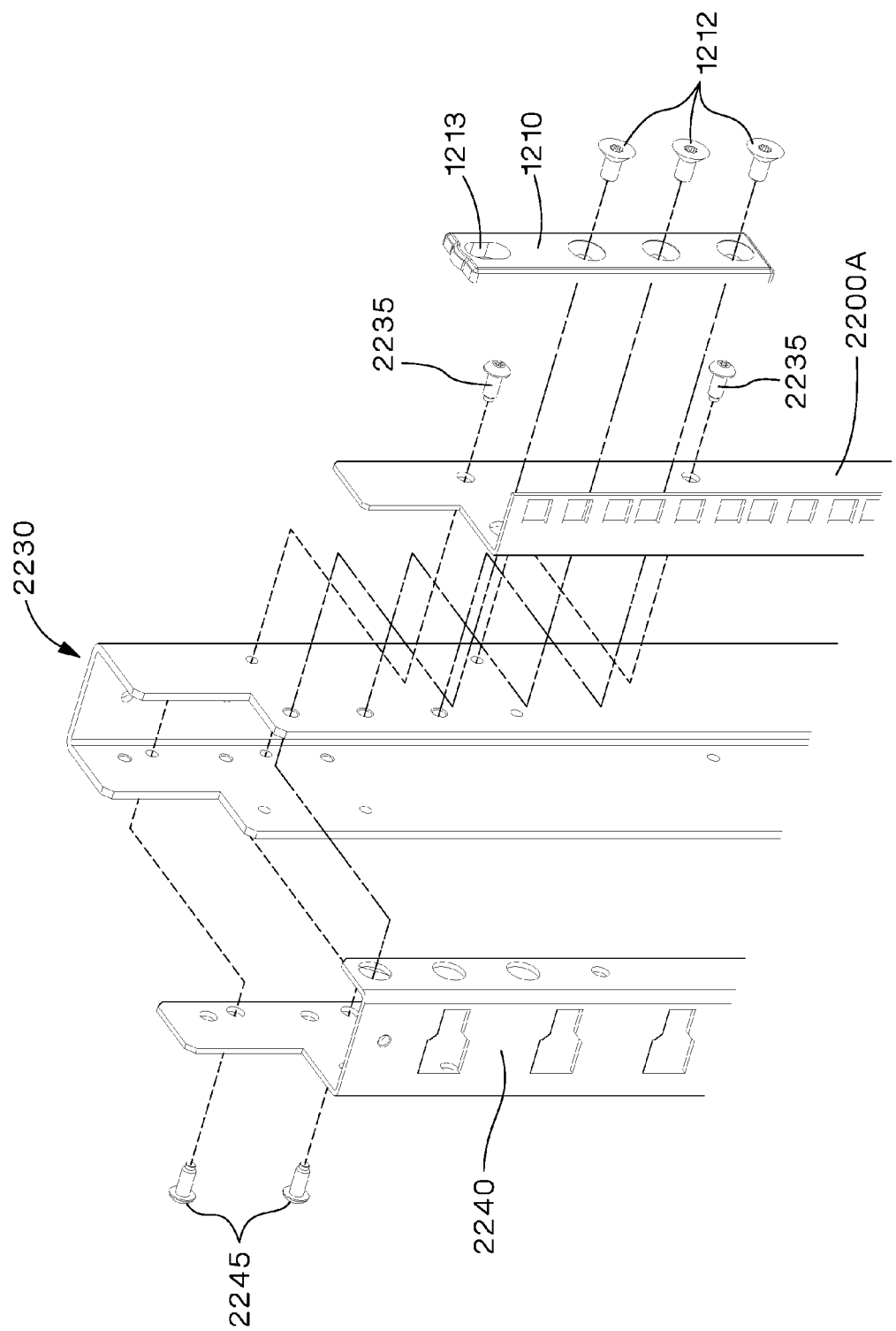
FIG. 76 is a partial exploded view of an equipment rail, cable management finger rail, and reinforcement channel of the cabinet frame of FIG. 75.
Figure 77:
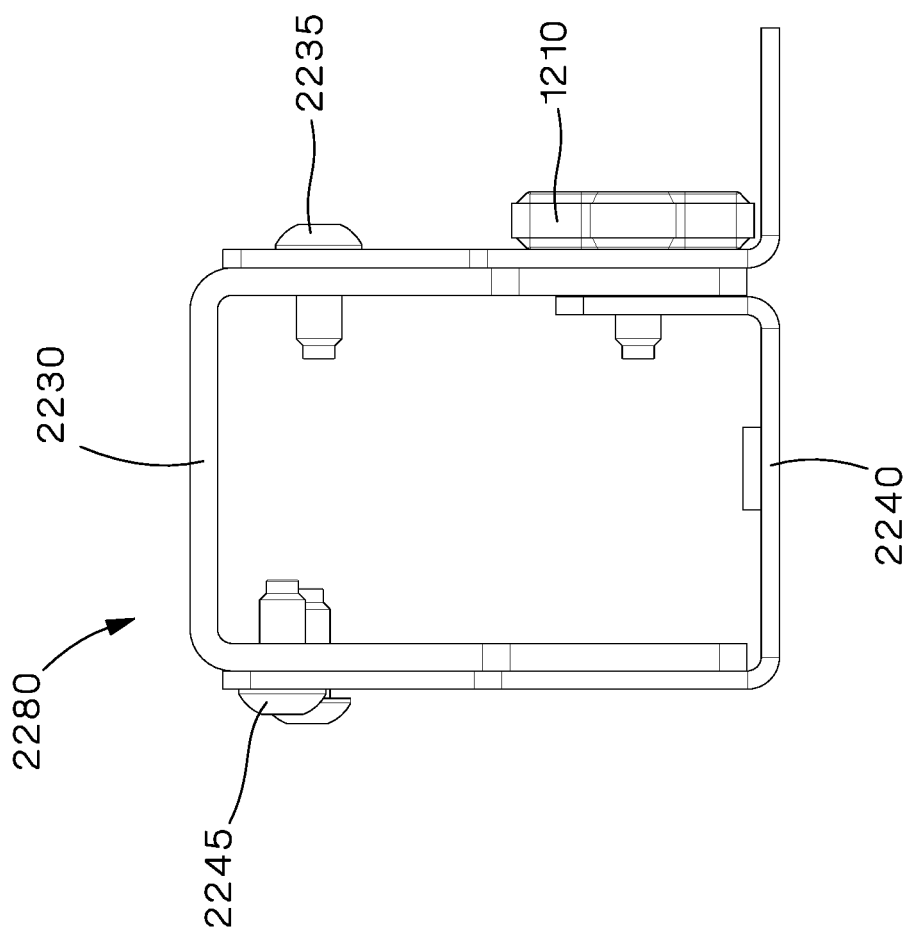
FIG. 77 is a top plan view of an equipment rail, cable management finger rail, and reinforcement channel of the cabinet frame of FIG. 75.

As shown in FIGS. 76 and 77, each front equipment rail 2200A is connected to a channel member 2230 with threaded members 2235, such as screws or nuts and bolts, or could be permanently attached to channel member 2230 through rivets, welds, etc., and vertical cable management rail 2240 are also connected to channel member 2230 with threaded members 2245, such as screws or nuts and bolts, or could be permanently attached to channel member 2230 through rivets, welds, etc., to form a reinforced front equipment rail assembly 2280. Channel members 2230 have a generally C-shaped cross section and can be made of 3 mm thick steel, while front equipment rail 2200A and vertical cable management rail 2240 can be made of 2 mm thick steel.

Vertical cable management rails 2240 can be used for mounting cable management fingers to front equipment rail assembly 2280 such that cable management fingers snap-fit into vertical cable management rail 2240.

Figure 78:
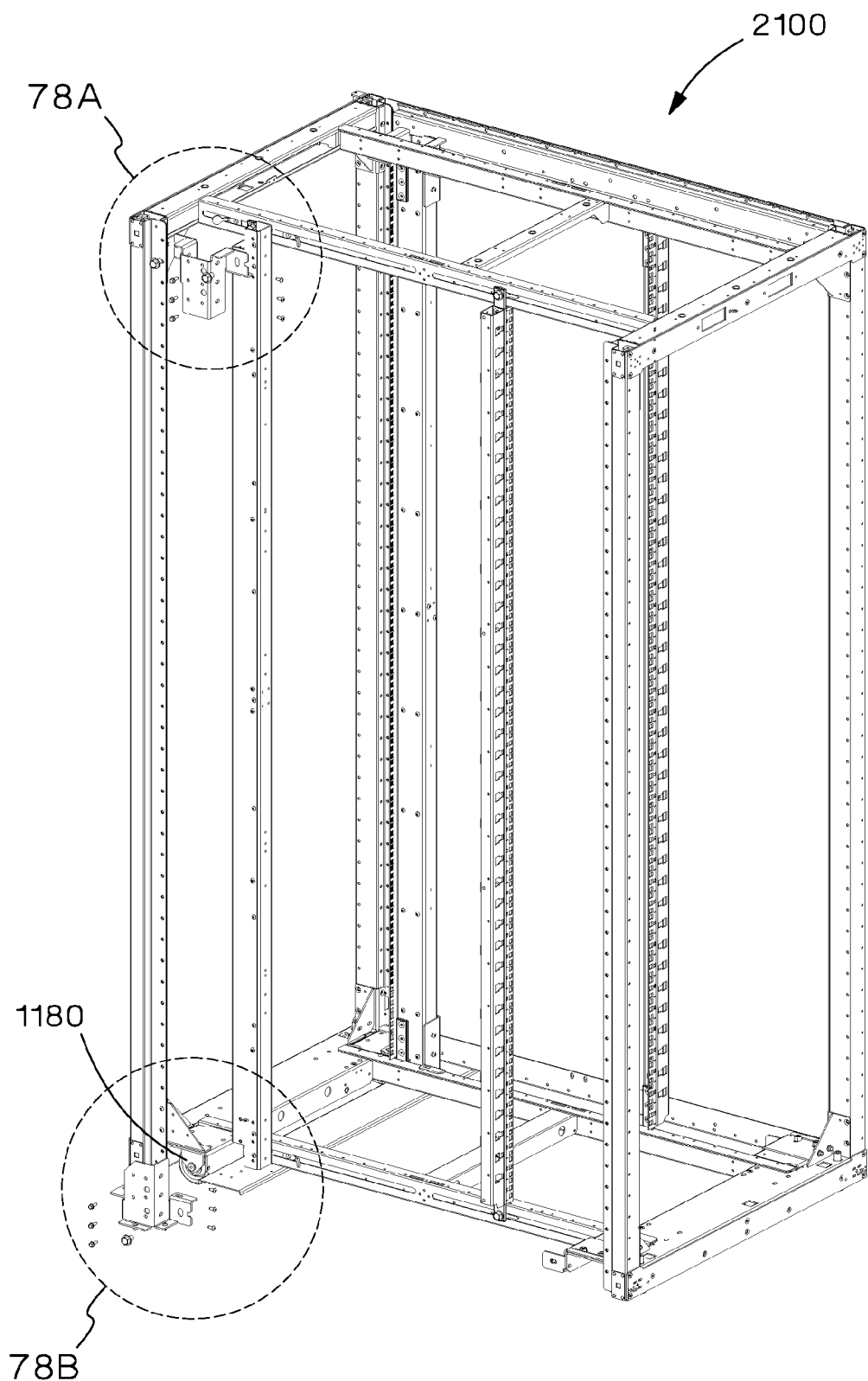
FIG. 78 is a partial exploded top rear perspective view of the cabinet frame of FIG. 75.
Figure 78B:
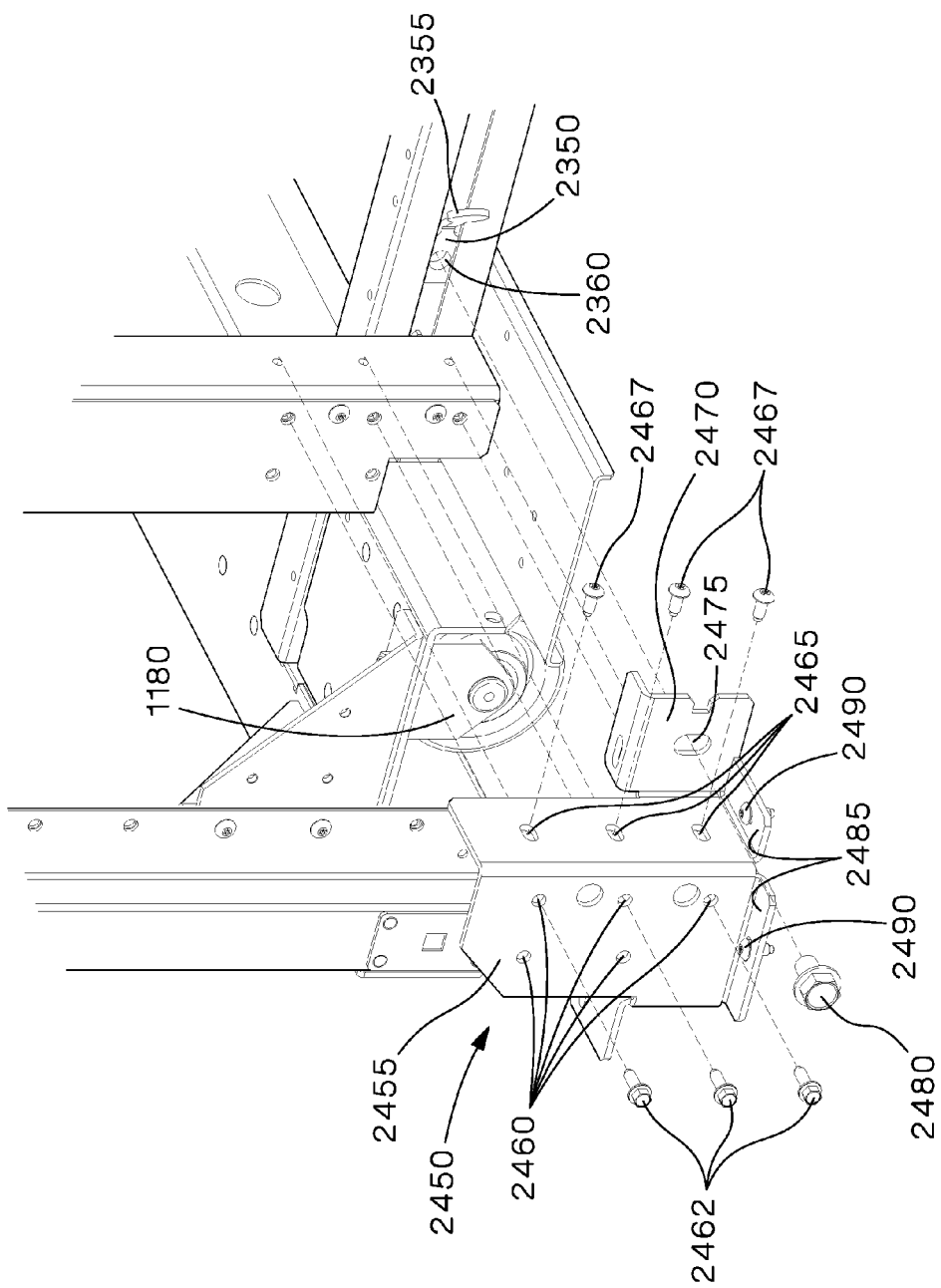
FIG. 78B is an enlarged top rear perspective view of detail 78B of FIG. 78.

Referring to FIGS. 78, 78A, and 78B, front and rear equipment rails 2200A, 2200B are removably connected to front-to-back beams 1105 of top and bottom frames 1120A, 1120B using elongated channel nuts 2350 and mounting bolts 2370. Channel nuts 2350 fit within a channel formed in the inner side of front-to-back beams 1105 such that channel nuts 2350 can slide longitudinally within the channel and have a pair of fingers 2355 that extend through a slot 1108 in front-to-back beams 1105. Mounting bolts 2370 extend through a hole 1213 in stiffener 1210 (FIG. 76), or through a hole in front or rear equipment rail 2200A, 2200B if a stiffener 1210 is not used, and are threaded into a threaded hole 2360 in channel nut 2350. When channel nuts 2350 and mounting bolts 2370 are engaged and tight, equipment rails 2200A, 2200B are secured to front-to-back beams 1105. However, when channel nuts 2350 and mounting bolts 2370 are engaged, but loose, equipment rails 2200A, 2200B cab slide along slots 1108 in front-to-back beams 1105, allowing equipment rails 2200A, 2200B to be positioned at any number of locations along front-to-back beams 1105.

In addition to channel nuts 2350 and mounting bolts 2370, front equipment rail assemblies 2280 could be further secured to front-to-back beams 1105 with additional top and bottom mounting brackets 2410, 2450, which can be made from 3 mm thick steel. This additional support insures the front equipment rail assemblies 2280 do not move or bend when under the application load. As can be seen in FIG. 78A, top mounting bracket 2410 has a generally U-shaped body 2415 that fits over the top portion of front equipment rail assembly 2280 and includes holes 2420 that align with threaded holes 2242 to secure top mounting bracket 2410 to vertical cable management rail 2240 with threaded members 2422 and holes 2425 that align with threaded holes 2232 to secure top mounting bracket 2410 to channel member 2230 with threaded members 2427. A pair of flanges 2430 extend from either side of body 2415 and each include an elongated hole 2435 that aligns with a threaded hole 2360 to secure top mounting bracket 2410 to channel nut 2350 with threaded members 2440 and to secure everything together.

As can be seen in FIG. 78B, bottom mounting bracket 2450 also has a generally U-shaped body 2455 that fits over the bottom portion of front equipment rail assembly 2280 and includes holes 2460 that align with threaded holes 2242 to secure bottom mounting bracket 2450 to vertical cable management rail 2240 with threaded members 2462 and holes 2465 that align with threaded holes 2232 to secure bottom mounting bracket 2450 to channel member 2230 with threaded members 2467. A first flange 2470 extends from a side of body 2455 and includes an elongated hole 2475 that aligns with a threaded hole 2360 to secure bottom mounting bracket 2450 to channel nut 2350 with threaded member 2480 and to secure everything together. A pair of flanges 2485 also extend from the bottom of body 2455 and each include an opening that aligns with a threaded hole 1117 to secure bottom mounting bracket 2450 to bottom side-to-side beam 1115 with threaded members 2490.

Figure 75:
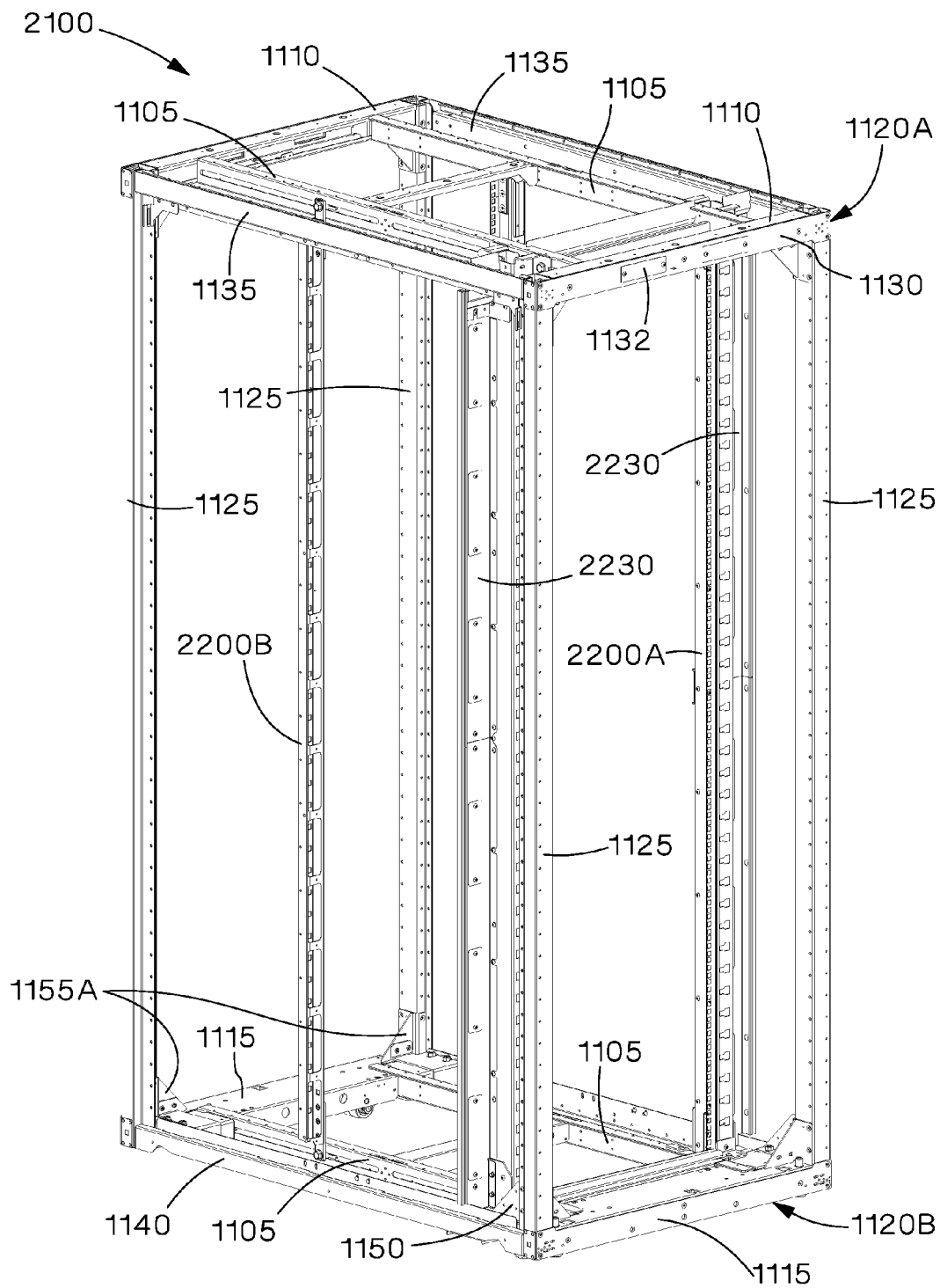
FIG. 75 is a top front perspective view of another embodiment of a cabinet frame of the electronics cabinet of FIG. 62.
Figure 79:
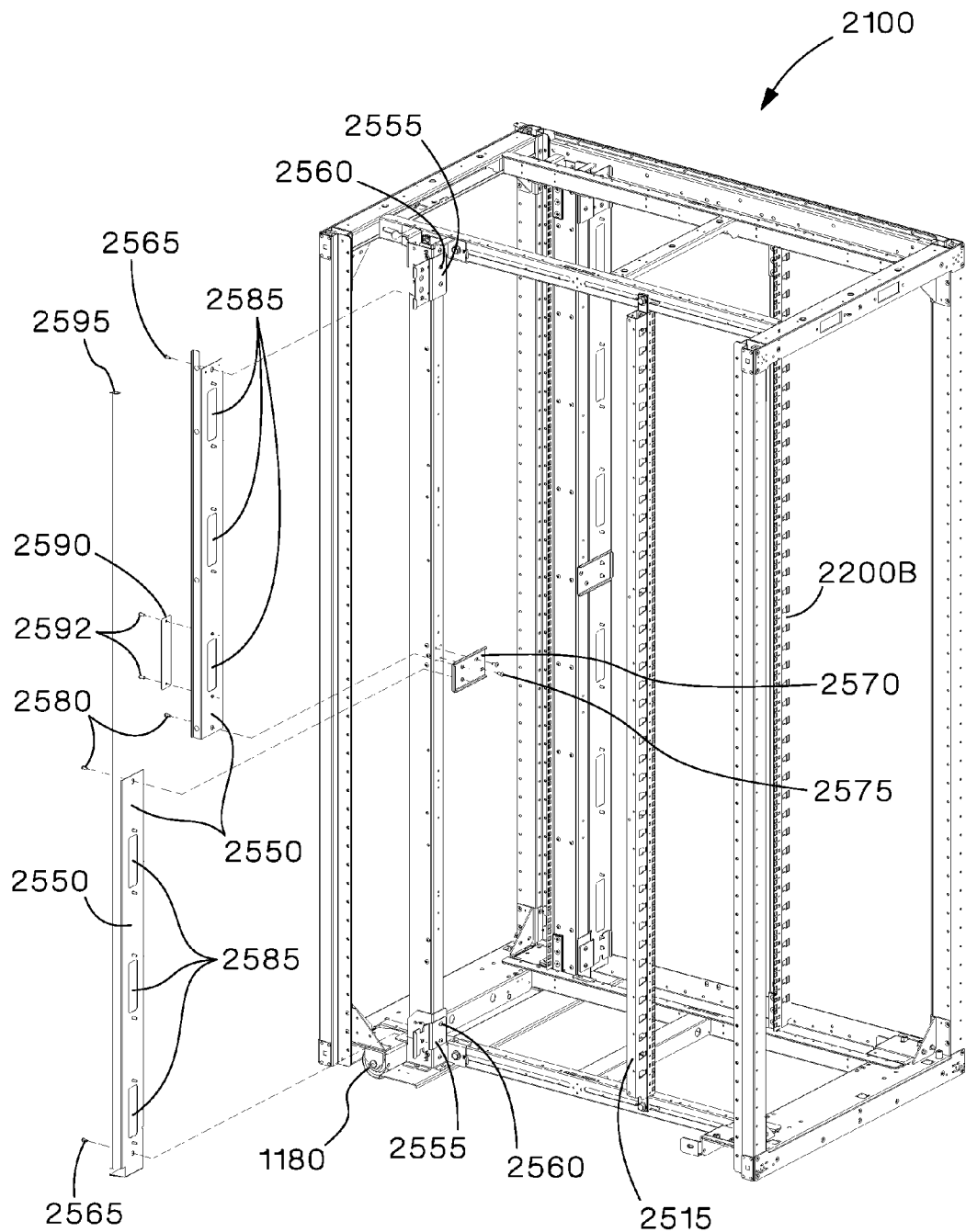
FIG. 79 is a top rear perspective view of the cabinet frame of FIG. 75 with air dams shown in an exploded view.

Referring to FIGS. 75 and 79, vertical blanking panels or non-structural air dams 2550 can also be attached to the front equipment rail assemblies 2280 for hot/cold air separation in the electronics cabinet. Brackets 2555 can be secured to the upper and lower portions of channel member 2230 with threaded members 2560 and vertical blanking panels 2550 can be secured to brackets 2555 with threaded members 2565. In addition, if multiple vertical blanking panels are used, as shown in FIGS. 75 and 79, one or more additional brackets 2570 can be secured to channel member 2230 with threaded members 2575 and adjacent vertical blanking panels 2550 can be secured to the additional brackets 2570 with threaded members 2580. Alternatively, a single vertical blanking panel could be used and secured using only brackets 2555. Each vertical blanking panel 2550 can include one or more cable pass through openings 2585 and a boot or other sealing element can be installed in openings 2585 to seal openings 2585 when cables are present. When not in used, openings 2585 can be sealed with cover plates 2590 and secured to vertical blanking panels 2550 with threaded members 2592. In addition, a sealing member 2595, such as a 1 inch×1 inch foam gasket, can be secured to the outer edge of the vertical blanking panels to form a seal between vertical blanking panels 2550 and side panels 1500 or adjacent cabinets.

While particular embodiments of the present invention have been shown and described, it will be obvious to those skilled in the relevant arts that changes and modifications may be made without departing from the invention in its broader aspects. Therefore, the aim in the appended claims is to cover all such changes and modifications that fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

We claim:

1. An electronics cabinet, comprising:
   a cabinet frame including a first pair of front-to-back beams connected to a pair of top side-to-side beams, a second pair of front-to-back beams connected to a pair of bottom side-to-side beams, and a plurality of vertical posts connected to the pair of top side-to-side beams and the pair of bottom side-to-side beams;
   a front equipment rail removably connected to one of the first pair of front-to-back beams and to one of the second pair of front-to-back beams; and
   a structural air dam removably connected to the front equipment rail and to one of the plurality of vertical posts.

2. The electronics cabinet of claim 1, wherein the first pair of front-to-back beams are welded to the pair of top side-to-side beams, the second pair of front-to-back beams are welded to the pair of bottom side-to-side beams, and the plurality of vertical posts are welded to the pair of top side-to-side beams and the pair of bottom side-to-side beams.

3. The electronics cabinet of claim 1, wherein the first pair of front-to-back beams and the second pair of front-to-back beams are inset relative to the plurality of vertical posts.

4. The electronics cabinet of claim 1, wherein the cabinet frame further comprises a reinforcing front-to-back beam positioned between and connected to a pair of the plurality of vertical posts.

5. The electronics cabinet of claim 4, wherein the reinforcing front-to-back beam is welded to the pair of the plurality of vertical posts.

6. The electronics cabinet of claim 4, wherein the structural air dam is connected to the reinforcing front-to-back beam.

7. The electronics cabinet of claim 6, wherein the structural air dam is connected to the reinforcing front-to-back beam through a beam bracket.

8. The electronics cabinet of claim 4, further comprising a rear equipment rail removably connected to one of the first pair of front-to-back beams, to one of the second pair of front-to-back beams, and to the reinforcing front-to-back beam.

9. The electronic cabinet of claim 8, wherein the rear equipment rail is connected to the reinforcing front-to-back beam through a rear beam bracket.

10. The electronics cabinet of claim 1, further comprising:
    an upper side panel beam connected to two of the plurality of vertical posts; and
    a lower side panel beam connected to the two of the plurality of vertical posts.

11. The electronics cabinet of claim 10, wherein the upper side panel beam is welded to the two of the plurality of vertical posts and the lower side panel beam is welded to the two of the plurality of vertical posts.

12. The electronics cabinet of claim 10, further comprising a side panel configured to engage the lower side panel beam and the upper side panel beam.

13. The electronics cabinet of claim 12, wherein the side panel comprises a tubular member having a tab that extends from a bottom of the side panel and is configured to engage a slot in the lower side panel beam such that the bottom of the side panel rests on a top surface of the lower side panel beam.

14. The electronics cabinet of claim 13, wherein the side panel further comprises a locking mechanism adjacent a top of the side panel that is configured to engage a flange of the upper side panel beam to prevent removal of the side panel.

15. The electronics cabinet of claim 1, wherein the structural air dam has a generally C-shaped cross section and comprises at least one pass-thru cutout formed therethrough.

16. The electronics cabinet of claim 1, wherein the structural air dam is connected to the front equipment rail through a post bracket.

17. The electronics cabinet of claim 1, further comprising a top cap removably connected to a top of the cabinet frame.

18. The electronics cabinet of claim 17, wherein the top cap comprises a front portion removably connected to the top of the cabinet frame and a separate rear portion removably connected to the top of the cabinet frame.

19. The electronics cabinet of claim 17, wherein the top cap comprises at least one opening configured to allow the passage of data and/or power cables therethrough.

20. The electronics cabinet of claim 17, further comprising a vertical exhaust duct removably connected to the top of the cabinet frame adjacent the top cap.

21. An electronics cabinet, comprising:
 a cabinet frame including a first pair of front-to-back beams connected to a pair of top side-to-side beams, a second pair of front-to-back beams connected to a pair of bottom side-to-side beams, and a plurality of vertical posts connected to the top side-to-side beams and the bottom side-to-side beams;
 a front equipment rail removably connected to one of the first pair of front-to-back beams and to one of the second pair of front-to-back beams; and
 a channel member connected to the front equipment rail.

22. The electronics cabinet of claim 21, wherein the front equipment rail is recessed from a front of the electronics cabinet.

23. The electronics cabinet of claim 21, wherein the channel member has a generally C-shaped cross section and is thicker than the front equipment rail.

24. The electronics cabinet of claim 21, further comprising a vertical cable management rail connected to the channel member.

25. The electronics cabinet of claim 21, further comprising a top mounting bracket secured to the channel member and to one of the first pair of front-to-back beams.

26. The electronics cabinet of claim 25, wherein the top mounting bracket is secured to a top channel nut positioned within a top channel formed in the one of the first pair of front-to-back beams.

27. The electronics cabinet of claim 25, wherein the top mounting bracket comprises:
 a generally U-shaped body secured to the channel member; and
 a flange extending from the body and secured to the one of the first pair of front-to-back beams.

28. The electronics cabinet of claim 27, wherein the top mounting bracket is secured to a top channel nut positioned within a top channel formed in the one of the first pair of front-to-back beams and the flange is secured to the top channel nut.

29. The electronics cabinet of claim 21, further comprising a bottom mounting bracket secured to the channel member and to one of the second pair of front-to-back beams.

30. The electronics cabinet of claim 29, wherein the bottom mounting bracket is secured to a bottom channel nut positioned within a bottom channel formed in the one of the second pair of front-to-back beams.

31. The electronics cabinet of claim 29, wherein the bottom mounting bracket is secured to one of the pair of side-to-side beams.

32. The electronics cabinet of claim 29, wherein the bottom mounting bracket comprises:
 a generally U-shaped body secured to the channel member,
 a first flange extending from the body and secured to the one of the second pair of front-to-back beams.

33. The electronics cabinet of claim 32, wherein the bottom mounting bracket is secured to a bottom channel nut positioned within a bottom channel formed in the one of the second pair of front-to-back beams and the first flange is secure to the bottom channel nut.

34. The electronics cabinet of claim 32, wherein the bottom mounting bracket further comprises a second flange extending from the body and secured to the one of the pair of bottom side-to-side beams.

35. The electronics cabinet of claim 21, further comprising a vertical blanking panel attached to the front equipment rail to provide hot/cold air separation in the electronics cabinet.

36. The electronics cabinet of claim 35, wherein the vertical blanking panel comprises a cable pass through.

37. The electronics cabinet of claim 21, wherein the first pair of front-to-back beams are welded to the pair of side-to-side beams, the second pair of front-to-back beams are welded to the pair of bottom side-to-side beams, and the vertical posts are welded to the top side-to-side beams and the bottom side-to-side beams.

38. The electronics cabinet of claim 21, wherein the first pair of front-to-back beams and the second pair of front-to-back beams are inset relative to the corresponding vertical posts.

39. The electronics cabinet of claim 21, further comprising:
 an upper side panel beam connected to two of the plurality of vertical posts; and
 a lower side panel beam connected to the two of the plurality of vertical posts.

40. The electronics cabinet of claim 39, wherein the upper side panel beam is welded to the two of the plurality of vertical posts and the lower side panel beam is welded to the two of the plurality of vertical posts.

41. The electronics cabinet of claim 39, further comprising a side panel configured to engage the lower side panel beam and the upper side panel beam.

42. The electronics cabinet of claim 41, wherein the side panel comprises a tubular member having a tab that extends from a bottom of the side panel and is configured to engage a slot in the lower side panel beam such that the bottom of the side panel rests on a top surface of the lower side panel beam.

43. The electronics cabinet of claim 42, wherein the side panel further comprises a locking mechanism adjacent a top of the side panel that is configured to engage a flange of the upper side panel beam to prevent removal of the side panel.

44. The electronics cabinet of claim 21, further comprising a top cap removably connected to a top of the cabinet frame.

45. The electronics cabinet of claim 44, wherein the top cap comprises a front portion removably connected to the top of the cabinet frame and a separate rear portion removably connected to the top of the cabinet frame.

46. The electronics cabinet of claim 44, wherein the top cap comprises at least one opening configured to allow the passage of data and/or power cables therethrough.

47. The electronics cabinet of claim 44, further comprising a vertical exhaust duct removably connected to the top of the cabinet frame adjacent the top cap.

* * * * *